(12) United States Patent
Lin et al.

(10) Patent No.: US 12,310,018 B2
(45) Date of Patent: May 20, 2025

(54) SEMICONDUCTOR DIE AND METHOD FOR FORMING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 534 days.

(21) Appl. No.: 17/580,500

(22) Filed: Jan. 20, 2022

(65) Prior Publication Data
US 2023/0232625 A1 Jul. 20, 2023

(51) Int. Cl.
H10B 43/27 (2023.01)
H10B 41/27 (2023.01)

(52) U.S. Cl.
CPC ............. *H10B 43/27* (2023.02); *H10B 41/27* (2023.02)

(58) Field of Classification Search
None
See application file for complete search history.

(56) References Cited

U.S. PATENT DOCUMENTS

| 11,069,410 B1* | 7/2021 | Cui ................ G11C 11/005 |
| 2021/0202703 A1* | 7/2021 | Rajashekhar ..... H01L 29/42328 |
| 2021/0375917 A1* | 12/2021 | Lu ...................... H10B 41/10 |
| 2021/0375927 A1* | 12/2021 | Chia .................. G11C 11/5657 |

OTHER PUBLICATIONS

Lue et al. "3D AND: A 3D Stackable Flash Memory Architecture to Realize High-Density and Fast-Read 3D NOR Flash and Storage-Class Memory" 2020 IEEE International Electron Devices Meeting (IEDM) (Year: 2020).*

* cited by examiner

*Primary Examiner* — Xiaoming Liu
(74) *Attorney, Agent, or Firm* — Maschoff Brennan

(57) ABSTRACT

The method includes forming a multi-layered stack having insulating layers and spacer layers alternately stacked on top of each other in a vertical direction over a substrate in a chip area having a first memory region and a second memory region; forming a first mask layer covering the second memory region, while leaving the first memory region partially exposed; etching the multi-layered stack to form first trenches in the first memory region; forming first gate layers, a first memory layer, and a first channel layer; removing the first mask layer; forming a second mask layer covering the first memory region, while leaving the second memory region partially exposed; etching the multi-layered stack to form second trenches; forming second gate layers, a second memory layer, and a second channel layer in the second trenches.

20 Claims, 37 Drawing Sheets

M

- patterning the first memory material and the first channel material to form a plurality of first memory layers and a plurality of first channel layers on sidewalls of the first trenches within the computing memory region —S110

- filling a plurality of first inner spacers to fill the first trenches within the computing memory region —S111

- forming a plurality of second trenches through the multi-layered stack within the storage memory region to form a plurality of second stacked structures while remaining the first stacked structures, the first memory layers, the first channel layers, and the first inner spacers within the computing memory region not to be etched —S112

- partially etching exposed surfaces of the spacer layers within the second trenches so as to reduce widths of the spacer layers relative to the insulating layers to form second cavities in the second stacked structures —S113

- forming a plurality of second gate layers in the second cavities of the second stacked structures —S114

- conformally forming a second memory material over the computing memory region and the storage memory region —S115

- patterning the second memory material to form a plurality of second memory layers on sidewalls of the second trenches within the storage memory region —S116

- forming a plurality of second channel layers and a plurality of second inner spacers in the second trenches and over the second memory layers within the storage memory region —S117

- etching and cutting the first and second channel layers and the first and second inner spacers within the computing memory region and the storage memory region into multiple discrete sections while remaining the first and second memory layers not to be etched —S118

- forming a plurality of first device spacers to interpose between the discrete first channel layers and between the discrete first inner spacers and forming a plurality of second device spacers to interpose between the discrete second channel layers and between the discrete second inner spacers —S119

- forming a plurality of second and third conductive line trenches through the first inner spacers within the computing memory region —S120

- filling the second and third conductive line trenches with a first reduced resistance material and a second conductive material to form a plurality of second and third conductive lines of computing memory devices that that will be electrically coupled to respective source and bit lines subsequently formed —S121

- forming a plurality of fourth conductive line trenches through the second inner spacers within the storage memory region —S122

- filling the fourth conductive line trenches with a second reduced resistance material and a second conductive material to form a plurality of fourth conductive lines of storage memory devices that will be electrically coupled to respective bit lines subsequently formed —S123

- forming a plurality of first global source lines and first global bit lines on the first stacked structure within the computing memory region and electrically coupled to the corresponding second and third conductive lines and forming a plurality of second global bit lines on the second stacked structure within the storage memory region and electrically coupled to the corresponding fourth conductive lines —S124

Fig. 4C

SEMICONDUCTOR DIE AND METHOD FOR FORMING THE SAME

BACKGROUND

The present disclosure generally relates to semiconductor devices, and particularly to methods of making a 3-dimesional (3D) memory device. The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A to 4C are a method M of manufacturing computing three-dimensional memory devices and storage three-dimensional memory devices of an integrated circuit structure in accordance with some embodiments of the present disclosure.

DETAILED DESCRIPTION

Figure 1A:
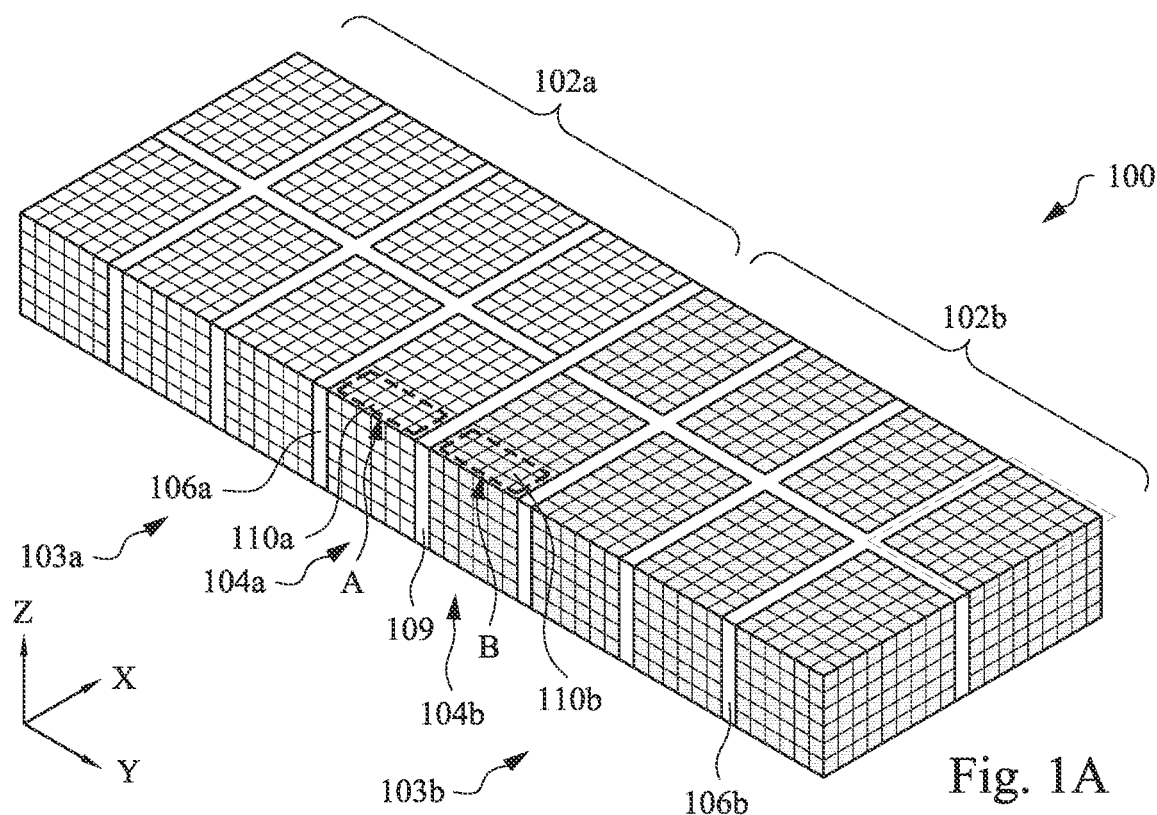
FIG. 1A is a perspective view of a semiconductor die having a first array of a first set of computing three-dimensional memory devices disposed on a first side of the semiconductor die, and a second array of a second set of storage three-dimensional memory devices disposed on a second side of the semiconductor die, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

For next generation semiconductor devices, particularly memory devices, it is desirable to include memories that can perform high speed computing as well as memories that can provide long term storage (i.e., low leakage). Current semiconductor die manufacturing processes and semiconductor dies formed therefrom include high speed computing devices and the long term storage devices formed on separate dies, which are then integrated together using a chip integration process (e.g., using an interposer, or a 2.5 dimensional process). However, the separation between the two dies causes propagation delay as data is being transferred between computing and storage memory devices which can reduce data fidelity and increase processing time.

Therefore, the present disclosure in various embodiments provides a semiconductor die including a plurality of computing 3-dimesional (3D) memory devices (e.g., AND memory devices) that provide high speed computing and a plurality of storage 3D memory devices (e.g., NAND memory devices) that provide high density storage for a multi-level cell. The computing and storage 3D memory devices are used to a computing in memory (CIM) application and formed monolithically in the same die, which in turn allows for improving a propagation delay issue while data is transferred between the computing and storage 3D memory devices and achieving a within-wafer multiple memory integration. This beneficially reduces computing power needed to perform the same operation, reduces propagation losses, and reduces manufacturing cost, time, and complexity.

Various embodiments provide a three-dimensional memory array with a plurality of vertically stacked memory cells. Each memory cell includes transistor having a word line region acting as a gate electrode, a bit line region acting as a first source/drain electrode, and a source line region acting as a second source/drain electrode. Each transistor further includes a memory film (e.g., as a gate dielectric) and a channel region over the word line region.

FIG. 1A is a perspective view of a semiconductor die 100, according to an embodiment. The semiconductor die 100 has a first memory array 103a of a first set 104a of semiconductor devices 110a (hereinafter "first semiconductor devices 110a") disposed at a first location of the semiconductor die 100, and a second memory array 103b of a second set 104b of semiconductor devices 110b (hereinafter "second semiconductor devices 110b") disposed at a second location of the semiconductor die 100 different from the first location. In some embodiments, the semiconductor die 100 can be interchangeably referred to as a chip area. In some embodiments, the first semiconductor devices 110a can be interchangeably referred to as a first memory cell or a first memory device, and the second semiconductor devices 110b can be interchangeably referred to as a second memory cell or a second memory device. The first semiconductor device 110a may be a computing memory device (e.g. AND memory device), and the second semiconductor device 110b may be a storage memory device (e.g. NAND memory device) in this context. The first semiconductor devices 110a being the AND memory device may have a higher cell current and a higher speed computing than the second semiconductor devices 110b that allow the first semiconductor devices 110a to be used for data processing and computing operations relative to the second semiconductor devices 110b. In contrast, the second semiconductor devices 110b being the NAND memory device may have a higher density storage than the first semiconductor devices 110a that allow the second semiconductor devices 110b to be used for a larger data storage relative to the first semiconductor devices 110a. Thus, the second semiconductor devices 110b can be used for high density storage of data generated after processing and computing by the first semiconductor devices 110a. Therefore, the semiconductor die 100 integrates processing and computing, as well as a high density storage in a single die reducing processing time, increasing processing speed, and reducing lag and propagation delays, and data loss.

As shown in FIG. 1A, the first memory array 103a is disposed on a first side 102a (or first portion) of the semiconductor die 100 in a first direction (e.g., the X-direction), and the second memory array 103b is disposed on a second side 102b of the semiconductor die 100 in the first direction (e.g., the X-direction). An array isolation layer 109 is interposed between the first memory array 103a and the second memory array 103b and serves to electrically isolate the first memory array 103a from the second memory array 103b and extends in a second direction (e.g., the Y-direction) that is perpendicular to the first direction. The array isolation layer 109 may be formed from an electrically insulative material, for example, silicon dioxide ($SiO_2$), silicon nitride (SiN), silicon oxide (SiO), silicon carbide nitride (SiCN), silicon oxycarbonitride (SiOCN), silicon oxynitride (SiON), $HfO_2$, $TaO_x$, $TiO_x$, $AlO_x$, any other suitable material, or combination thereof.

The first semiconductor devices 110a included in each of the first set 104a of the first memory array 103a are disposed in a 3D configuration. For example, the first semiconductor devices 110a in the first set 104a are stacked on top of each other in the vertical direction (e.g., the Z-direction), and disposed adjacent to each other in the first direction (e.g., the X-direction) and the second direction (e.g., the Y-direction). In other words, the first set 104a of the first semiconductor devices 110a are arranged in a cube formation. A first set of isolation layers 106a is interposed between each of the first set 104a of the first set of semiconductor devices 110a to electrically isolate each of the first set 104a of first semiconductor devices 110a from each other. For example, the first set of isolation layers 106a may include first portions that extend in the first direction (e.g., the X-direction) from a second portion that extends in the second direction (e.g., the Y-direction). The first set of isolation layers 106a may be formed from an electrically insulative material, for example, silicon dioxide ($SiO_2$), silicon nitride (SiN), silicon oxide (SiO), silicon carbide nitride (SiCN), silicon oxycarbonitride (SiOCN), silicon oxynitride (SiON), $HfO_2$, $TaO_x$, $TiO_x$, $AlO_x$, any other suitable material, or combination thereof.

Similarly, the second semiconductor devices 110b included in each of the second set 104b of the second memory array 103b are disposed in a 3D configuration, for example, stacked on top of each other in the vertical direction (e.g., the Z-direction), and disposed adjacent to each other in the first direction (e.g., the X-direction) and the second direction (e.g., the Y-direction), similar to the first set 104a of the first semiconductor devices 110a. A second set of isolation layers 106b is interposed between each of the second set 104b of the second set of semiconductor devices 110b to electrically isolate each of the second set 104b of second semiconductor devices 110b from each other. For example, the second set of isolation layers 106b may include first portions that extend in the first direction (e.g., the X-direction) from a second portion that extends in the second direction (e.g., the Y-direction). The second set of isolation layers 106b may be formed from the same material as the first set of isolation layers 106a.

Figure 1B:
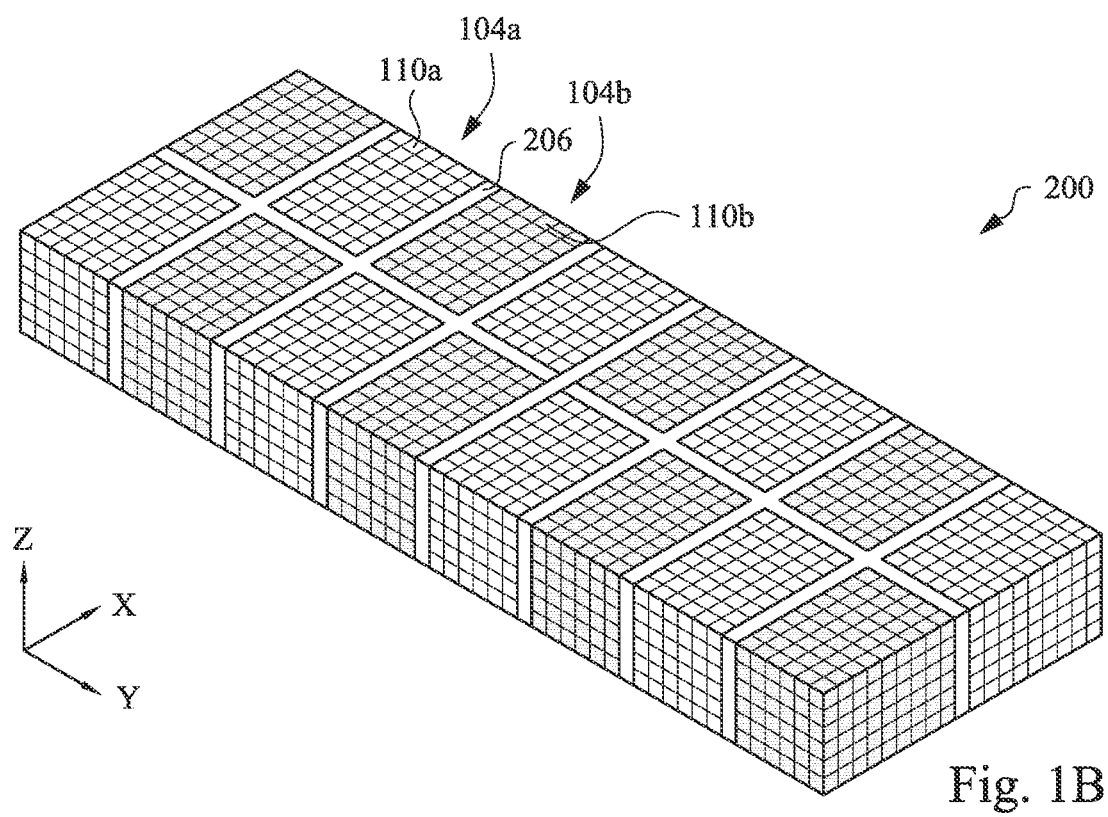
FIG. 1B illustrates a perspective view of a semiconductor die having a first set of computing three-dimensional memory devices, and a second set of storage three-dimensional memory devices, the first set of the computing three-dimensional memory devices being disposed adjacent to the second set of the storage three-dimensional memory devices in at least a first direction, a second direction perpendicular to the first direction, or the first direction and the second direction, in accordance with some embodiments of the present disclosure.

FIG. 1B is a perspective view of a semiconductor die 200, according to another embodiment. The semiconductor die 200 includes the first set 104a of first semiconductor devices 110a and the second set 104b of second semiconductor devices 110b as described with respect to the semiconductor die 100. However, different from the semiconductor die 100, the first set 104a of first semiconductor devices 110a in the semiconductor die 200 is disposed adjacent to the second set 104b of the second semiconductor devices 110b in at least the first direction (e.g., the X-direction), the second direction (e.g., the Y-direction), or the first direction and the second direction. In other words, the first set 104a of the semiconductor die 200 is disposed alternately with the second set 104b in the X-direction as well as the Y-direction throughout a length and a width of the semiconductor die 200. A set isolation layer 206 interposed between each of the first set 104a and the second set 104b in the semiconductor die 200. For example, the set isolation layer 206 of the semiconductor die 200 may include first portions that extend in the first direction (e.g., the X-direction) from a second portion that extends in the second direction (e.g., the Y-direction). The set isolation layer 206 may be formed from an electrically insulative material, for example, silicon dioxide ($SiO_2$), silicon nitride (SiN), silicon oxide (SiO), silicon carbide nitride (SiCN), silicon oxycarbonitride (SiOCN), silicon oxynitride (SiON), $HfO_2$, $TaO_x$, $TiO_x$, $AlO_x$, any other suitable material, or combination thereof.

It should be appreciated that while semiconductor die 100 and semiconductor die 200 illustrate particular embodiments of the first set 104a of first semiconductor devices 110a and the second set 104b of the second semiconductor dies 110b arranged in specific configurations, in other embodiments the first set 104a of the first semiconductor devices 110a and the second set 104b of the second semiconductor devices 110b can be arranged in any suitable configuration or arrangement in a semiconductor die with an isolation layer electrical isolating adjacent sets 104a/104b from each other. All such arrangements are contemplated and should be considered to be within the scope of the present disclosure.

Figure 2A:
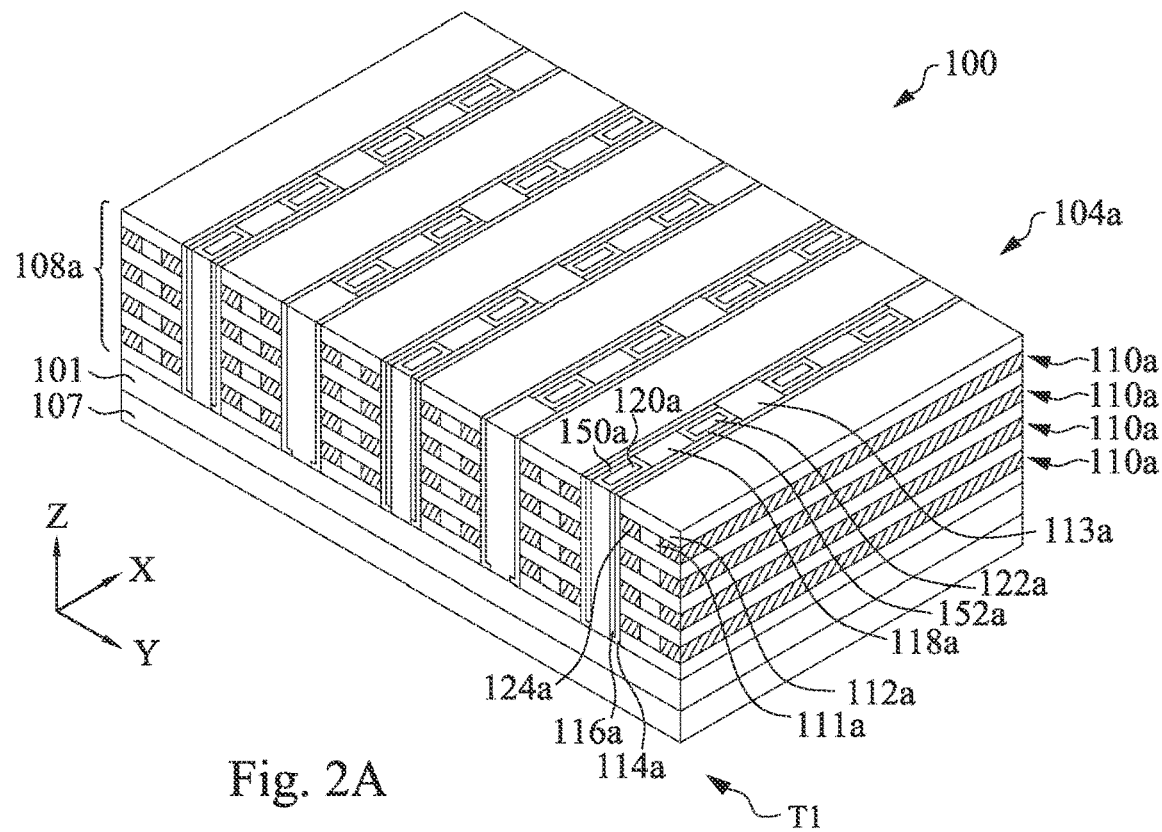
FIG. 2A illustrates a perspective view of a portion of the semiconductor die of FIG. 1A including the first set of the computing three-dimensional memory devices indicated by the arrow A in FIG. 1A, in accordance with some embodiments of the present disclosure.
Figure 2B:
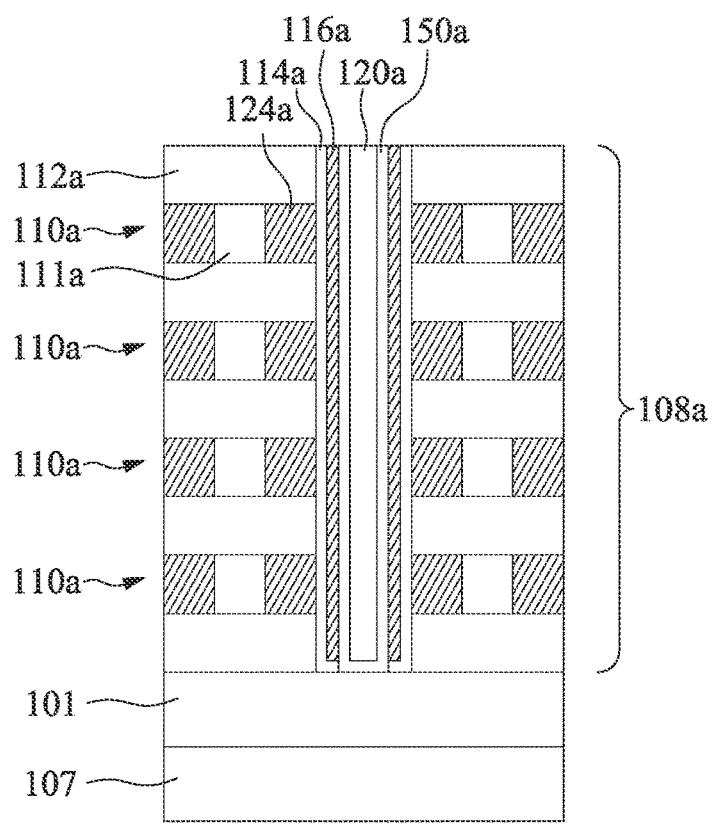
FIG. 2B illustrates a cross-section view of the computing three-dimensional memory devices, taken along the line X-X in FIG. 2A, in accordance with some embodiments of the present disclosure.
Figure 3A:
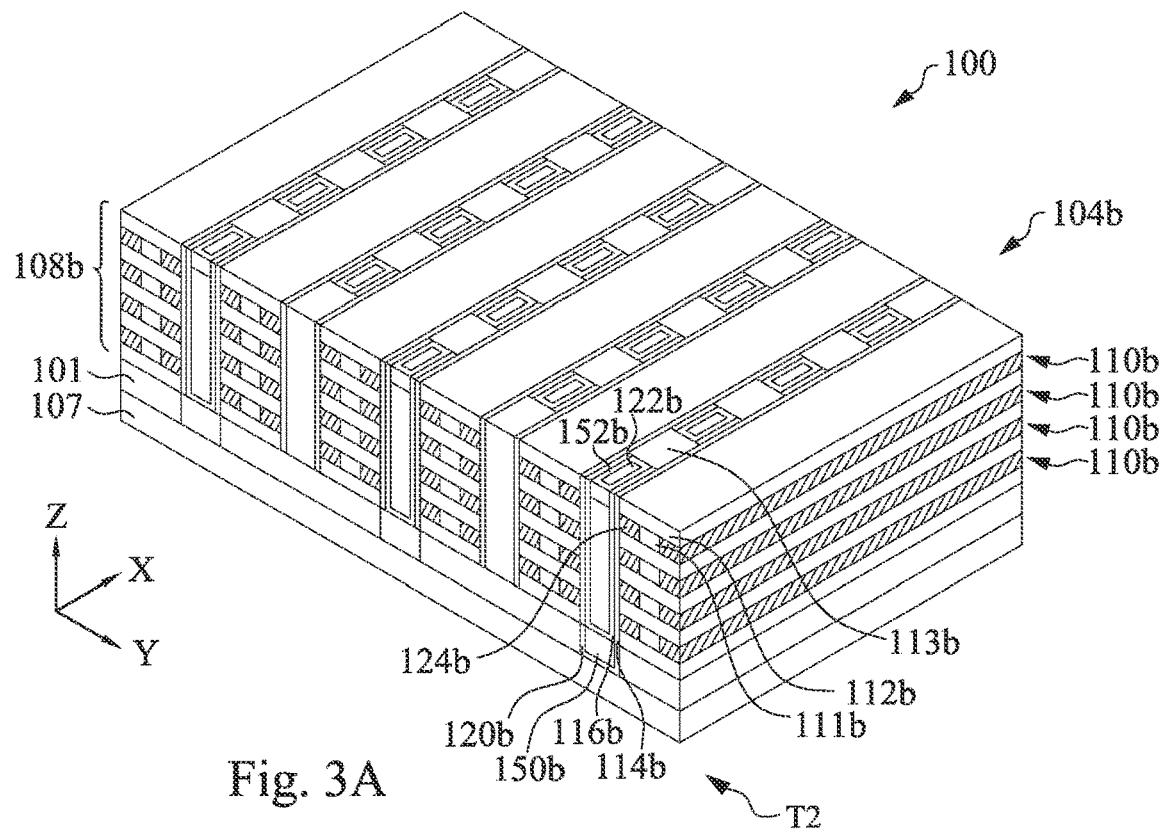
FIG. 3A illustrates a perspective view of a portion of the semiconductor die of FIG. 1A including the second set of the storage three-dimensional memory devices indicated by the arrow B in FIG. 1A, in accordance with some embodiments of the present disclosure.
Figure 3B:
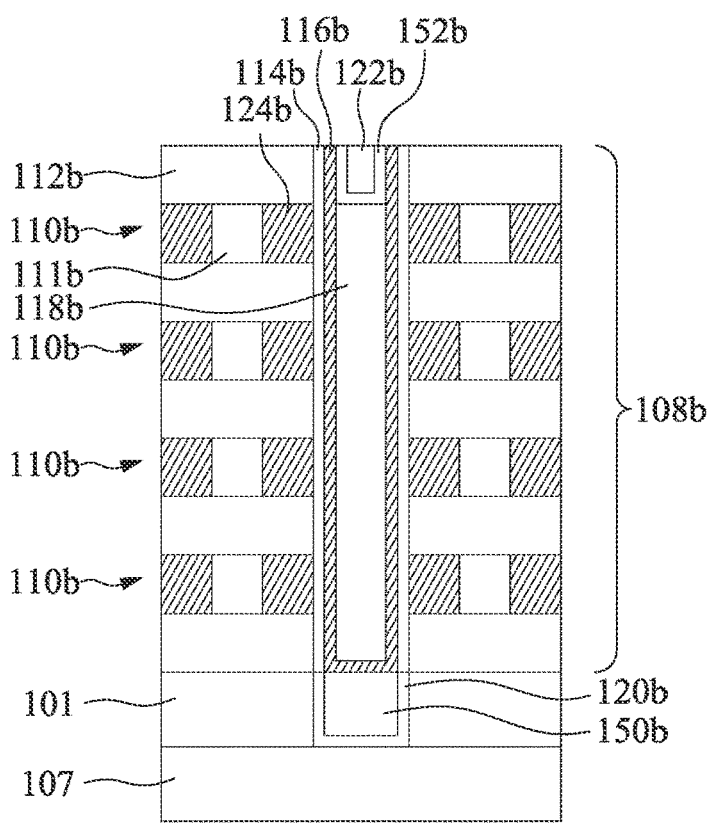
FIG. 3B illustrates a cross-section view of the storage three-dimensional memory devices, taken along the line Y-Y in FIG. 3A, in accordance with to some embodiments of the present disclosure.

Reference is made to FIGS. 1A and 2A-3B. FIG. 2A is a perspective view of a first portion of the semiconductor die 100 of FIG. 1A including the first set 104a of the first semiconductor devices 110a indicated by the arrow A in FIG. 1A, and FIG. 3A is a perspective view of a second portion of the semiconductor die 100 indicated by the arrow B in FIG. 1A that includes the second set 104b of the second semiconductor devices 110b, in accordance with some embodiments of the present disclosure. FIG. 2B illustrates a cross-section view of the first semiconductor devices 110a, taken along the line X-X in FIG. 2A, and FIG. 3B illustrates a cross-section view of the second semiconductor devices 110b, taken along the line Y-Y in FIG. 3A, in accordance with some embodiments of the present disclosure. While FIGS. 2A-3B show some embodiments of the first and semiconductor devices 110a and 110b, various configurations of first and second semiconductor devices can be employed in the first set 104a and the second set 104b of the semiconductor die 100, the semiconductor die 200, or any other semiconductor die described herein.

As shown in FIGS. 1A, 2A, and 2B, the first memory array 103a (see FIG. 1A) may be an AND memory array. Each first semiconductor device 110a in the first memory array 103a may be a transistor. The first semiconductor device 110a (see FIG. 2B) may include a gate layer 124a that can serve as a gate electrode, a memory layer 114a that can serve as a gate dielectric, a channel layer 116a that can serve as a channel region, and conductive lines 120a and 122a (see FIG. 2A) that can serve as source and drain electrodes. In some embodiments, the gate layer 124a is electrically coupled to a respective word line and can be interchangeably referred to as a word line metal. In some embodiments, the conductive line 120a is electrically coupled to a respective global source line, which electrically couples the conductive line 120a to ground, and can be interchangeably referred to as a conductive source line. In some embodiments, the conductive line 122a (see FIG. 2A) is electrically coupled to a respective global bit line and can be interchangeably referred to as a conductive bit line. The first semiconductor device 110a may be disposed in an array of vertically stacked rows and columns. The first semiconductor devices 110a in a same horizontal row of the first memory array 103a (see FIG. 1A) may share a common word line while the first semiconductor devices 110a in a same vertical column of the first memory array 103a may share a common source line or a common bit line. Therefore, the first semiconductor devices 110a may withstand a higher cell current and process a higher speed computing than the second semiconductor devices 110b, which in turn allows the first semiconductor devices 110a to be used for data processing and computing operations relative to the second semiconductor devices 110b.

As shown in FIGS. 1A, 3A, and 3B, the second memory array 103b (see FIG. 1A) may be an NAND memory array. Each second semiconductor device 110b in the second memory array 103b may be a transistor. The second semiconductor device 110b (see FIG. 3B) may include a gate layer 124b that can serve as a gate electrode, a memory layer 114b that can serve as a gate dielectric, a channel layer 116b that can serve as a channel region, and conductive lines 120b and 122b that can serve as source and drain electrodes. In some embodiments, the gate layer 124b is electrically coupled to a respective word line and can be interchangeably referred to as a word line metal. In some embodiments, the conductive line 120b is electrically coupled to a respective global source line, which electrically couples the conductive line 120b to ground, and can be interchangeably referred to as a conductive source line. In some embodiments, the conductive line 122b is electrically coupled to a respective global bit line and can be interchangeably referred to as a conductive bit line. The second semiconductor device 110b may be disposed in an array of vertically stacked rows and columns. The second semiconductor devices 110b in a same horizontal row of the second memory array 103b (see FIG. 1A) may share a common word line while the second semiconductor devices 110b in a same vertical column of the second memory array 103b may share a common source line and a common bit line. Therefore, the second semiconductor devices 110b may have a higher density storage than the first semiconductor devices 110a, which in turn allows the second semiconductor devices 110b to be used for a larger data storage relative to the first semiconductor devices 110a.

Reference is made to FIGS. 2A-3B. The semiconductor die 100 includes a substrate 107 on which the plurality of semiconductor devices 110a/b are disposed. The first semiconductor devices 110a and the second semiconductor devices 110b are respectively arranged in a plurality of rows within their respective sets 104a/b (see FIGS. 2A and 3A), each of which extend in a first direction (e.g., the direction). Each semiconductor device 110a/b is separated and electrically isolated from an adjacent semiconductor device 110a/b within a row by a device spacer 113a/b (see FIGS. 2A and 3A). In some embodiments, the substrate 107 may be a semiconductor substrate, such as a bulk semiconductor, a semiconductor-on-insulator (SOI) substrate, or the like, which may be doped (e.g., with a p-type or an n-type impurity) or un-doped. The substrate 107 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like. In some embodiments, the device spacer 113a/b be formed from an electrically insulating material (e.g., silicon oxide ($SiO_2$), silicon nitride (SiN), silicon oxide (SiO), silicon carbide nitride (SiCN), silicon oxycarbonitride (SiOCN), silicon oxynitride (SiON), $HfO_2$, $TaO_x$, $TiO_x$, $AlO_x$, etc.). In some embodiments, an etch stop layer 101 may be formed between the substrate 107 and the semiconductor devices 110a/b. In some embodiments, the etch stop layer 101 may include SiN, SiO, $SiO_2$, SiCN, SiOCN, SiON, $HfO_2$, $TaO_x$, $TiO_x$, $AlO_x$, a metal carbide, any other suitable material or combination thereof, and may include a single layer or various sublayers.

In FIGS. 2A and 2B, the semiconductor device 110a may include the conductive line 120a, and the conductive line 122a spaced apart from the conductive line 120a in a first direction (e.g., the X-direction). The conductive line 120a extends from a top surface of a stacked structure 108a to the etch stop layer 101 in a vertical direction (e.g., the Z-direction). The conductive line 122a extends from the top surface of the stacked structure 108a to the etch stop layer 101 in the vertical direction. Although FIG. 2B illustrates a cross-sectional view that only shows the conductive line 120a, a cross-sectional view of the conductive line 122a may be similar. In some embodiments, the conductive line 120a and the conductive line 122a may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the conductive line 120a and/or the conductive line 122a may include a semiconductor material, for example, an n or p-doped semiconductor such as Si, SiGe, or any other semiconductor material (e.g., IGZO, ITO, IZO, ZnO, IWO, poly silicon, amorphous Si, etc.), and may be formed using a deposition process, an epitaxial growth process, or any other suitable process.

The semiconductor device 110a may include reduced parasitic resistance capacitance (RC) layers 150a and 152a that have lower parasitic resistance capacitances relative to the conductive lines 120a and 122a. The reduced parasitic RC layers 150a and 152a cup undersides of the conductive lines 120a and 122a to reduce parasitic resistance between the conductive lines 120a and 122a and the channel layers 116a, which in turn allows for forming an ohmic contact and keeping a target threshold voltage $V_t$ to be positive. Therefore, the semiconductor die 100 may have a higher processing speed and lower power consumption during a read operation than that without reduced parasitic RC layers. In some embodiments, the reduced parasitic RC layers 150a and/or 152a may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the reduced parasitic RC layers 150a and/or 152a may include a semiconductor material, for example, an n or p-doped semiconductor such as Si, SiGe, or any other semiconductor material (e.g., IGZO, ITO, IZO, ZnO, IWO, poly silicon, amorphous Si, etc.). In some embodiments, the reduced parasitic RC layer 150a and/or 152a may have a higher doped concentration than the channel layer 116a. By way of example and not limitation, the reduced parasitic RC layer 150a and/or 152a may be a doped layer, but the channel layer 116a may be an un-doped layer.

The semiconductor device 110a may include a first inner spacer 118a as shown in FIG. 2A extending between the conductive lines 120a and 122a and from the top surface of the stacked structure 108a to the etch stop layer 101 in a vertical direction (e.g., the Z-direction). In some embodiments, the first inner spacer 118a may be formed from an electrically insulating material, for example, silicon nitride (SiN), silicon oxide (SiO), $SiO_2$, silicon carbide nitride (SiCN), silicon oxycarbonitride (SiOCN), silicon oxynitride (SiON), $HfO_2$, $TaO_x$, $TiO_x$, $AlO_x$, etc.

The semiconductor device 110a may include the channel layer 116a disposed outwards of a radially outer surface of the conductive line 120a and the conductive line 122a in a second direction (e.g., the Y-direction) perpendicular to a first direction (e.g., the X-direction) and is in electrical contact with the conductive line 120a and the conductive line 122a. The channel layer 116a extends in the first direction (e.g., the X-direction) from an axially outward edge of the conductive line 120a to an opposite axially outward edge of the conductive line 122a. In some embodiments, each semiconductor device 110a includes a pair of channel layers 116a. One of the pair of channel layers 116a is disposed radially outwards of first radially outer surfaces of the conductive line 120a and the conductive line 122a in the second direction (e.g., the Y-direction), and the other of the pair of channel layers 116a is disposed radially outwards of second radially outer surfaces of the conductive line 120a and the conductive line 122a opposite the first radially outer surfaces. In some embodiments, each semiconductor device 110a may include a single channel layer 116a disposed radially outwards of the first or the second radially outer surfaces of the conductive line 120a and the conductive line 122a. The channel layer 116a extends from the top surface of the stacked structure 108a to the etch stop layer 101 in a vertical direction (e.g., the Z-direction). In some embodiments, the channel layer 116a may include a doped material (e.g., a doped semiconductor), doped with a first concentration of a dopant (e.g., an n-type or p-type dopant). In some embodiments, the channel layer 116a may be free of a dopant. In some embodiments, the channel layer 116a may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor.

The semiconductor device 110a may include the memory layer 114a disposed on a radially outer surface of the channel layer 116a in the second direction (e.g., the Y-direction) and extends in the first direction (e.g., the X-direction), such that each semiconductor device 110a located in a row of the array of semiconductor devices 110a including a portion of the memory layer 114a, and the memory layer 114a is connected to each of the semiconductor devices 110a included in a corresponding row. In some embodiments, the memory layer 114a extends from the top surface of the stacked structure 108a to the etch stop layer 101 in a vertical direction (e.g., the Z-direction). In some embodiments, the memory layer 114a may include a ferroelectric material, for example, lead zirconate titanate (PZT), $PbZr/TiO_3$, $BaTiO_3$, $PbTiO_2$, $HfO_2$, $Hr_{1-x}Zr_xO_2$, $ZrO_2$, $TiO_2$, NiO, $TaO_x$, $Cu_2O$, $N_2O_5$, $AlO_x$, etc.

The semiconductor device 110a may include a stacked structure 108a disposed on outer surfaces of the memory layer 114a in the second direction and over the substrate 107. The stacked structure 108a include a plurality of insulating layers 112a, and a plurality of gate layers 124a alternatively stacked on top of one another in a vertical direction (e.g., the Z-direction), and extending in the first direction (e.g., the X-direction). In some embodiments, a topmost layer and/or a bottommost layer of the stacked structure 108a may be the insulating layer 112a. This is described in greater detail with reference to FIGS. 2A and 2B, the semiconductor device 110a may include at least one gate layer 124a disposed on a radially outer surface of the memory layer 114a in the second direction (e.g., the Y-direction), and extending in the first direction (e.g., the X-direction). Within the stacked structure 108a, two parallel gate layers 124a are located adjacent to each other and interposed between two vertically separated insulating layers 112a in the vertical direction (e.g., the Z-direction), each of the two gate layers 124a associated with a different semiconductor device 110a. A spacer layer 111a is laterally interposed between the two gate layers 124a in the second direction (e.g., the Y-direction) and serves to electrically isolate the two gate layers 124a from each other.

In some embodiments, the insulating layer 112a may include silicon nitride (SiN), silicon oxide (SiO), $SiO_2$, silicon carbide nitride (SiCN), silicon oxycarbonitride (SiOCN), silicon oxynitride (SiON), $HfO_2$, $TaO_x$, $TiO_x$, $AlO_x$, etc. In some embodiments, the first gate layer 124a may include an n-type or n-doped semiconductor material. Example n-type workfunction metals that may include Ti, Ag, TaAl, TaAlC, TiAlN, TaC, TaCN, TaSiN, Mn, Zr, other suitable n-type workfunction materials, or combinations thereof. In some embodiments, the first gate layer 124a may include a p-type or p-doped material. Example p-type workfunction metals that may include TiN, TaN, Ru, Mo, Al, WN, $ZrSi_2$, $MoSi_2$, $TaSi_2$, $NiSi_2$, WN, other suitable p-type workfunction materials, or combinations thereof. While shown as including a single layer, each of the gate layers 124a may include multi-layers of the workfunction material, or combinations thereof.

In some embodiments, an adhesive layer may be interposed between the gate layer 124a and the adjacent insulating layers 112a as well as the spacer layer 111a disposed therebetween, and facilitate adhesion of the gate layer 124a to the insulating layer 112a, and may also serve as a spacer between two parallel gate layers 124a that are interposed between the same vertically separated insulating layers 112a. In some embodiments, the adhesion layer (e.g., the adhesive layer) may include e.g., titanium (Ti), chromium (Cr), TiN, TaN, WN, or any other suitable adhesive material.

Reference is made to FIGS. 3A and 3B. The semiconductor device 110b may include the conductive line 120b, and the conductive line 122b spaced apart from the conductive line 120b in a vertical direction (e.g., the Z-direction). The conductive line 120b extends in the substrate 107. The conductive line 122b extends from the top surface of the stacked structure 108b and terminates prior to reaching the etch stop layer 101 in the vertical direction. In some embodiments, the conductive line 122b terminates at a position higher than a bottom surface of a topmost one of insulating layers 112b in a stacked structure 108b. In some embodiments, the conductive line 120b and the conductive line 122b may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the conductive line 120b and/or the conductive line 122b may include a semiconductor material, for example, an n or p-doped semiconductor such as Si, SiGe, or any other semiconductor material (e.g., IGZO, ITO, IZO, ZnO, IWO, poly silicon, amorphous Si, etc.), and may be formed using a deposition process, an epitaxial growth process, or any other suitable process.

The semiconductor device 110b may include reduced parasitic RC layers 150b and 152b that have lower resistance capacitances relative to the conductive lines 120b and 122b. An underside of the reduced parasitic RC layer 150b is cupped by the conductive line 120b and the reduced parasitic RC layer 152b cup an underside of the conductive line 122b, so as parasitic resistances between the conductive lines 120b and 122b and the channel layers 116b may be to reduced, which in turn allows for forming an ohmic contact and keeping a target threshold voltage $V_t$ to be positive. Therefore, the semiconductor die 100 may have a higher processing speed and lower power consumption during a read operation than that without reduced parasitic RC layers. In some embodiments, the reduced parasitic RC layers 150b and/or 152b may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the reduced parasitic RC layers 150b and/or 152b may include a semiconductor material, for example, an n or p-doped semiconductor such as Si, SiGe, or any other semiconductor material (e.g., IGZO, ITO, IZO, ZnO, IWO, poly silicon, amorphous Si, etc.). In some embodiments, the reduced parasitic RC layer 150b and/or 152b may have a higher doped concentration than the channel layer 116b. By way of example and not limitation, the reduced parasitic RC layer 150b and/or 152b may be a doped layer, but the channel layer 116b may be an un-doped layer.

The semiconductor device 110b may include a channel layer 116b disposed outwards of a radially outer surface of the conductive line 120b and the conductive line 122b in a second direction (e.g., the Y-direction) perpendicular to a first direction (e.g., the X-direction) and is in electrical contact with the conductive line 120b and the conductive line 122b. The channel layer 116b extends in the vertical direction (e.g., the Z-direction) from an axially upward edge of the conductive line 120b upwardly to an axially upward edge of the conductive line 122b. In some embodiments, the channel layer 116b has a U-shaped cross section taken along the line Y-Y as shown in FIG. 3B. In some embodiments, a combination of the conductive line 120b and the reduced parasitic RC layers 150b may have a width, taken along the line X-X in FIG. 2B, substantially the same as a width of the channel layer 116b. In some embodiments, a combination of the conductive line 120b and the reduced parasitic RC layers 150b may have a width less or greater than a width of the channel layer 116b. In some embodiments, the conductive line 120b and/or the reduced parasitic RC layers 152b may have a flat bottom surface. In some embodiments, the conductive line 120b and/or the reduced parasitic RC layers 152b may have a convex bottom surface or a concave bottom surface. In some embodiments, the channel layer 116b may include a doped material (e.g., a doped semiconductor), doped with a first concentration of a dopant (e.g., an n-type or p-type dopant). In some embodiments, the channel layer 116b may be free of a dopant. In some embodiments, the channel layer 116b may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor.

The semiconductor device 110b may include a memory layer 114b disposed on a radially outer surface of the channel layer 116b in the second direction (e.g., the Y-direction) and extends in the first direction (e.g., the X-direction), such that each semiconductor device 110b located in a row of the array of semiconductor devices 110b including a portion of the memory layer 114b, and the memory layer 114b is connected to each of the semiconductor devices 110b included in a corresponding row. In some embodiments, the memory layer 114b extends from the stacked structure 108b to the etch stop layer 101 in a vertical direction (e.g., the Z-direction). In some embodiments, the memory layer 114b may include a ferroelectric material, for example, lead zirconate titanate (PZT), $PbZr/TiO_3$, $BaTiO_3$, $PbTiO_2$, $HfO_2$, $Hr_1-xZr_xO_2$, $ZrO_2$, $TiO_2$, NiO, $TaO_x$, $Cu_2O$, $Nb_2O_5$, $AlO_x$, etc.

The semiconductor device 110b may include a stacked structure 108a disposed on outer surfaces of the memory layer 114b in the second direction and over the substrate 107. The stacked structure 108b include a plurality of insulating layers 112b, and a plurality of gate layers 124b alternatively stacked on top of one another in a vertical direction (e.g., the Z-direction), and extending in the first direction (e.g., the X-direction). In some embodiments, a topmost layer and/or a bottommost layer of the stacked structure 108a may be the insulating layer 112b. This is described in greater detail with reference to FIGS. 3A and 3B, the semiconductor device 110b may include at least one gate layer 124b disposed on a radially outer surface of the memory layer 114b in the second direction (e.g., the Y-direction), and extending in the first direction (e.g., the X-direction). Within the stacked structure 108a, two parallel gate layers 124b are located adjacent to each other and interposed between two vertically separated insulating layers 112b in the vertical direction (e.g., the Z-direction), each of the two gate layers 124b associated with a different semiconductor device 110b. A spacer layer 111a is laterally interposed between the two gate layers 124b in the second direction (e.g., the Y-direction) and serves to electrically isolate the two gate layers 124b from each other.

In some embodiments, the insulating layer 112b may include silicon nitride (SiN), silicon oxide (SiO), $SiO_2$, silicon carbide nitride (SiCN), silicon oxycarbonitride (SiOCN), silicon oxynitride (SiON), $HfO_2$, $TaO_x$, $TiO_x$, $AlO_x$, etc. In some embodiments, the first gate layer 124b may include an n-type or n-doped semiconductor material. Example n-type workfunction metals that may include Ti, Ag, TaAl, TaAlC, TiAlN, TaC, TaCN, TaSiN, Mn, Zr, other suitable n-type workfunction materials, or combinations thereof. In some embodiments, the first gate layer 124b may include a p-type or p-doped material. Example p-type workfunction metals that may include TiN, TaN, Ru, Mo, Al, WN, $ZrSi_2$, $MoSi_2$, $TaSi_2$, $NiSi_2$, WN, other suitable p-type workfunction materials, or combinations thereof. While shown as including a single layer, each of the gate layers 124b may include multi-layers of the workfunction material, or combinations thereof.

In some embodiments, an adhesive layer may be interposed between the gate layer 124b and the adjacent insulating layers 112b as well as the spacer layer 111b disposed therebetween, and facilitate adhesion of the gate layer 124b to the insulating layer 112b, and may also serve as a spacer between two parallel gate layers 124b that are interposed between the same vertically separated insulating layers 112b. In some embodiments, the adhesion layer (e.g., the adhesive layer) may include e.g., titanium (Ti), chromium (Cr), TiN, TaN, WN, or any other suitable adhesive material.

In some embodiments, material and manufacturing method of the conductive lines 120b and 122b, reduced parasitic RC layers 150b and 152b, the gate layer 124b, the channel layer 116b, the memory layers 114b, the spacer layer 111b, the insulating layer 112b, and the device spacer 113b included in the second semiconductor devices 110b, are substantially the same as those of the conductive lines 120a and 122a, reduced parasitic RC layers 150a and 152a, the gate layer 124a, the channel layer 116a, the memory layers 114a, the spacer layer 111a, the insulating layer 112a, and the device spacer 113a, i.e., are formed from the same material and are structurally and functionally similar to each other. This beneficially reduces computing power needed to perform the same operation, reduces propagation losses, and reduces manufacturing cost, time, and complexity.

While FIGS. 2A-3B show some embodiments of the first and semiconductor devices 110a and 110b, various configurations of first and second semiconductor devices can be employed in the first set 104a and the second set 104b of the semiconductor die 100, the semiconductor die 200, or any other semiconductor die described herein. Example embodiments of first semiconductor devices and second semiconductor devices that can be included in the semiconductor die 100 or the semiconductor die 200 are shown and described in FIGS. 3C to 3F. It should be appreciated that the semiconductor die 100, 200, or any other semiconductor die described herein can include any combination of first and second semiconductor devices as described with respect to FIGS. 2A-3F.

Figure 3C:
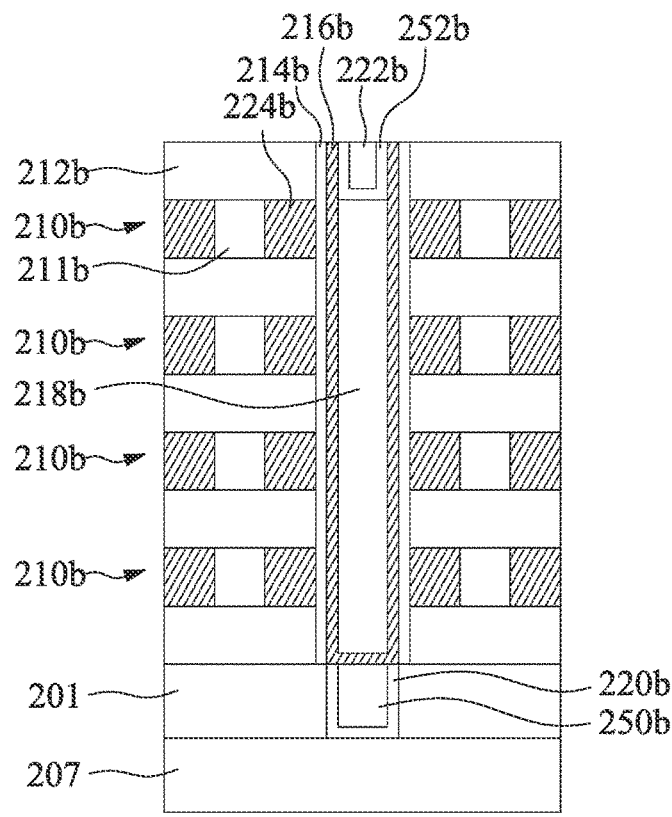
FIGS. 3C-3F illustrate cross-section views of different storage three-dimensional memory devices than FIG. 3B in accordance with to some embodiments of the present disclosure.
Figure 3D:
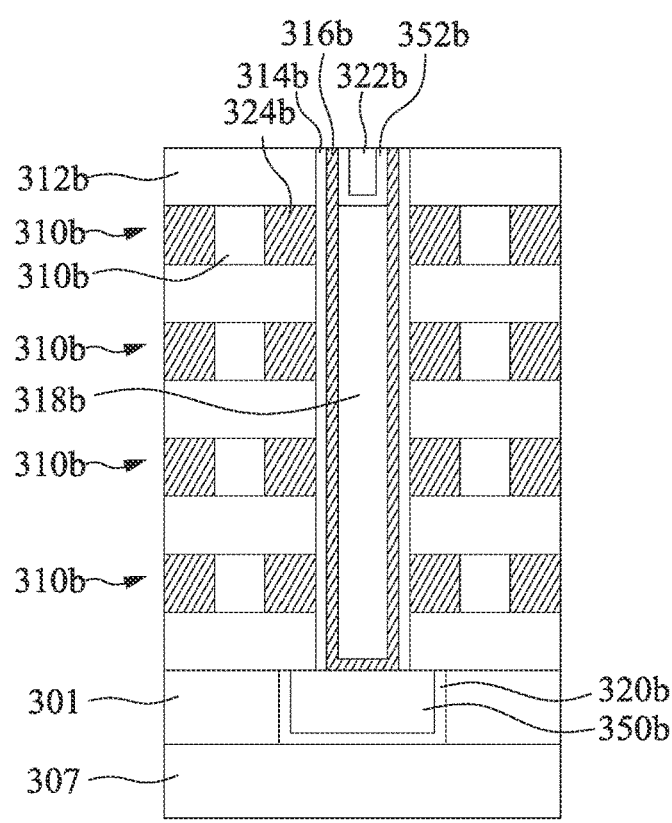

In some embodiments, a combination of the conductive line 120b and the reduced parasitic RC layers 150b as shown in FIG. 3B may have a width less than or greater than a width of the channel layer 116b. FIGS. 3C and 3D are cross-section views of second semiconductor devices 210b and 310b. As shown in FIG. 3C, the combination of the conductive line 220b and the reduced parasitic RC layers 250b may have a width less than a width of the channel layer 216b. In some embodiments, material and manufacturing method of the etch stop layer 201, the substrate 207, the conductive lines 220b and 222b, reduced parasitic RC layers 250b and 252b, the gate layer 224b, the channel layer 216b, the memory layer 214b, the spacer layer 211b, and the insulating layer 212b included in the second semiconductor devices 210b, are substantially the same as those of the etch stop layer 101, the substrate 107, the conductive lines 120b and 122b, reduced parasitic RC layers 150b and 152b, the gate layer 124b, the channel layer 116b, the memory layer 114b, the spacer layer 111b, and the insulating layer 112b as shown in FIGS. 3A and 3B, and the related detailed descriptions may refer to the foregoing paragraphs, and are not described again herein.

As shown in FIG. 3D, the combination of the conductive line 320b and the reduced parasitic RC layers 350b may have a width greater than a width of the channel layer 316b. In some embodiments, material and manufacturing method of the etch stop layer 301, the substrate 307, the conductive lines 320b and 322b, reduced parasitic RC layers 350b and 352b, the gate layer 324b, the channel layer 316b, the memory layer 314b, the spacer layer 311b, and the insulating layer 312b included in the second semiconductor devices 210b, are substantially the same as those of the etch stop layer 101, the substrate 107, the conductive lines 120b and 122b, reduced parasitic RC layers 150b and 152b, the gate layer 124b, the channel layer 116b, the memory layer 114b, the spacer layer 111b, and the insulating layer 112b as shown in FIGS. 3A and 3B, and the related detailed descriptions may refer to the foregoing paragraphs, and are not described again herein.

Figure 3E:
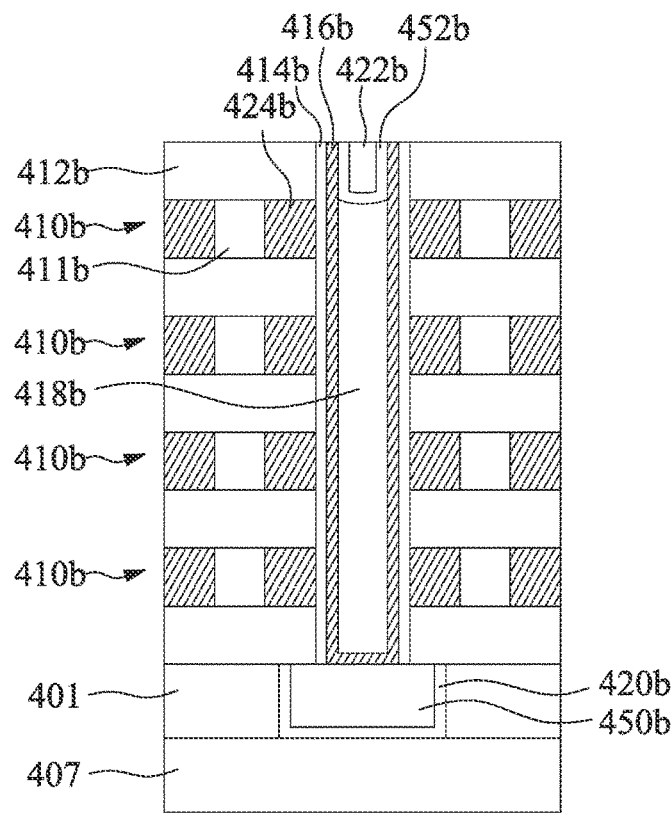
Figure 3F:
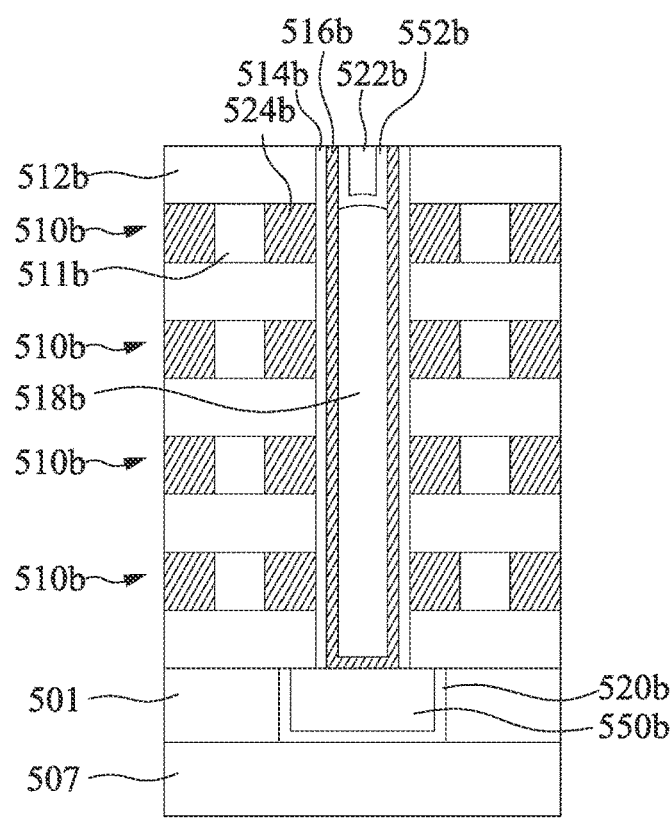

In some embodiments, the conductive line 122b and/or the reduced parasitic RC layers 152b as shown in FIG. 3B may have a convex bottom surface or a concave bottom surface. FIGS. 3E and 3F are cross-section views of second semiconductor devices 410b and 510b. As shown in FIG.

3E, the conductive line 422b and/or the reduced parasitic RC layers 452b may have a convex bottom surface. In some embodiments, material and manufacturing method of the etch stop layer 401, the substrate 407, the conductive lines 420b and 422b, reduced parasitic RC layers 450b and 452b, the gate layer 424b, the channel layer 416b, the memory layer 414b, the spacer layer 411b, and the insulating layer 412b included in the second semiconductor devices 410b, are substantially the same as those of the etch stop layer 101, the substrate 107, the conductive lines 120b and 122b, reduced parasitic RC layers 150b and 152b, the gate layer 124b, the channel layer 116b, the memory layer 114b, the spacer layer 111b, and the insulating layer 112b as shown in FIGS. 3A and 3B, and the related detailed descriptions may refer to the foregoing paragraphs, and are not described again herein.

As shown in FIG. 3F, the conductive line 522b and/or the reduced parasitic RC layers 552b may have a concave bottom surface. In some embodiments, material and manufacturing method of the etch stop layer 501, the substrate 507, the conductive lines 520b and 522b, reduced parasitic RC layers 550b and 552b, the gate layer 524b, the channel layer 516b, the memory layer 514b, the spacer layer 511b, and the insulating layer 512b included in the second semiconductor devices 510b, are substantially the same as those of the etch stop layer 101, the substrate 107, the conductive lines 120b and 122b, reduced parasitic RC layers 150b and 152b, the gate layer 124b, the channel layer 116b, the memory layer 114b, the spacer layer 111b, and the insulating layer 112b as shown in FIGS. 3A and 3B, and the related detailed descriptions may refer to the foregoing paragraphs, and are not described again herein.

Figure 4A:
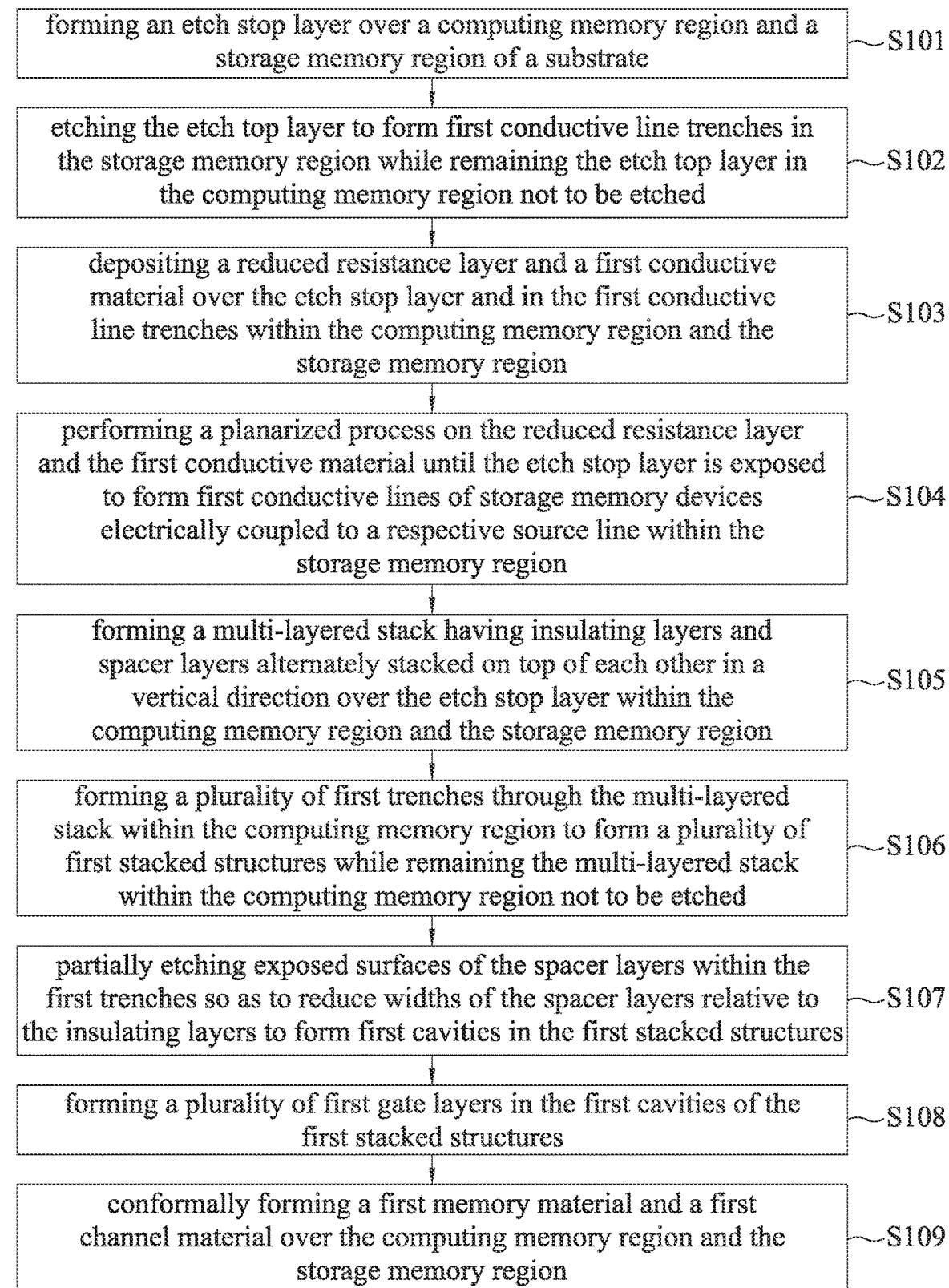

Referring now to FIGS. 4A to 4C, illustrated is a flowchart of an exemplary method M for fabrication of a semiconductor die 100 in accordance with some embodiments. The method M includes a relevant part of the entire manufacturing process. It is understood that additional operations may be provided before, during, and after the operations shown by FIGS. 4A to 4C, and some of the operations described below can be replaced or eliminated for additional embodiments of the method. The order of the operations/processes may be interchangeable. The method M includes fabrication of the semiconductor die 100. However, the fabrication of the semiconductor die 100 is merely an example for describing the manufacturing process according to some embodiments of the present disclosure.

Figure 20A:
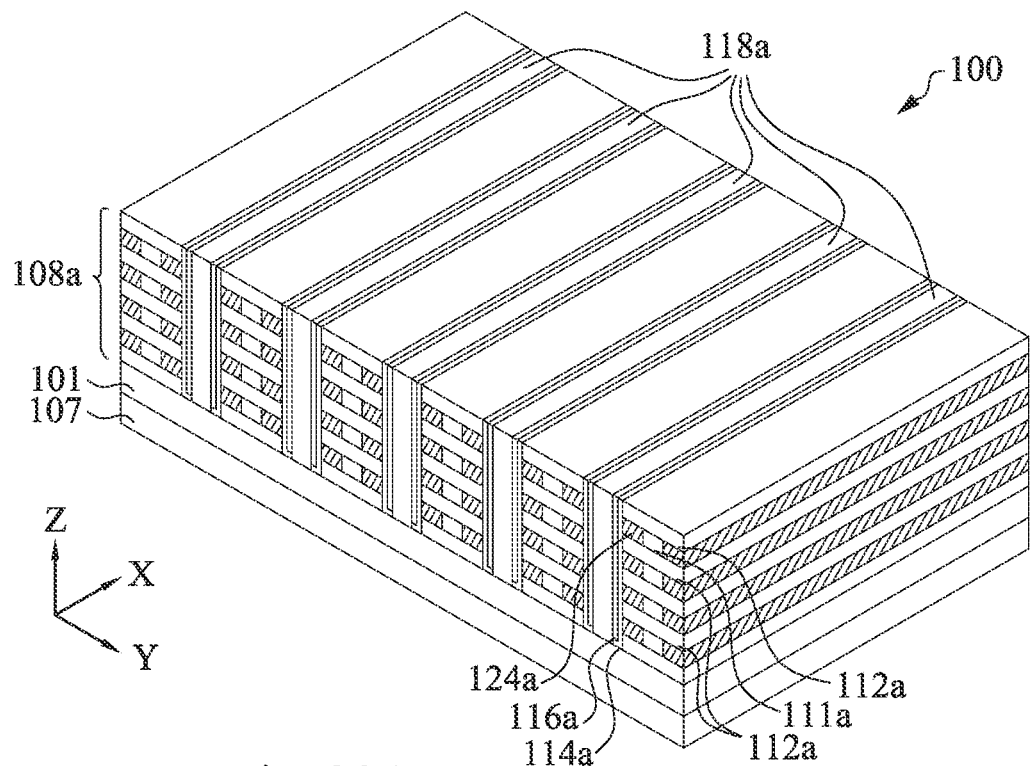
Figure 20B:
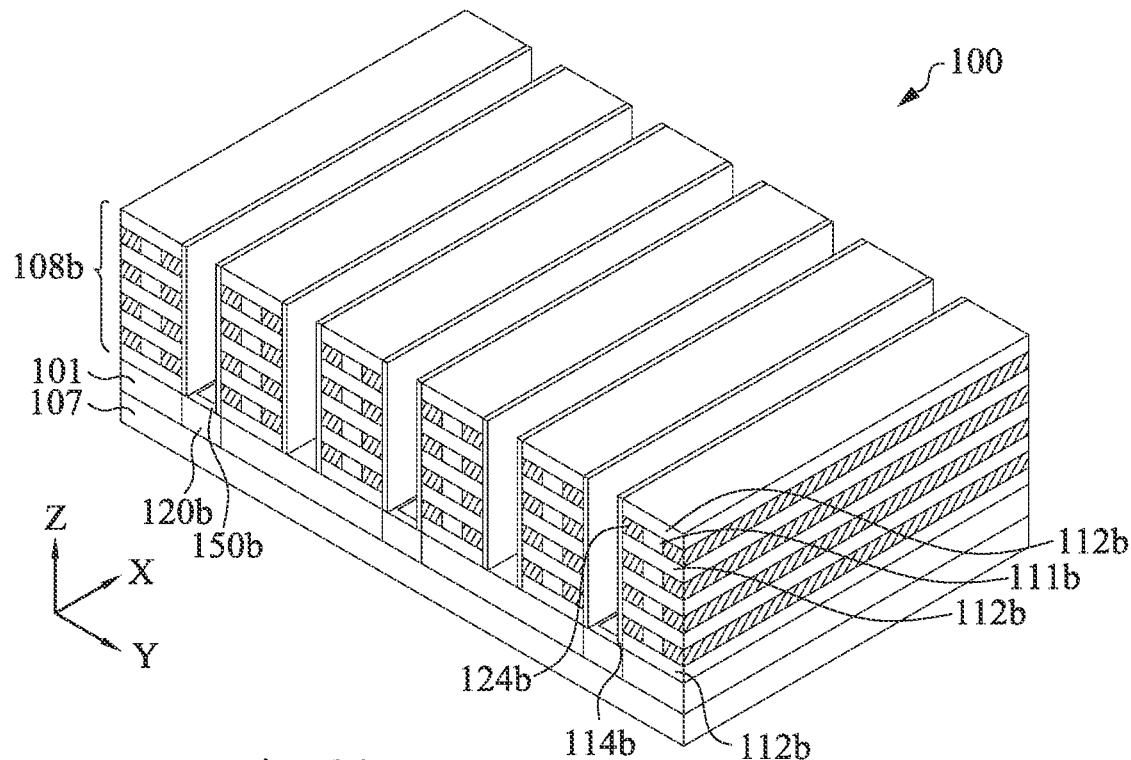
Figure 21A:
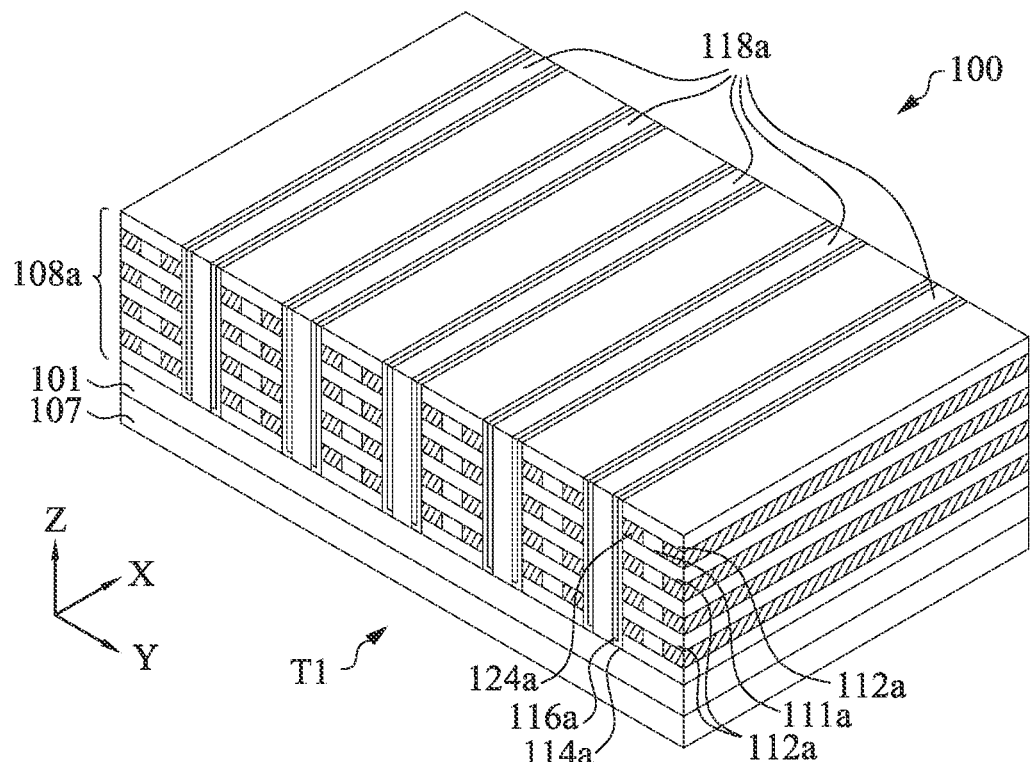
Figure 21B:
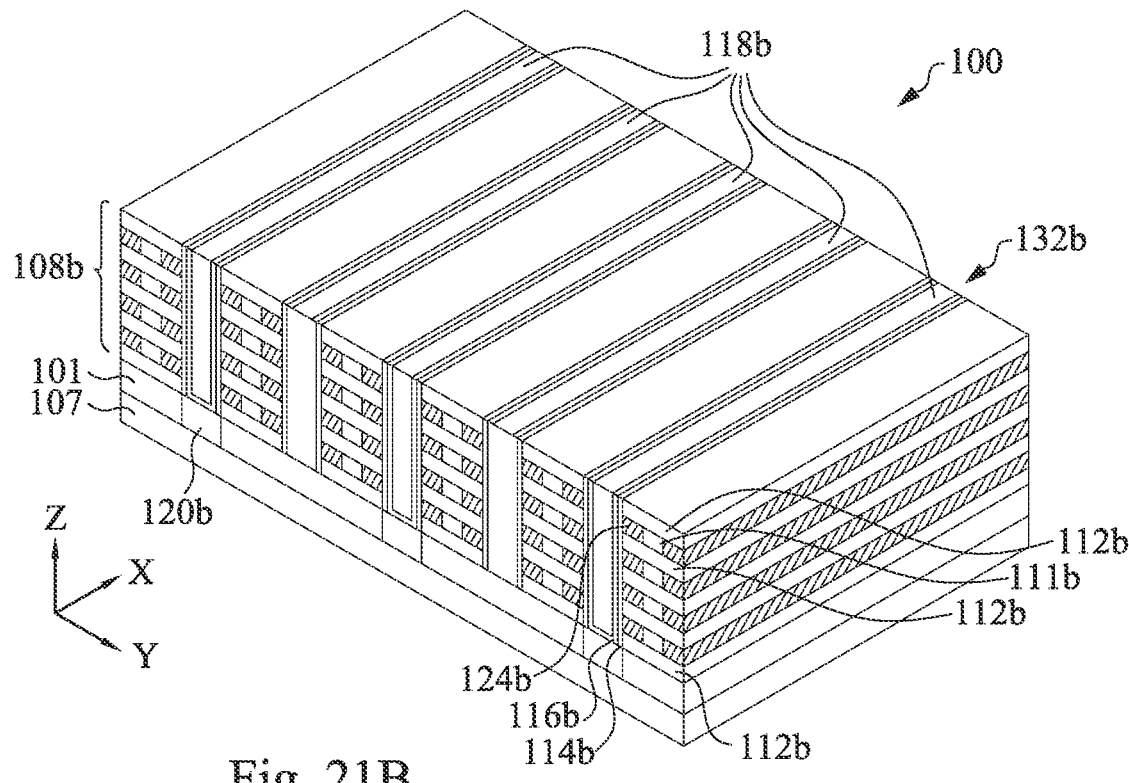
Figure 21C:
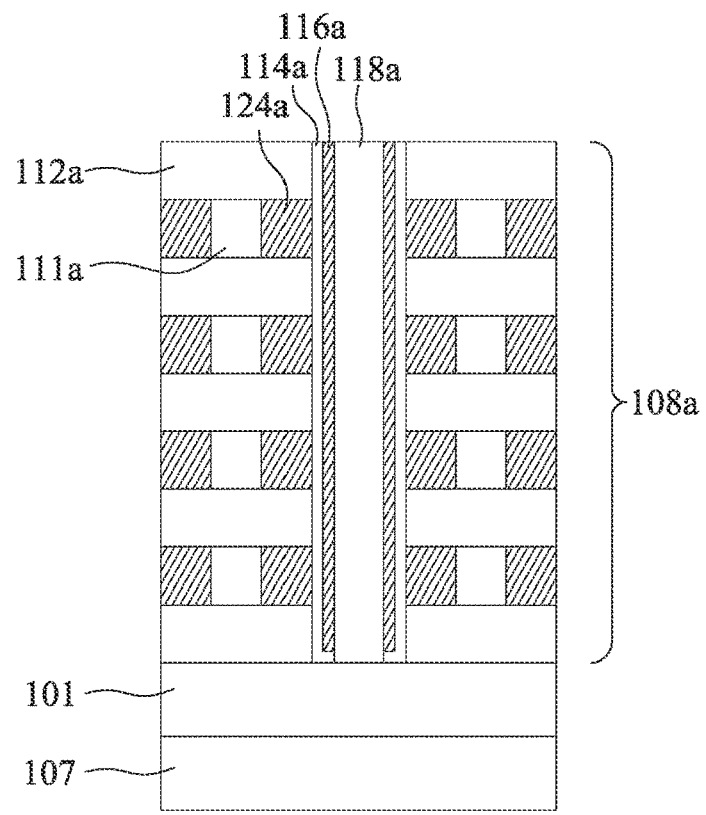
Figure 21D:
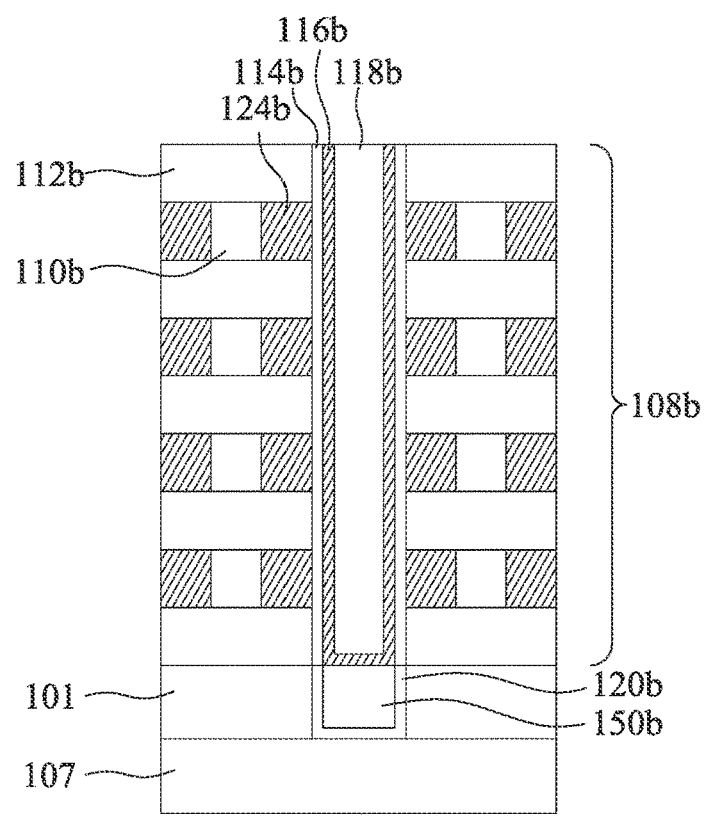
Figure 22A:
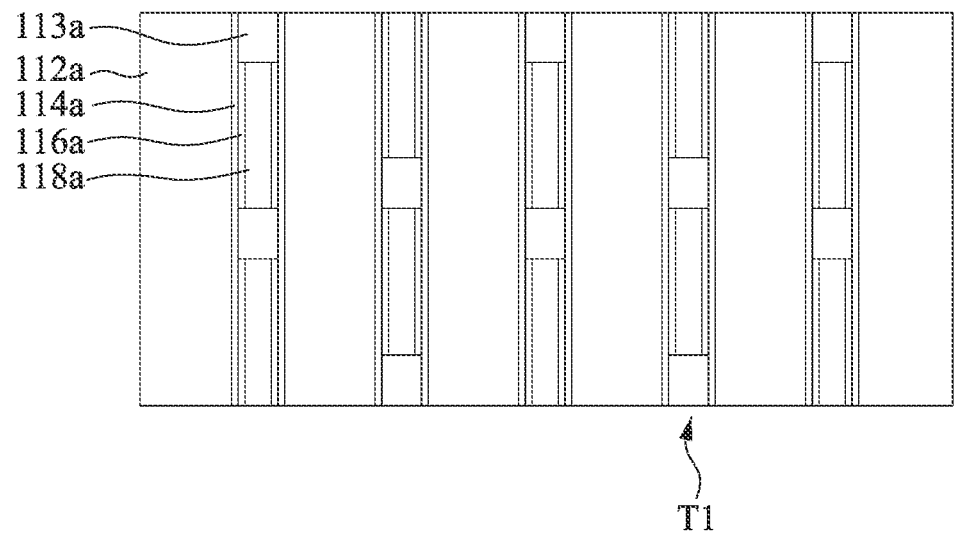
Figure 22B:
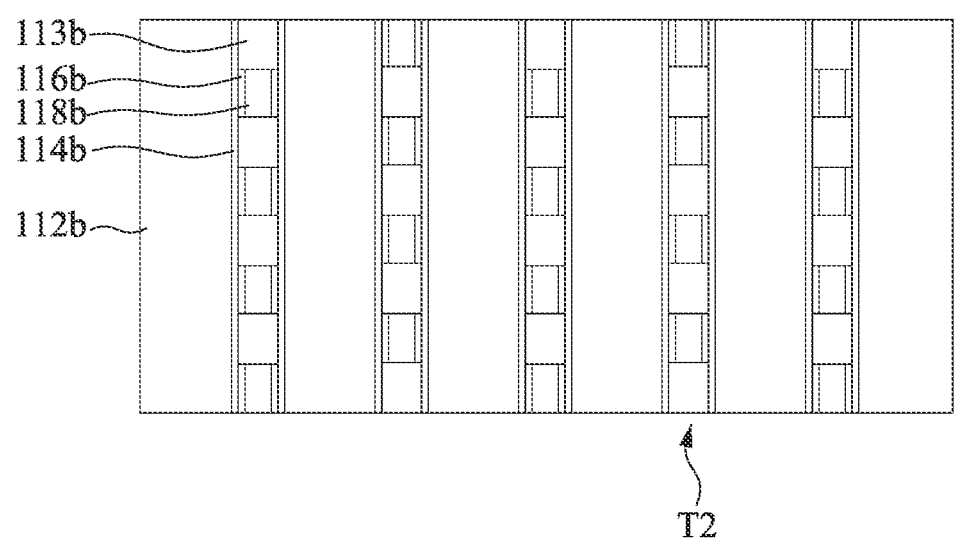
Figure 22C:
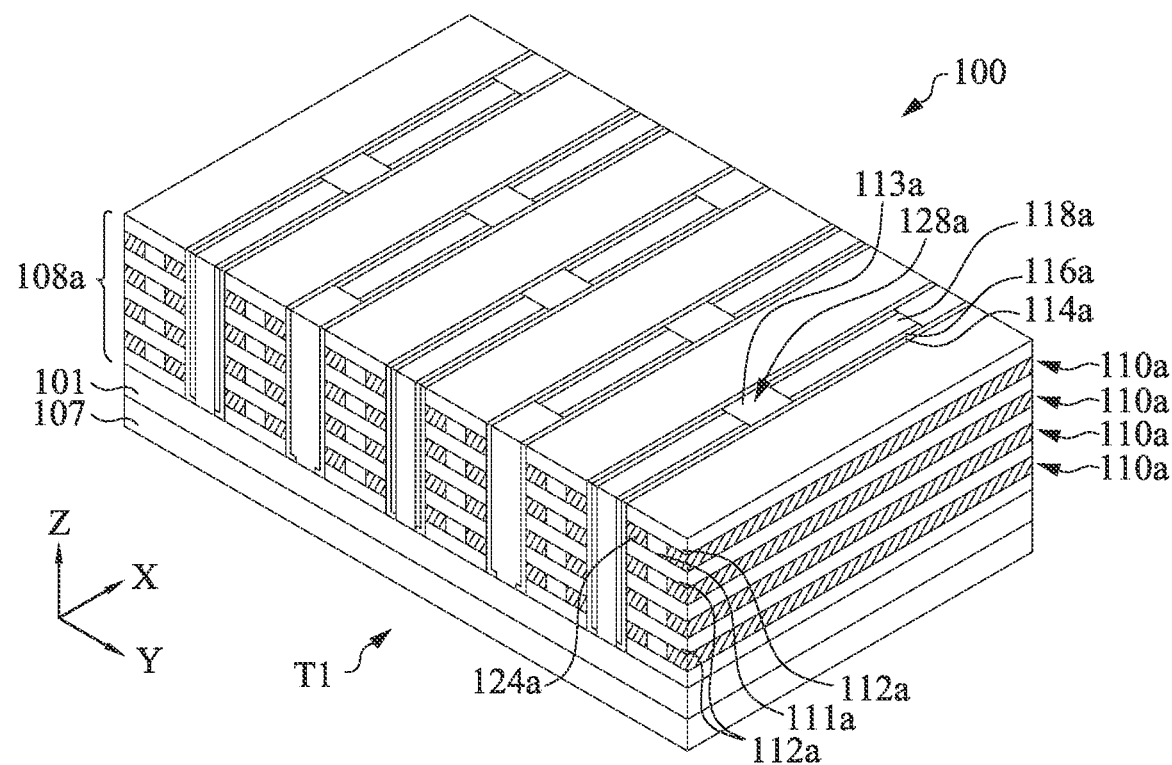
Figure 22D:
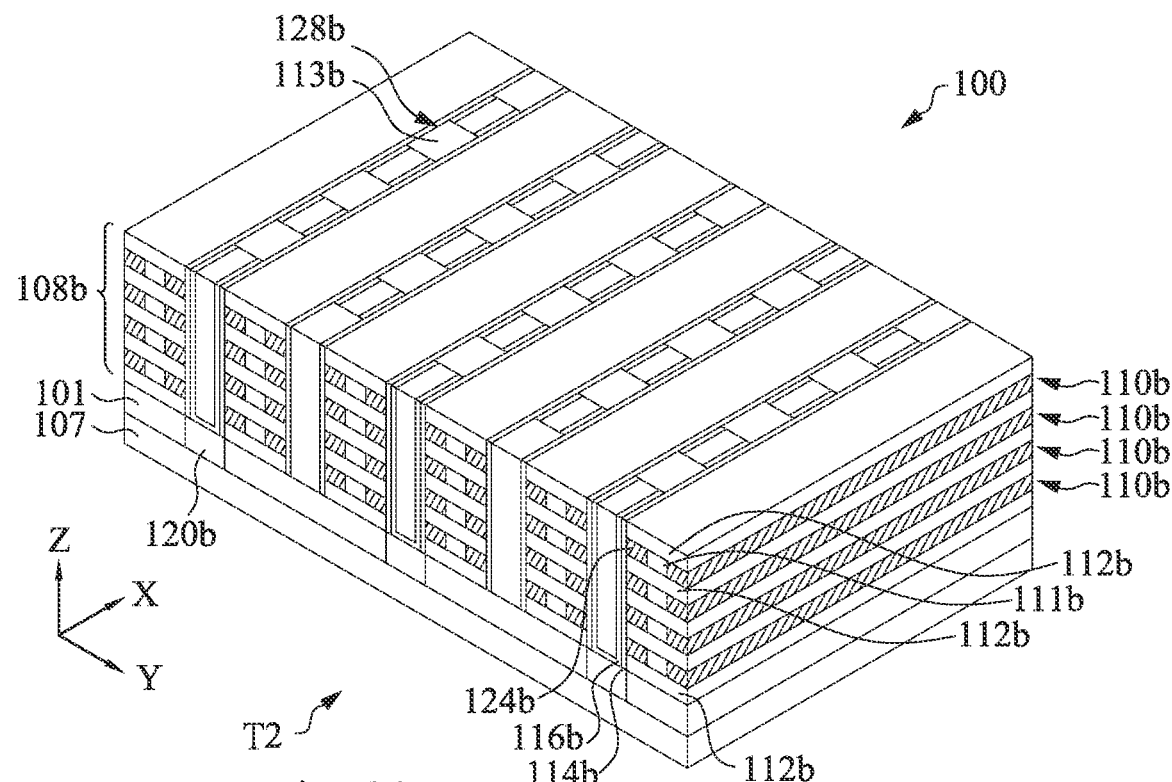

FIGS. 5A-27B illustrate the method M in various stages of forming the semiconductor die 100 in accordance with some embodiments of the present disclosure. FIGS. 5A, 6A, 7A, 8A, 9A, 10A, 11A, 12A, 13A, 14A, 15A, 16A, 17A, 18A, 19A, 20A, 21A, 22C, 23A, 24A, 25A, 26A, and 27A illustrate perspective views of a portion of the semiconductor die of FIG. 1A including the first set of the computing three-dimensional memory devices indicated by the arrow A in FIG. 1A, in accordance with some embodiments of the present disclosure. FIG. 22A illustrates a top view of the computing three-dimensional memory devices of FIG. 22C in accordance with some embodiments of the present disclosure. FIGS. 15C, 21C, 24C, and 26C illustrate cross-section view of the computing three-dimensional memory devices, taken along the line X-X in FIGS. 15A, 21A, 24A, and 26A, in accordance with some embodiments of the present disclosure. FIGS. 5B, 6B, 7B, 8B, 9B, 10B, 11B, 12B, 13B, 14B, 15B, 16B, 17B, 18B, 19B, 20B, 21B, 22D, 23B, 24B, 25B, 26B, and 27B illustrate perspective views of a portion of the semiconductor die of FIG. 1A including the second set of the storage three-dimensional memory devices indicated by the arrow B in FIG. 1A, in accordance with some embodiments of the present disclosure. FIG. 22B illustrates a top view of the storage three-dimensional memory devices of FIG. 22D in accordance with some embodiments of the present disclosure. FIGS. 15D, 21D, 24D, and 26D illustrate cross-section view of the storage three-dimensional memory devices, taken along the line Y-Y in FIGS. 15B, 21B, 24B, and 26B, in accordance with some embodiments of the present disclosure.

Figure 5A:
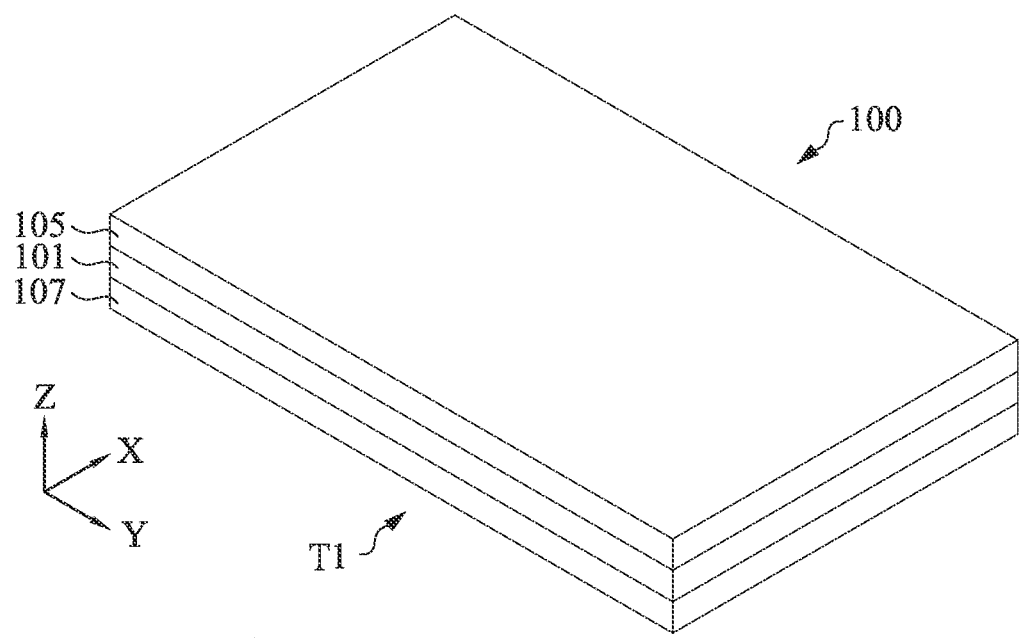
FIGS. 5A to 27B illustrate various views of an integrated circuit structure (or a portion of the example semiconductor die) during various fabrication stages, made by the method of FIGS. 4A and 4B, in accordance with some embodiments of the present disclosure.
Figure 5B:
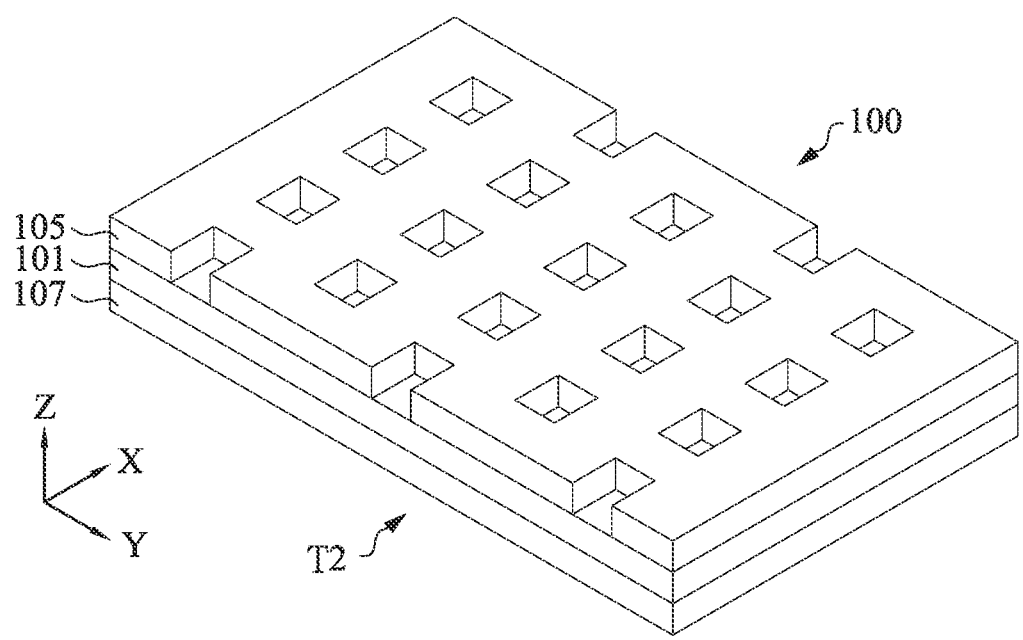

The method M begins at block S101 where an etch stop layer is formed over a computing memory region and a storage memory region of a substrate. Referring to FIGS. 5A and 5B, in some embodiments of block S101, the substrate 107 may be a semiconductor substrate, such as a bulk semiconductor, a semiconductor-on-insulator (SOI) substrate, or the like, which may be doped (e.g., with a p-type or an n-type impurity) or un-doped. The substrate 107 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like. In some embodiments, the device spacer 113a/b be formed from an electrically insulating material (e.g., silicon oxide ($SiO_2$), silicon nitride (SiN), silicon oxide (SiO), silicon carbide nitride (SiCN), silicon oxycarbonitride (SiOCN), silicon oxynitride (SiON), $HfO_2$, $TaO_x$, $TiO_x$, $AlO_x$, etc.). The substrate 107 may have a computing three-dimensional memory region T1 as shown in FIG. 5A that will have the first semiconductor devices (e.g. AND memory device) to be formed thereon and a storage three-dimensional memory region T2 as shown in FIG. 5B that will have the second semiconductor devices (e.g. NAND memory device) to be formed thereon.

In some embodiments, an etch stop layer 101 may be formed over the substrate 107 by using a plasma deposition process, for example, using PVD, CVD, LPCVD, PECVD, ALD, MBE, HARP, any other suitable process or a combination thereof. In some embodiments, the etch stop layer 101 may include SiN, SiO, $SiO_2$, SiCN, SiOCN, SiON, $HfO_2$, $TaO_x$, $TiO_x$, $AlO_x$, a metal carbide, any other suitable material or combination thereof, and may include a single layer or various sublayers.

Figure 6A:
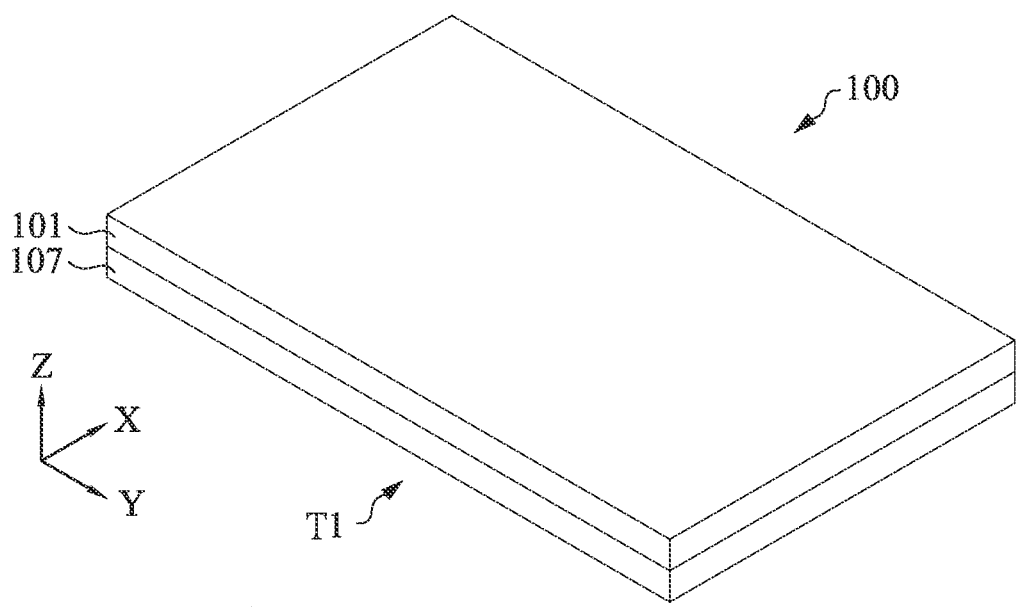
Figure 6B:
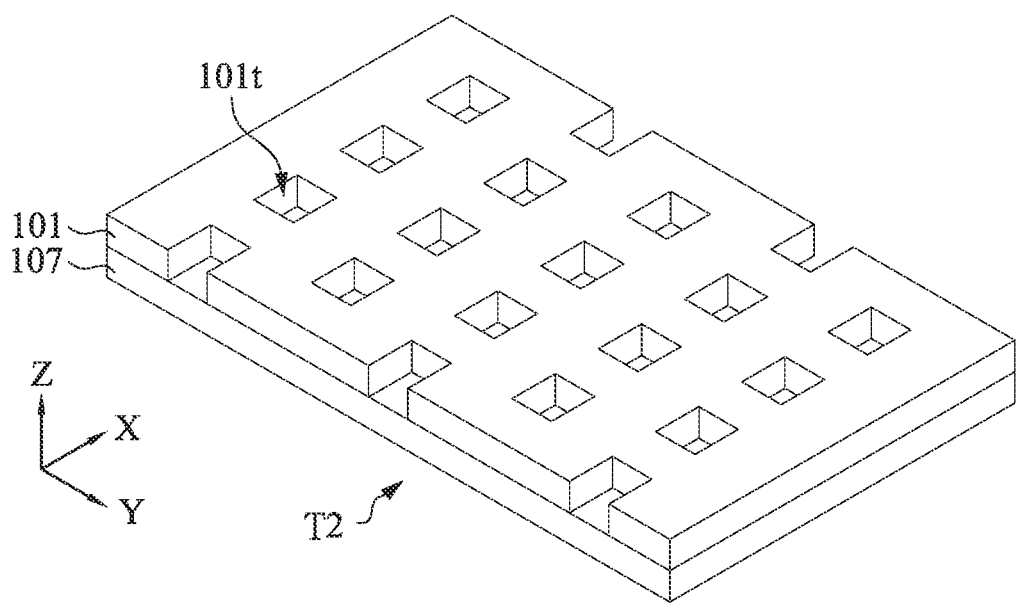

Subsequently, a patterned hard mask layer 105 may be formed on the etch stop layer 101. The etch stop layer 101 may be etched through the patterned hard mask layer 105 to form trenches 101t as shown in FIG. 6B therein. In some embodiments, the patterned hard mask layer 105 may be formed by patterning a hard mask material using a combination of photolithography and etching. For example, a hard mask material may be deposited over the etch stop layer 101 in the computing three-dimensional memory region T1 as shown in FIG. 5A and the storage three-dimensional memory region T2 as shown in FIG. 5B. The hard mask material can be formed by using, such as a spin-on technique. Subsequently, the hard mask material may be patterned to form the patterned mask layer 105 to define the trenches 101*t* (see FIG. 6B) on the etch stop layer 101 in the storage three-dimensional memory region T2. As shown in FIGS. 5A and 5B, the patterned hard mask layer 105 in the storage three-dimensional memory region T2 have a conductive line pattern, but the patterned hard mask layer 105 in the computing three-dimensional memory region T1 is free of the conductive line pattern. In other words, the etch stop layer 101 in the computing three-dimensional memory region T1 is entirely covered by a first side of the patterned hard mask layer 105 without having any conductive line pattern thereon, and the etch stop layer 101 in the storage three-dimensional memory region T2 is partially exposed through a second side of the patterned hard mask layer 105 with the conductive line pattern thereon.

Referring back to FIG. 4A, the method M then proceeds to block S102 where the etch top layer is etched to form first conductive line trenches in the storage memory region while remains the etch top layer in the computing memory region not to be etched. With reference to FIGS. 6A and 6B, in some embodiments of block S102, the etch stop layer 101 in the storage three-dimensional memory region T2 is etched through the second side of the patterned hard mask layer 105 with the conductive line pattern thereon as shown in FIG. 5B to form the trenches 101*t* (see FIG. 6B), but remains the etch top layer 101 in the computing three-dimensional memory region T1 not to be etched (see FIG. 6A) and covered by the first side of the patterned hard mask layer 105 without the conductive line pattern thereon as shown in FIG. 5A. A pattern of the conductive line trenches 101*t* may correspond to the conductive line pattern on the patterned hard mask layer 105.

In some embodiments, the etching may be any acceptable etch process, such as by wet or dry etching, a reactive ion etch (RIE), neutral beam etch (NBE), the like, or a combination thereof. The etching may be anisotropic. The etching process may use an etchant that etches the etch stop layer 101 without significantly etching the patterned hard mask layer 105. After the trenches 101*t* are formed, the patterned hard mask layer 105 is subsequently stripped, such as by wet stripping or plasma ashing.

Figure 7A:
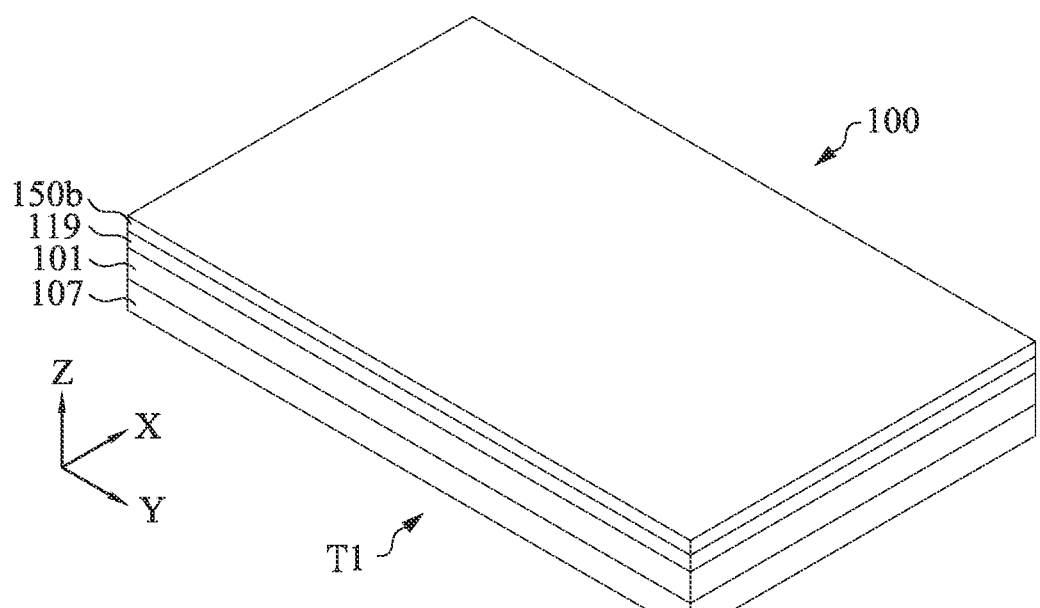
Figure 7B:
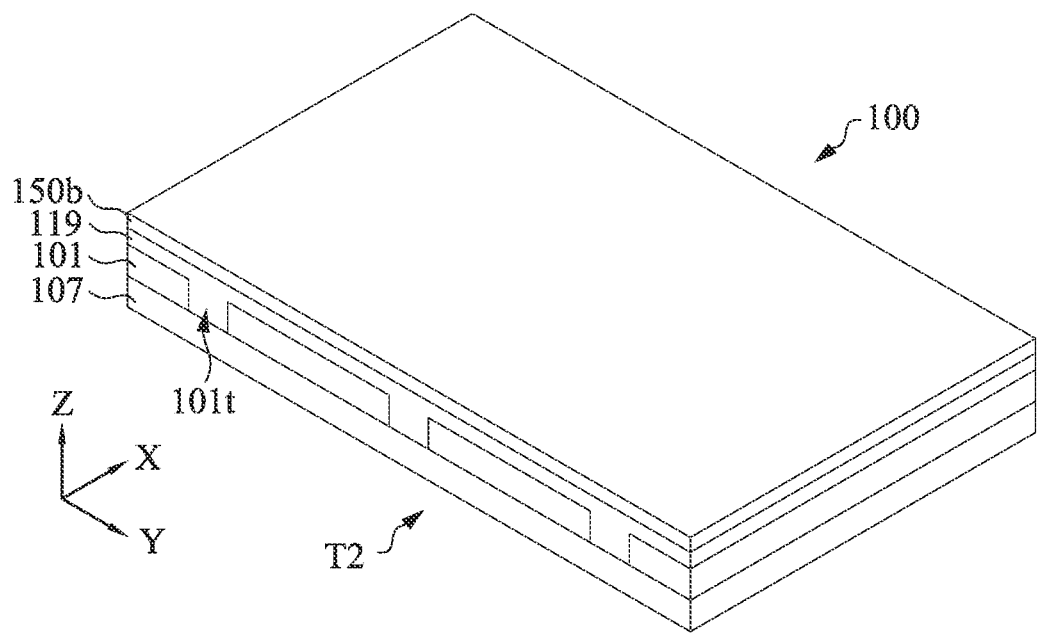

Referring back to FIG. 4A, the method M then proceeds to block S103 where a reduced RC layer and a first conductive material are deposited over the etch stop layer and in the first conductive line trenches within the computing memory region and the storage memory region. With reference to FIGS. 7A and 7B, in some embodiments of block S103, a conductive material 119 is comfomally formed over the etch stop layer 101 and in the conductive line trenches 101*t* within the computing three-dimensional memory region T1 and the storage three-dimensional memory region T2. In some embodiments, the conductive material 119 may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the conductive material 119 may include a semiconductor material, for example, an nor p-doped semiconductor such as Si, SiGe, or any other semiconductor material (e.g., IGZO, ITO, IZO, ZnO, IWO, poly silicon, amorphous Si, etc.), and may be formed using a deposition process, an epitaxial growth process, or any other suitable process. In some embodiments, the conductive material 119 may be formed by using, for example, CVD, ALD, PVD, PECVD, or the like.

Subsequently, a reduced parasitic RC layer 150*b* is deposited over the conductive material 119 within the computing three-dimensional memory region T1 and the storage three-dimensional memory region T2. In some embodiments, the reduced parasitic RC layer 150*b* may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the reduced parasitic RC layer 150*b* may include a semiconductor material, for example, an n or p-doped semiconductor such as Si, SiGe, or any other semiconductor material (e.g., IGZO, ITO, IZO, ZnO, IWO, poly silicon, amorphous Si, etc.). In some embodiments, the reduced parasitic RC layer 150*b* may be formed by using, for example, CVD, ALD, PVD, PECVD, or the like.

Figure 8A:
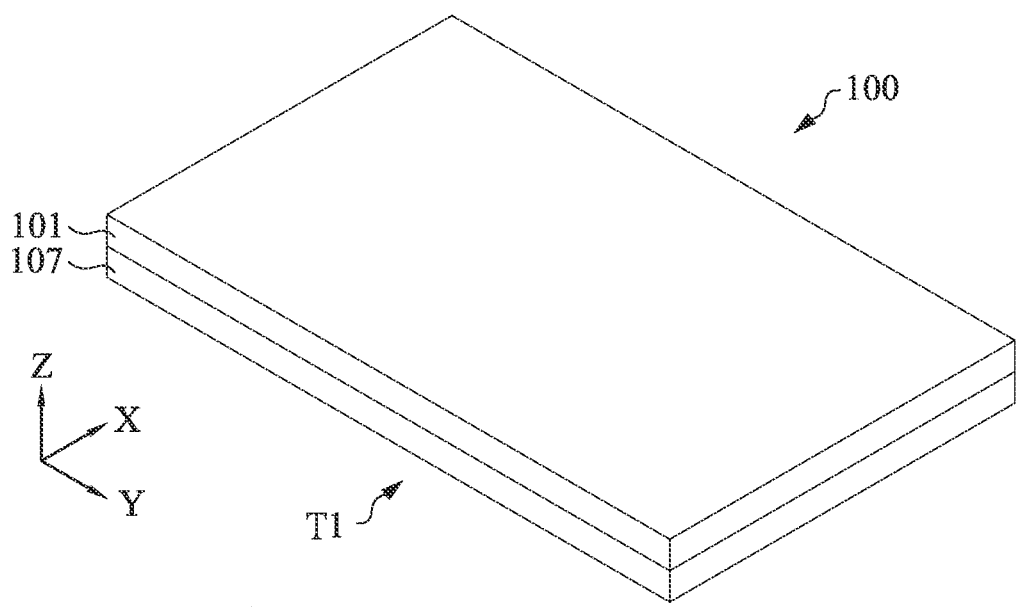
Figure 8B:
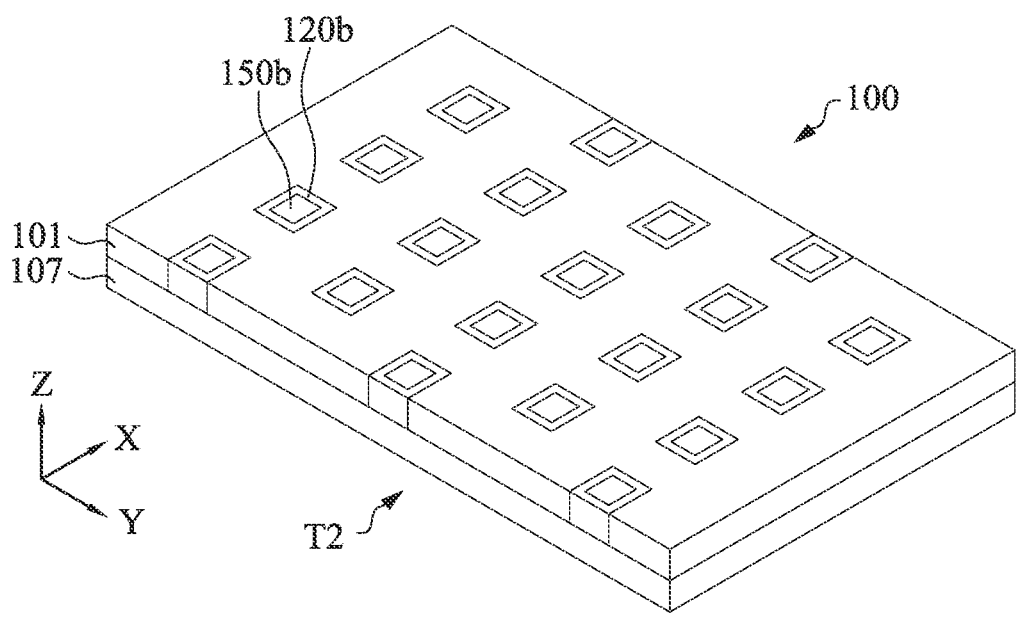

Referring back to FIG. 4A, the method M then proceeds to block S104 where a planarized process is performed on the reduced parasitic RC layer and the first conductive material until the etch stop layer is exposed to form first conductive lines of storage memory devices electrically coupled to respective source lines within the storage memory region. With reference to FIGS. 8A and 8B, in some embodiments of block S104, a planarized process (e.g., a CMP, etch back, or the like) is performed to remove excess portions of the reduced parasitic RC layer 150*b* and the conductive material 119 over the etch stop layer 101 until the etch stop layer 101 is exposed. The remaining conductive lines 120*b* and the reduced parasitic RC layers 150*b* fill the trenches 101*t* in the etch stop layer 101 and form the reduced parasitic RC layer 150*b* and the conductive lines 120*b* cupped by the conductive line 120*b* as shown in FIG. 3B that can be electrically coupled to respective global source lines. In some embodiments, the conductive lines 120*b* can be interchangeably referred to as conductive source lines. In some embodiments, the conductive lines 120*b* can be electrically coupled to respective global bit lines and can be interchangeably referred to as conductive bit lines.

Figure 9A:
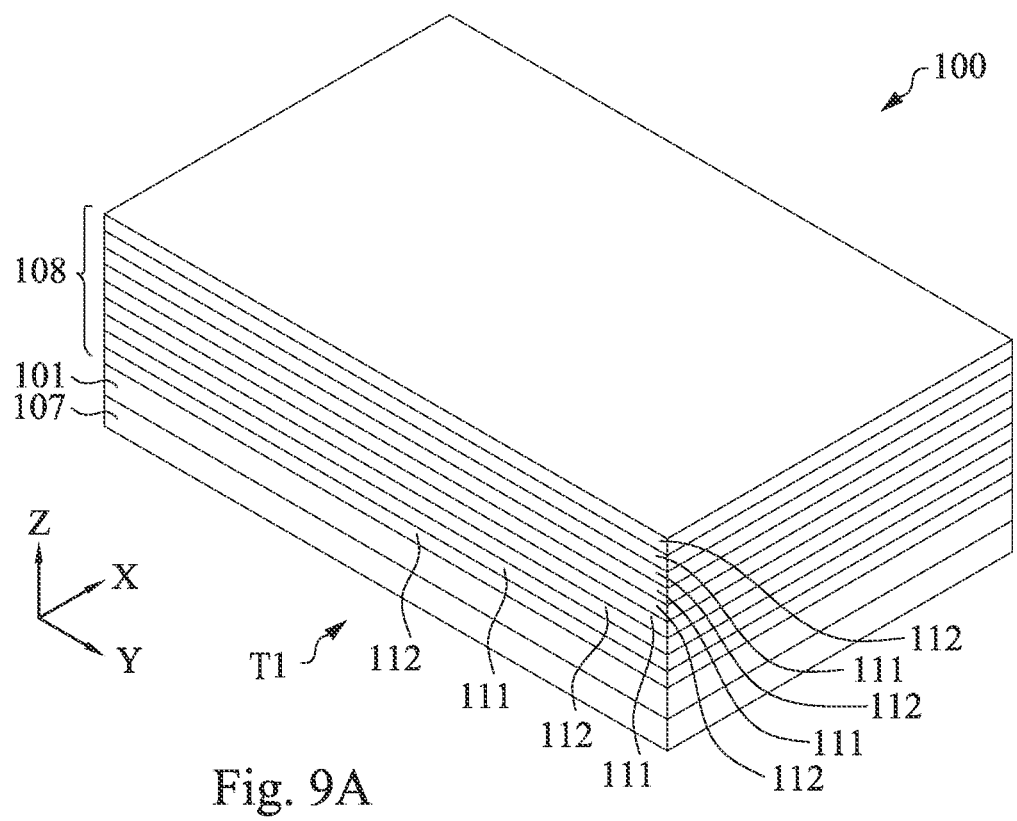
Figure 9B:
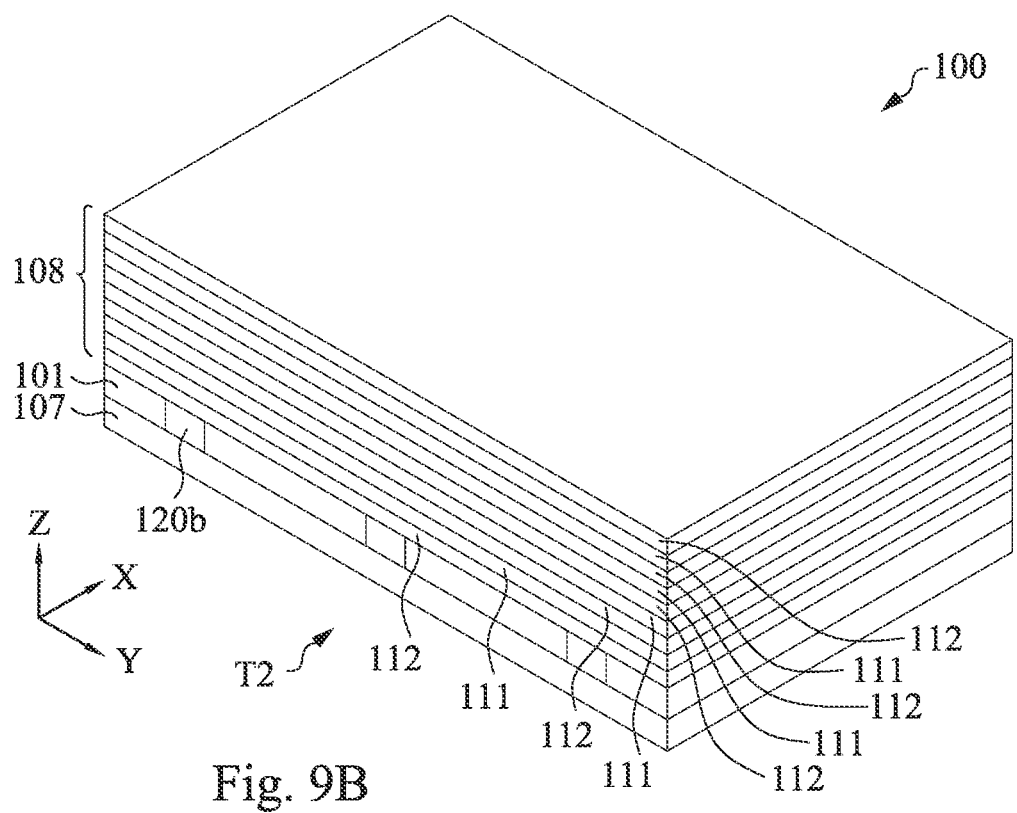

Referring back to FIG. 4A, the method M then proceeds to block S105 where a multi-layered stack having insulating layers and spacer layers alternately stacked on top of each other in a vertical direction is formed over the etch stop layer within the computing memory region and the storage memory region. With reference to FIGS. 9A and 9B, in some embodiments of block S105, a multi-layered stack 108 is formed over the etch stop layer 101 within the computing three-dimensional memory region T1 as shown in FIG. 9A and the storage three-dimensional memory region T2 as shown in FIG. 9B. The multi-layered stack 108 includes a plurality of insulating layers 112 and a plurality of spacer layers 111 alternately stacked on top of each other in the vertical direction (e.g., the Z-direction). For example, one of the spacer layers 111 is disposed over one of the insulating layers 112, and then another one of the insulating layers 112 is disposed on the spacer layer 111, so on and so forth. As shown in FIGS. 9A and 9B, a topmost layer (e.g., a layer distal most from the substrate 107) and/or a bottommost layer (e.g., a layer most proximate to the substrate 107) of the multi-layered stack 108 may be an insulating layer 112. While FIGS. 9A and 9B show the multi-layered stack 108 as including five insulating layers 112 and four spacer layers 111, the multi-layered stack 108 may include any number of insulating layers 112 and spacer layers 111 (e.g., 4, 5, 6, 7, 8, 16, 24, 48, 64, 128, or even more). In some embodiments, if the number of spacer layers 111 in the multi-layered stack 108 is n, a number of insulating layers 112 in the multi-layered stack 108 may be n+1, wherein n is an integral greater than or equal to one.

In some embodiments, each of the plurality of insulating layers 112 may have about the same thickness, for example, in a range of about 5 nm to about 100 nm, inclusive.

Moreover, the spacer layers 111 may have the same thickness or different thickness from the insulating layers 112. The thickness of the spacer layers 111 may range from a few nanometers to few tens of nanometers (e.g., in a range of 5 nm to 100 nm, inclusive, but other ranges and values are also contemplated and are within the scope of this disclosure). In some embodiments, a topmost spacer layer 111 and/or a bottom most spacer layer 111 may be thicker (e.g., 1.2×, 1.4×, 1.6×, 1.8×, 2×, 2.5×, or 3× thicker) than the other spacer layers 111 disposed therebetween.

The insulating layers 112 and the spacer layers 111 have different compositions. In some embodiments, the insulating layers 112 and the spacer layers 111 have compositions that provide for different oxidation rates and/or different etch selectivity between the respective layers. In some embodiments, the insulating layers 112 may be formed from silicon oxide ($SiO_x$), and the spacer layers 111 may be formed from silicon nitride (SiN). In some embodiments, the insulating layers 112 may be formed from any suitable first material (e.g., an insulating material) as described with respect to the semiconductor die 100, and the spacer layers 111 may be formed from a second material (e.g., also an insulating material) that is different from the first material. In some embodiments, the spacer layers may 111 include SiN, $HfO_2$, $TaO_x$, $TiO_x$, $AlO_x$, or any other material that has a high etch selectivity relative to the insulating layers 112 (e.g., an etch selectivity ratio of at least 1:100).

In some embodiments, the insulating layers 112 and/or the spacer layers 111 may be epitaxially grown from the substrate 107. For example, each of the insulating layers 112 and the spacer layers 111 may be grown by a MBE process, a CVD process such as a metal organic CVD (MOCVD) process, a furnace CVD process, and/or other suitable epitaxial growth processes. In some embodiments, the insulating layers 112 and the spacer layers 111 may be grown using an atomic layer deposition (ALD) process.

Figure 10A:
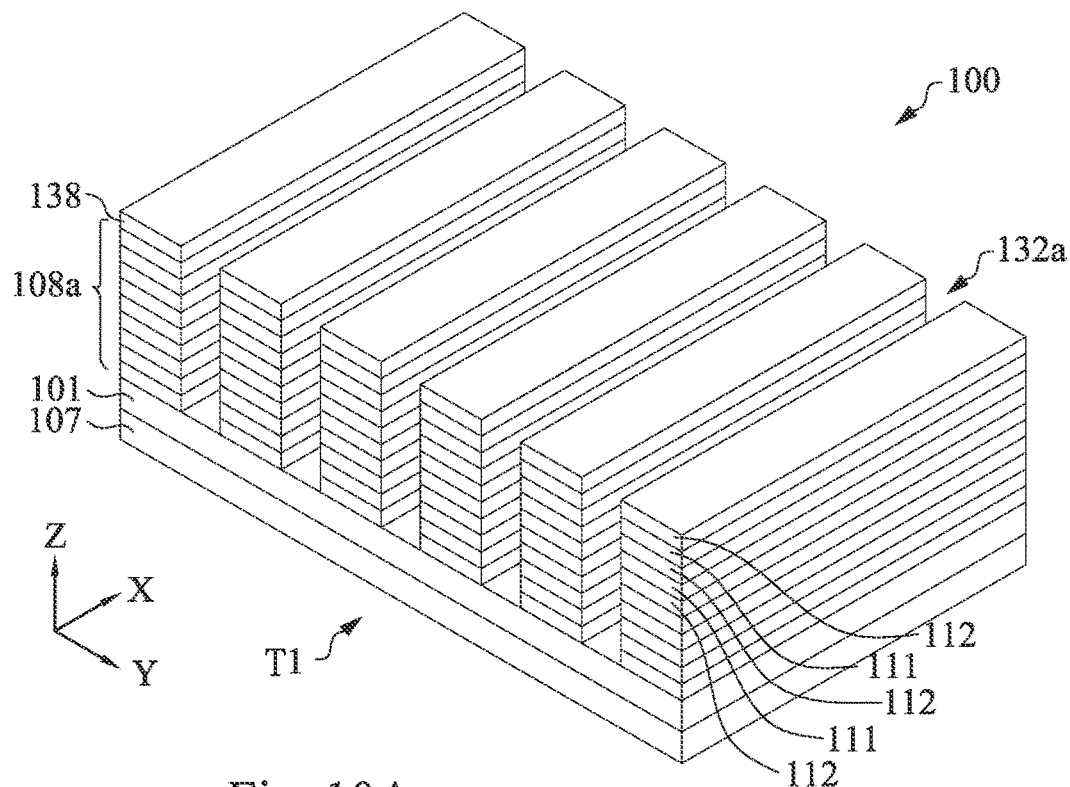
Figure 10B:
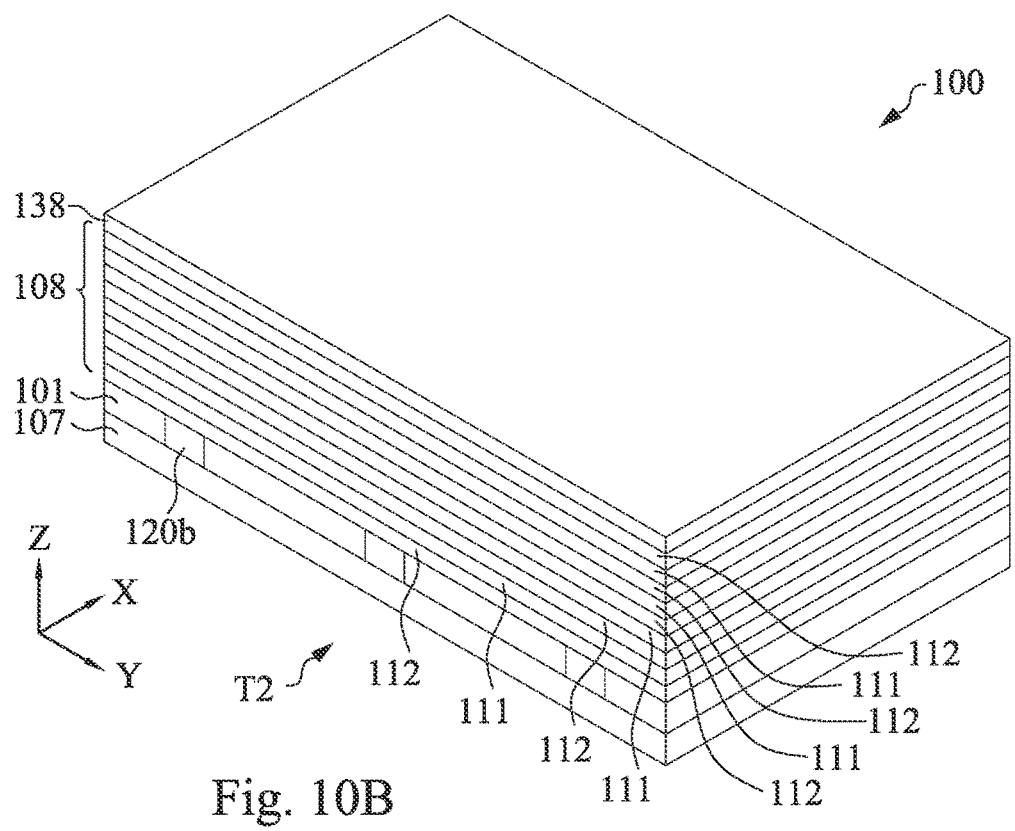

Referring back to FIG. 4A, the method M then proceeds to block S106 where a plurality of first trenches are formed through the multi-layered stack within the computing memory region to form a plurality of first stacked structures while remains the multi-layered stack within the computing memory region not to be etched. With reference to FIGS. 10A and 10B, in some embodiments of block S106, a plurality of first trenches 132a extending in the first direction (e.g., the X-direction) are formed through the multi-layered stack 108 within the computing three-dimensional memory region T1 from the topmost insulating layer 112 to the etch stop layer 101 to form stacked structures 108a, while remains the multi-layered stack 108 within the storage three-dimensional memory region T2 not to be etched.

A patterned hard mask layer 138 may be formed on the multi-layered stack 108. In some embodiments, the patterned hard mask layer 138 may be formed by patterning a hard mask material using a combination of photolithography and etching. For example, a hard mask material may be deposited over the multi-layered stack 108 in a computing three-dimensional memory region T1 as shown in FIG. 10A and a storage three-dimensional memory region T2 as shown in FIG. 10B. The hard mask material can be formed by using, such as a spin-on technique. Subsequently, the hard mask material may be patterned to form the patterned mask layer 138 to define the first trenches 132a (see FIG. 10A) on the multi-layered stack 108 in the computing three-dimensional memory region T1. As shown in FIGS. 10A and 10B, the patterned hard mask layer 138 in the computing three-dimensional memory region T1 has a strip pattern, but the patterned hard mask layer 138 in the storage three-dimensional memory region T2 is free of the strip pattern. In other words, the multi-layered stack 108 in the computing three-dimensional memory region T1 is partially exposed through a first side of the patterned hard mask layer 138 with the strip pattern thereon, and the multi-layered stack 108 in the storage three-dimensional memory region T2 is entirely covered by a second side of the patterned hard mask layer 138 without having any strip pattern thereon.

Subsequently, the multi-layered stack 108 in the computing three-dimensional memory region T1 is etched through the first side of the patterned hard mask layer 138 with the strip pattern thereon to form the first trenches 132a (see FIG. 10A), but remains the multi-layered stack 108 in the storage three-dimensional memory region T2 covered by the second side of the patterned hard mask layer 138 without the strip pattern thereon and not to be etched (see FIG. 10B). A pattern of the first trenches 132a may correspond to the strip pattern on the patterned hard mask layer 138. In some embodiments, the multi-layered stack 108 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 132a. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In some embodiments, after the first trenches 132a are formed, the patterned hard mask layer 138 is subsequently stripped, such as by wet stripping or plasma ashing.

Figure 11A:
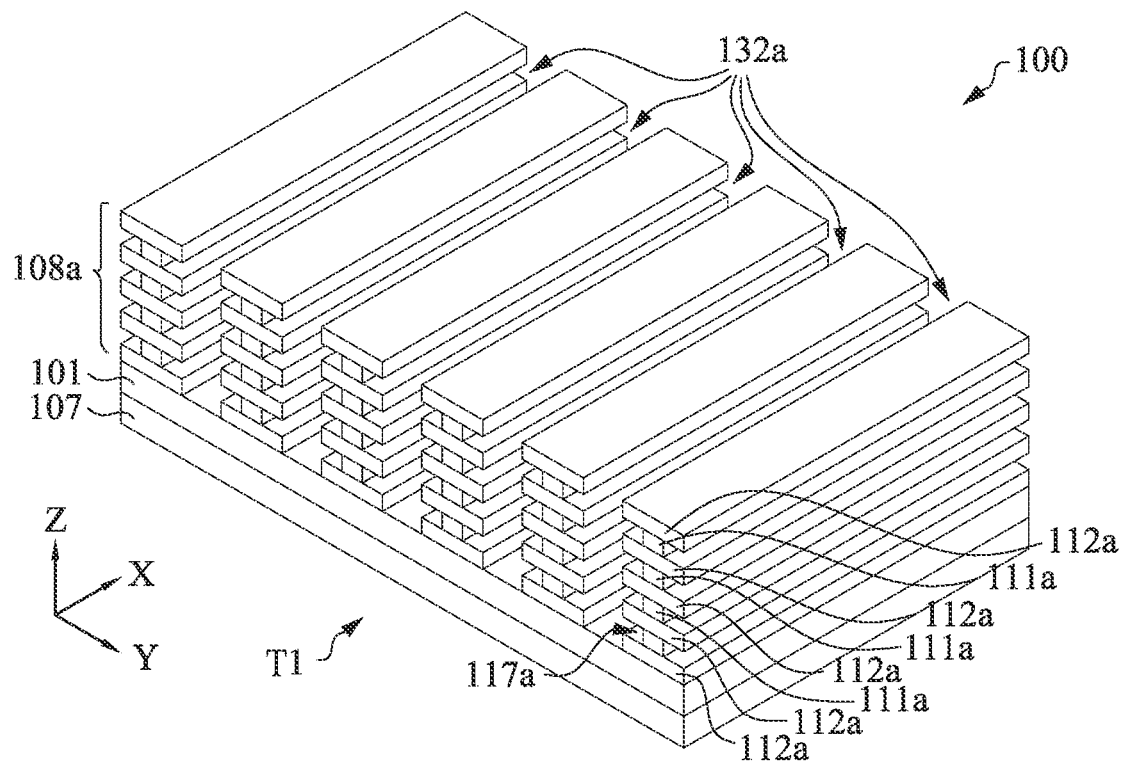
Figure 11B:
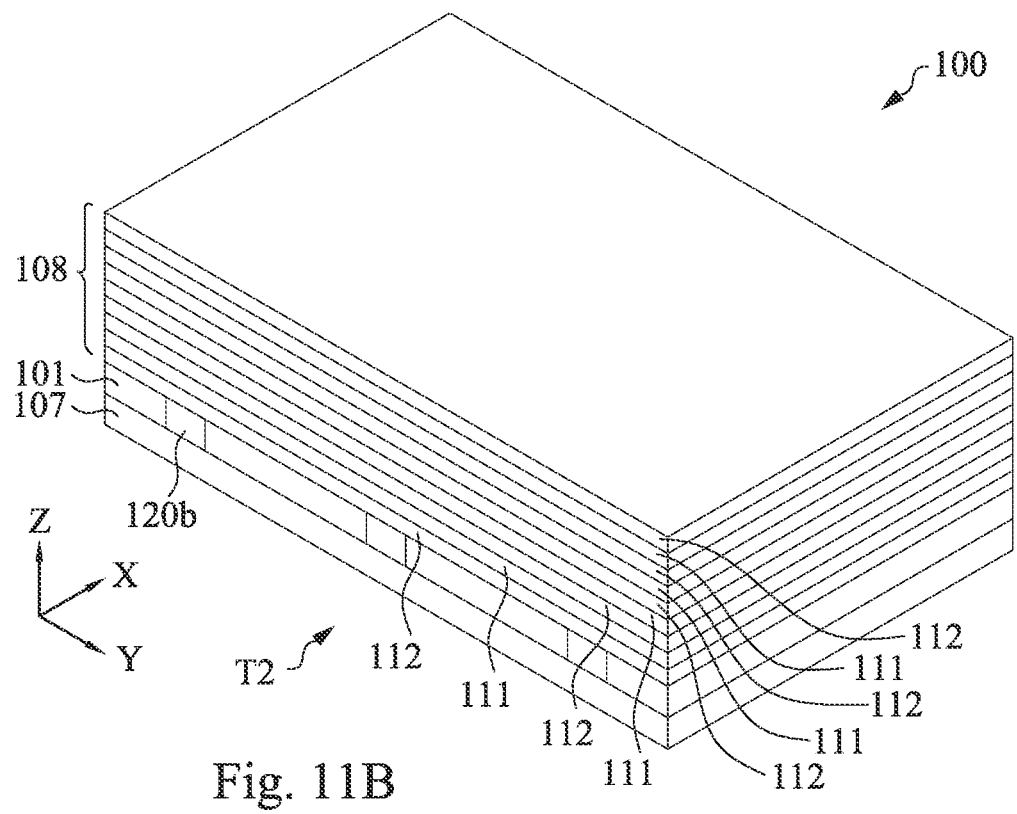

Referring back to FIG. 4A, the method M then proceeds to block S107 where exposed surfaces of the spacer layers within the first trenches are partially etched so as to reduce widths of the spacer layers relative to the insulating layers to form first cavities in the first stacked structures. With reference to FIGS. 11A and 11B, in some embodiments of block S107, exposed surfaces of the spacer layers 111 extending along the X-direction within the first trenches 132a are partially etched so as to reduce widths of the spacer layers 111 relative to the insulating layers 112 in the Y-direction on either side of the spacer layers 111, such that cavities 117a in the stacked structures 108a are formed whose boundaries are formed by top and bottom surfaces of adjacent insulating layers 112 and a surface of the partially etched spacer layers 111 that face the first trenches 132a and extend along the X-direction.

In some embodiments, the spacer layers 111 may be etched using a wet etch process (e.g., hydrofluoric etch, buffered hydrofluoric acid, phosphoric acid, etc.). In some embodiments, the exposed surfaces of the spacer layers 111 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 12A:
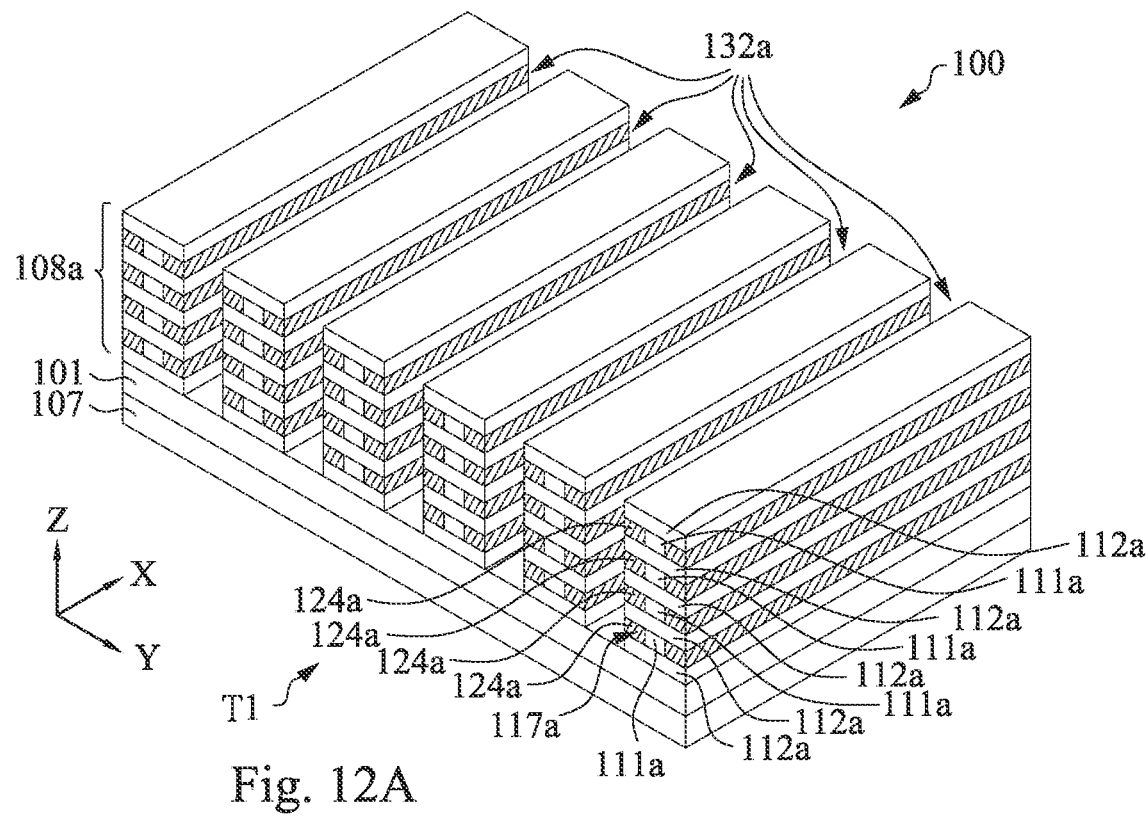
Figure 12B:
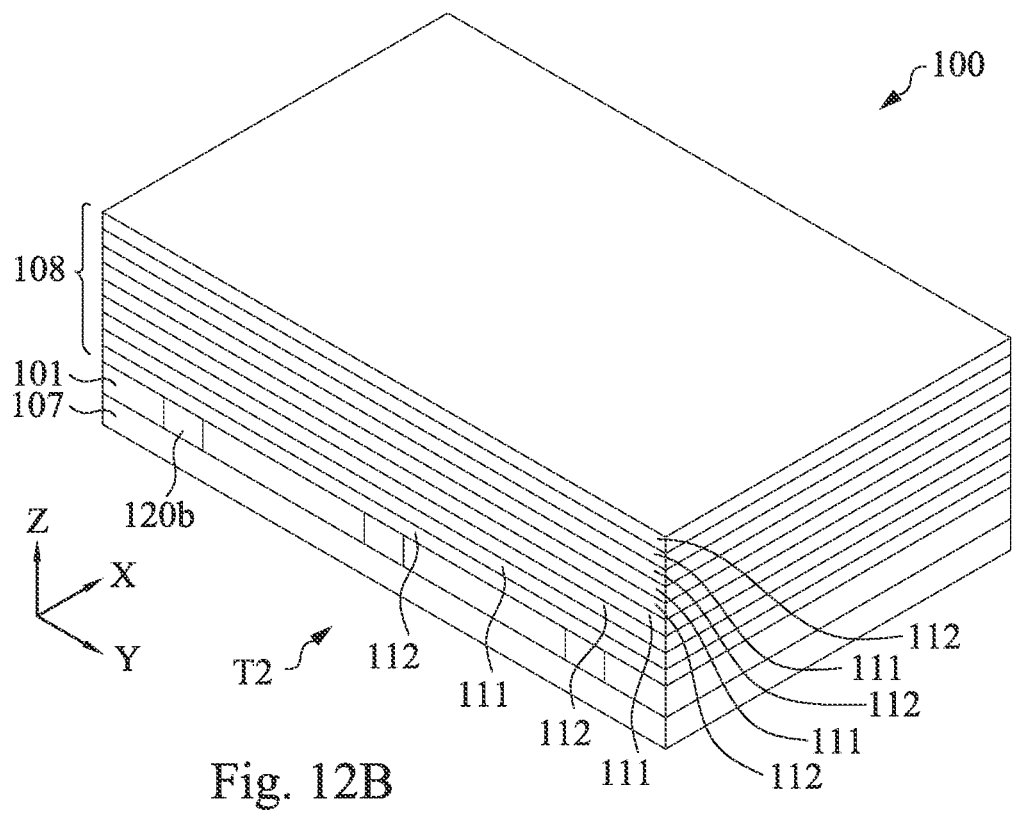

Referring back to FIG. 4A, the method M then proceeds to block S108 where a plurality of first gate layers are formed in the first cavities of the first stacked structure. With reference to FIGS. 12A and 12B, in some embodiments of block S108, a first gate metal layer may be deposited over the computing three-dimensional memory region T1 and the storage three-dimensional memory region T2. Subsequently, an etching back process is performed on the first gate metal layer to form first gate layers 124a in the cavities 117a. This is described in greater detail with reference to FIGS. 12A and 12B, the gate metal layer may be etched back to expose sidewalls of the first insulating layers 112a within the first trenches 132a (see FIG. 12A) and a topmost surface of the stacked structures 108a within the computing three-dimensional memory region T1 and a topmost surface of the multi-layered stack 108 in the storage three-dimensional memory region T2 (see FIGS. 12A and 12B). Therefore, the remaining first gate metal layer fills the cavities 117a in the stacked structures 108a and serves as the first gate layer 124a as shown in FIG. 12A. In other words, the first gate layers 124a may be covered by sidewalls of the spacer layers 111a and top and/or bottom surfaces of the insulating layers 112b. Although, each of the first gate layers 124a shown in FIG. 12A is shown as a single layer, In some embodiments, each of the first gate layers 124a can be formed as a multi-layer stack (e.g., including a first gate dielectric layer and a first gate metal layer).

The etch back of the first gate metal layer to form the first gate layers 124a may be performed with an acceptable process such as a wet etch or a dry etch. In some embodiments, the first gate metal layer may be etched back with a wet etch using KOH, NH$_4$OH, H$_2$O$_2$, the like, or a combination thereof. In some embodiments, the first gate metal layer may be recessed with a dry etch using NH$_3$, NF$_3$, HF, the like, or a combination thereof. In some embodiments, a planarization such as a CMP is performed to remove excess portions of the first gate metal layer remaining over the topmost surface of the stacked structures 108a within the computing three-dimensional memory region T1 and the topmost surface of the multi-layered stack 108 in the storage three-dimensional memory region T2.

In some embodiments, the first gate layer 124a may include a stack of multiple metal materials. In some embodiments, the first gate layer 124a may include a p-type workfunction layer, an n-type workfunction layer, multi-layers thereof, or combinations thereof. The workfunction layer may also be referred to as a workfunction metal. Example p-type workfunction metals that may include TiN, TaN, Ru, Mo, Al, WN, ZrSi$_2$, MoSi$_2$, TaSi$_2$, NiSi$_2$, WN, other suitable p-type workfunction materials, or combinations thereof. Example n-type workfunction metals that may include Ti, Ag, TaAl, TaAlC, TiAlN, TaC, TaCN, TaSiN, Mn, Zr, other suitable n-type workfunction materials, or combinations thereof. A workfunction value is associated with the material composition of the workfunction layer, and thus, the material of the workfunction layer is chosen to tune its workfunction value so that a target threshold voltage V$_t$ is achieved in the device that is to be formed. The first gate metal layer may be deposited by CVD, PVD, ALD, and/or other suitable process.

Figure 13A:
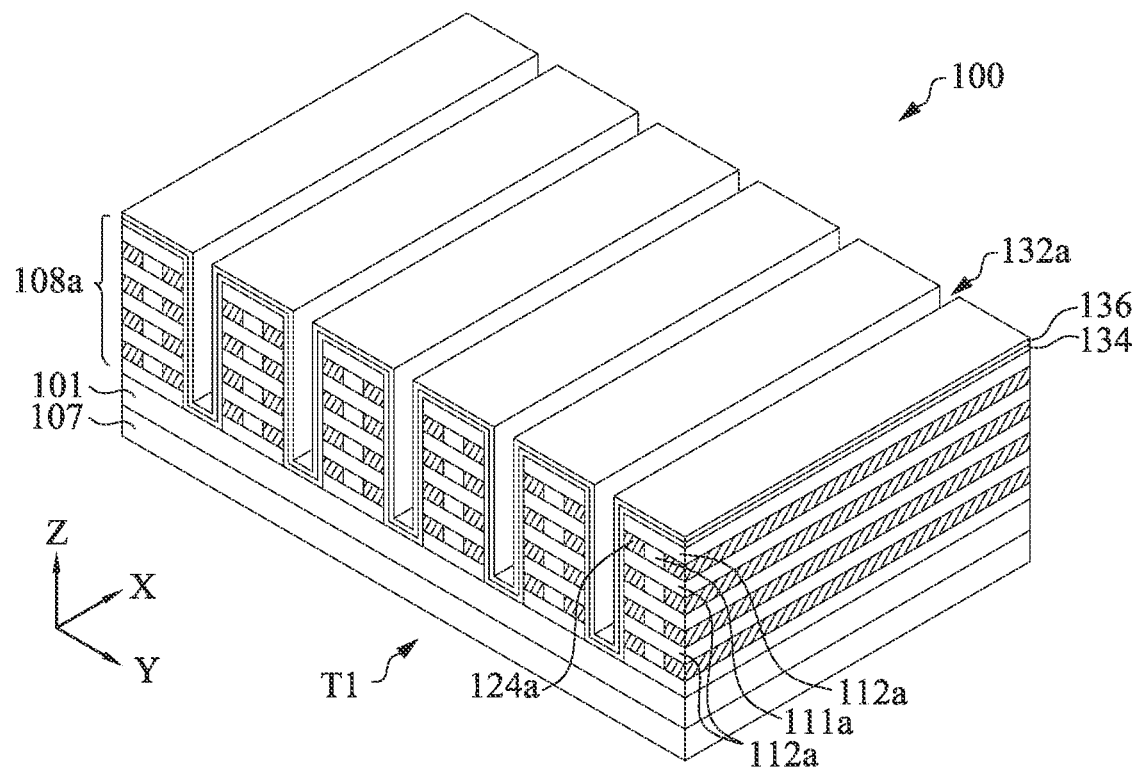
Figure 13B:
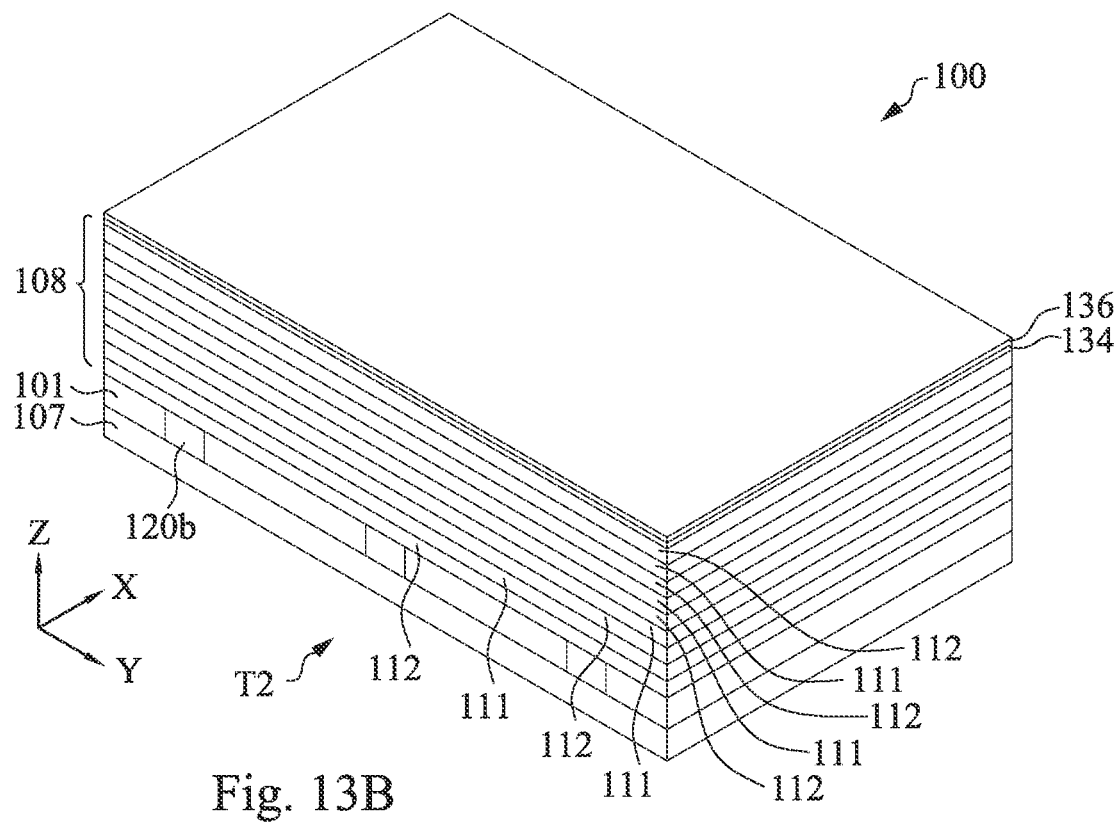

Referring back to FIG. 4A, the method M then proceeds to block S109 where a first memory material and a first channel material are conformally formed over the computing memory region and the storage memory region. With reference to FIGS. 13A and 13B, in some embodiments of block S109, a first memory material 134 may be conformally formed over the computing three-dimensional memory region T1 and the storage three-dimensional memory region T2. Subsequently, a first channel material 136 may be conformally formed over the first memory material 134.

In some embodiments, the first memory material 134 may include a ferroelectric material, for example, lead zirconate titanate (PZT), PbZr/TiO$_3$, BaTiO$_3$, PbTiO$_2$, HfO$_2$, Hr$_{1-x}$Zr$_x$O$_2$, ZrO$_2$, TiO$_2$, NiO, TaO$_x$, Cu$_2$O, Nb$_2$O$_5$, AlO$_x$, etc. The first memory material 134 may be formed using PVD, CVD, LPCVD, PECVD, ALD, MBE, any other suitable process or a combination thereof. A conformal coating may be deposited such that the first memory material 134 is continuous on the walls of the first trenches 132a. In some embodiments, the first channel material 136 may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. The first channel material 136 may be formed using PVD, CVD, LPCVD, PECVD, ALD, MBE, any other suitable process or a combination thereof. A conformal coating may be deposited such that the first channel material 136 is continuous on the first trenches 132a.

Figure 14A:
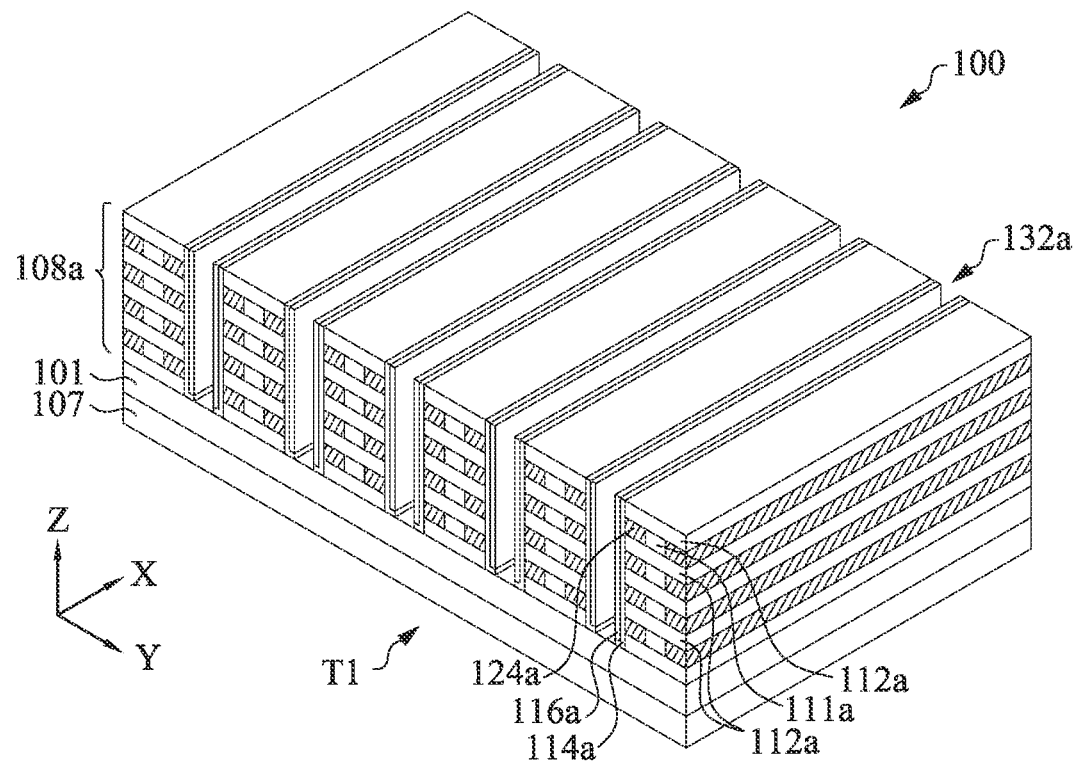
Figure 14B:
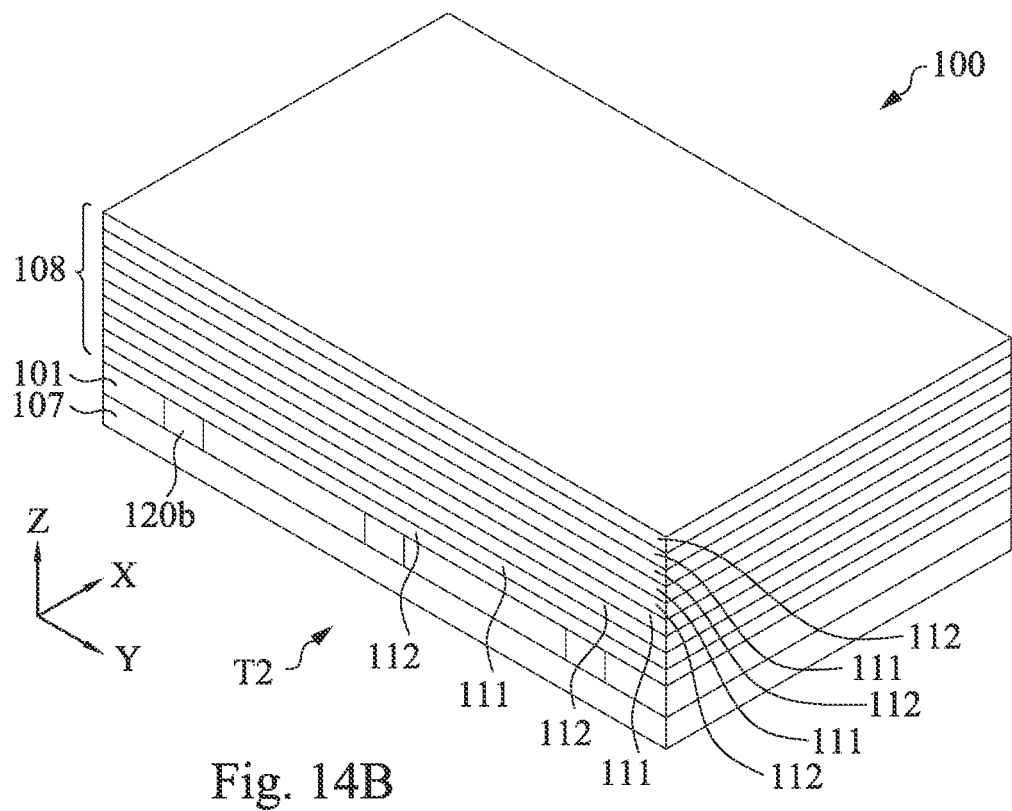
Figure 15A:
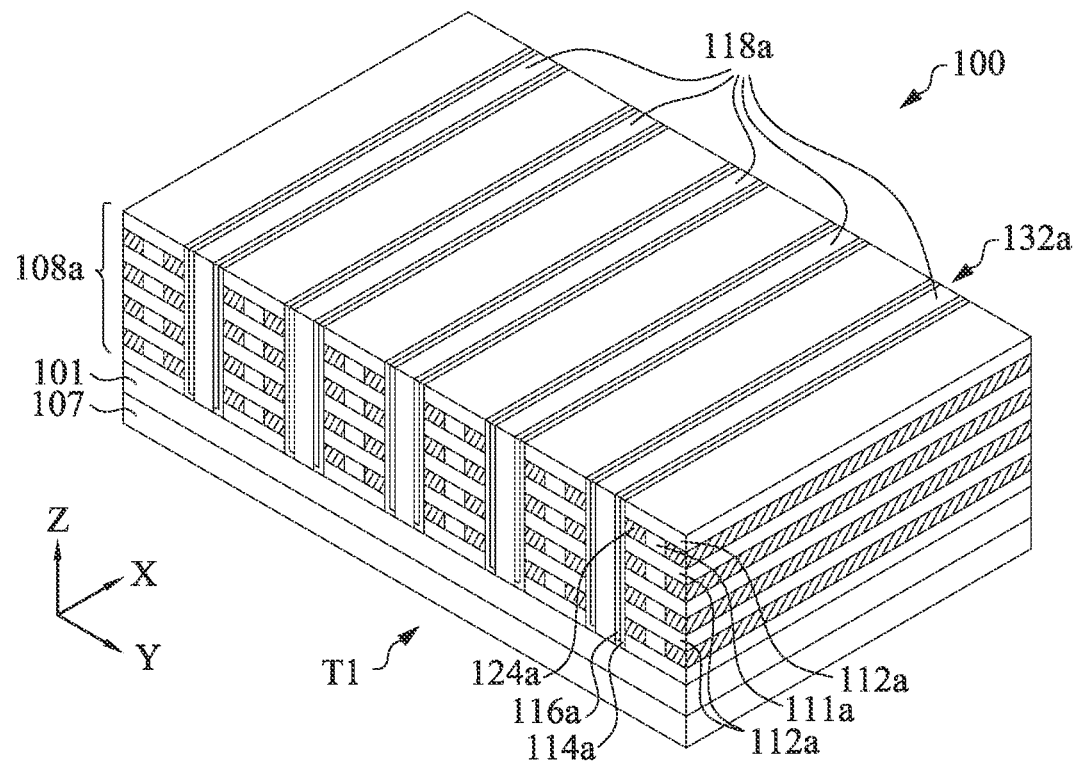
Figure 15B:
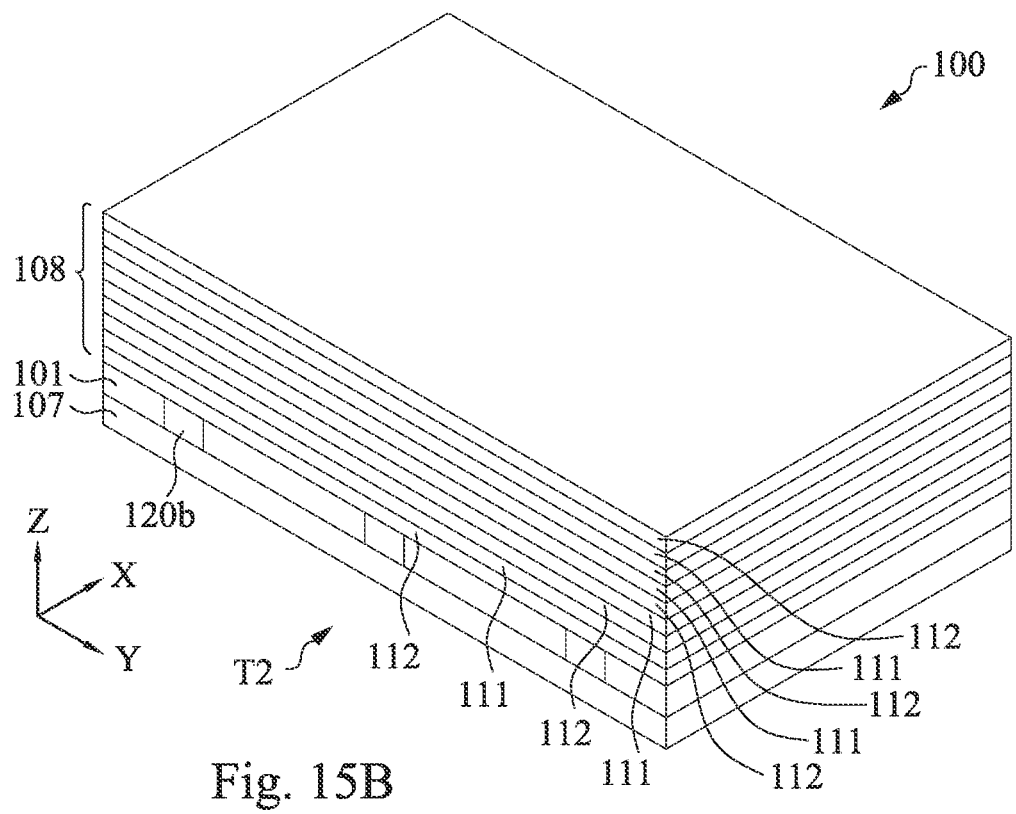
Figure 15C:
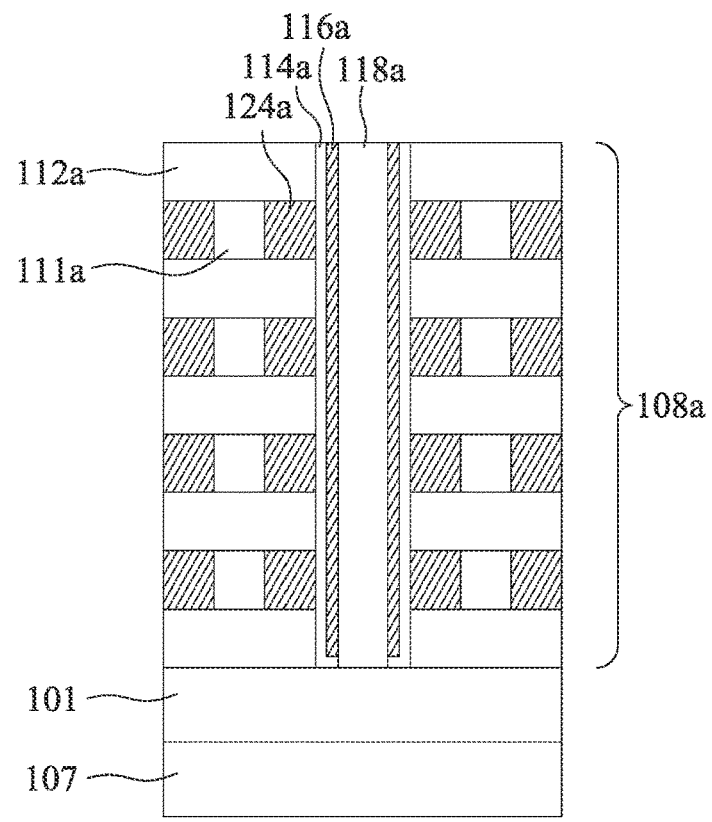
Figure 15D:
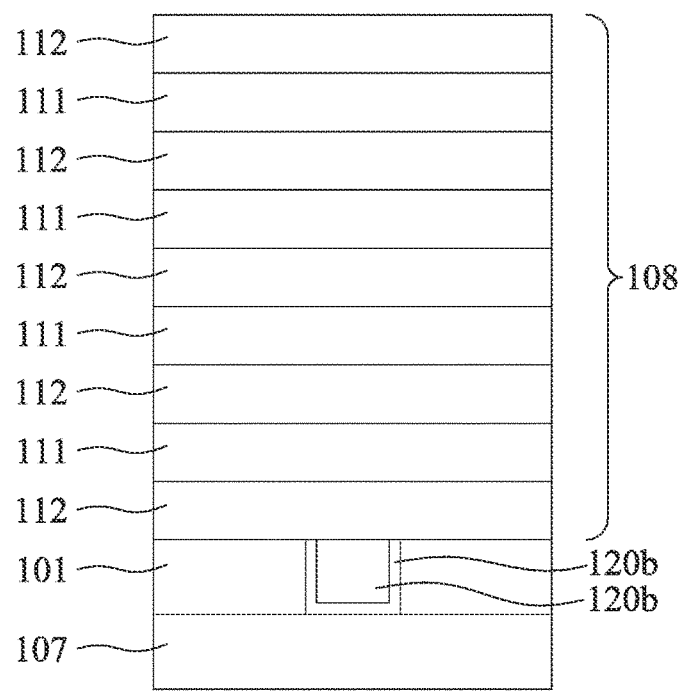

Referring back to FIG. 4B, the method M then proceeds to block S110 where the first memory material and the first channel material are patterned to form a plurality of first memory layers and a plurality of first channel layers on sidewalls of the first trenches within the computing memory region. With reference to FIGS. 14A and 14B, in some embodiments of block S110, the first memory material 134 and the first channel material 136 are patterned to form a plurality of first memory layers 114a and a plurality of first channel layers 116a on sidewalls of the first trenches 132a within the computing three-dimensional memory region T1. This is described in greater detail with reference to FIGS. 14A and 14B, an etching process is performed to remove lateral portions of the first memory material 134 and the first channel material 136 as shown in FIGS. 12A and 12B such that the topmost surface of the first stacked structures 108 within the computing three-dimensional memory region T1 and the topmost surface of the multi-layered stack 108 in the storage three-dimensional memory region T2 are exposed, and remain vertical portions of the first memory material 134 and the first channel material 136 on the sidewalls of the first trenches 132a within the computing three-dimensional memory region T1 to form the first memory layers 114a and the first channel layers 116a. Therefore, the first channel material 136 is broken to form first memory layers 114a lining opposite sidewalls in the trenches 132a which in turn prevents short-circuiting from occurring between conductive lines 120a and 122a (see FIG. 23A) that will be formed in subsequent steps.

The etching process may be, for example, an anisotropic etching process. The etching process may include a single step or multiple steps. In some embodiments, the etching process is a dry etching process. By way of example and not limitation, a dry etching process may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring back to FIG. 4B, the method M then proceeds to block S111 where a plurality of first inner spacers are formed to fill the first trenches within the computing memory region. With reference to FIGS. 15A-15D, in some embodiments of block S111, the first inner spacers 118a are formed to fill the first trenches 132a within the computing three-dimensional memory region T1. An exemplary method of forming the first inner spacers 118a may include depositing a first insulating material over the computing three-dimensional memory region T1 and the storage three-dimensional memory region T2 and fills in the first trenches 132a. Subsequently, a CMP process is performed to remove excessive insulating material outside the first trenches 132a until the topmost surface of the first stacked structures 108 within the computing three-dimensional memory region T1 and the topmost surface of the multi-layered stack 108 in the storage three-dimensional memory region T2 are exposed, and a remainder of the insulating material in the first trenches 132a serves as the first inner spacers 118a. The insulating material may be deposited in the first trenches 132a to form the first isolation layers 140a using any suitable method, for example, MBD, ALD, CVD, PECVD, MOCVD, epitaxial growth, and the like. The first inner spacers 118a may include $SiO_2$, SiON, SiN, SiCN, $HfO_2$, $TaO_x$, $TiO_x$, $AlO_x$, etc. In some embodiments, the first inner spacers 118a may be formed from the same material of the first insulating layers 112a.

Figure 16A:
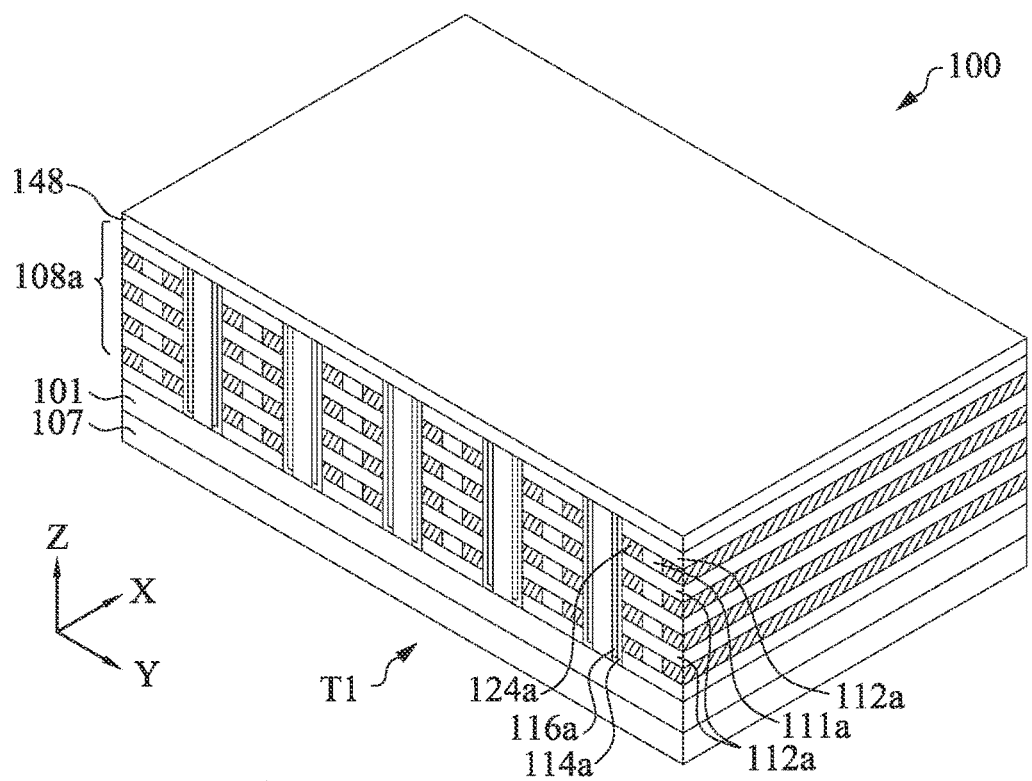
Figure 16B:
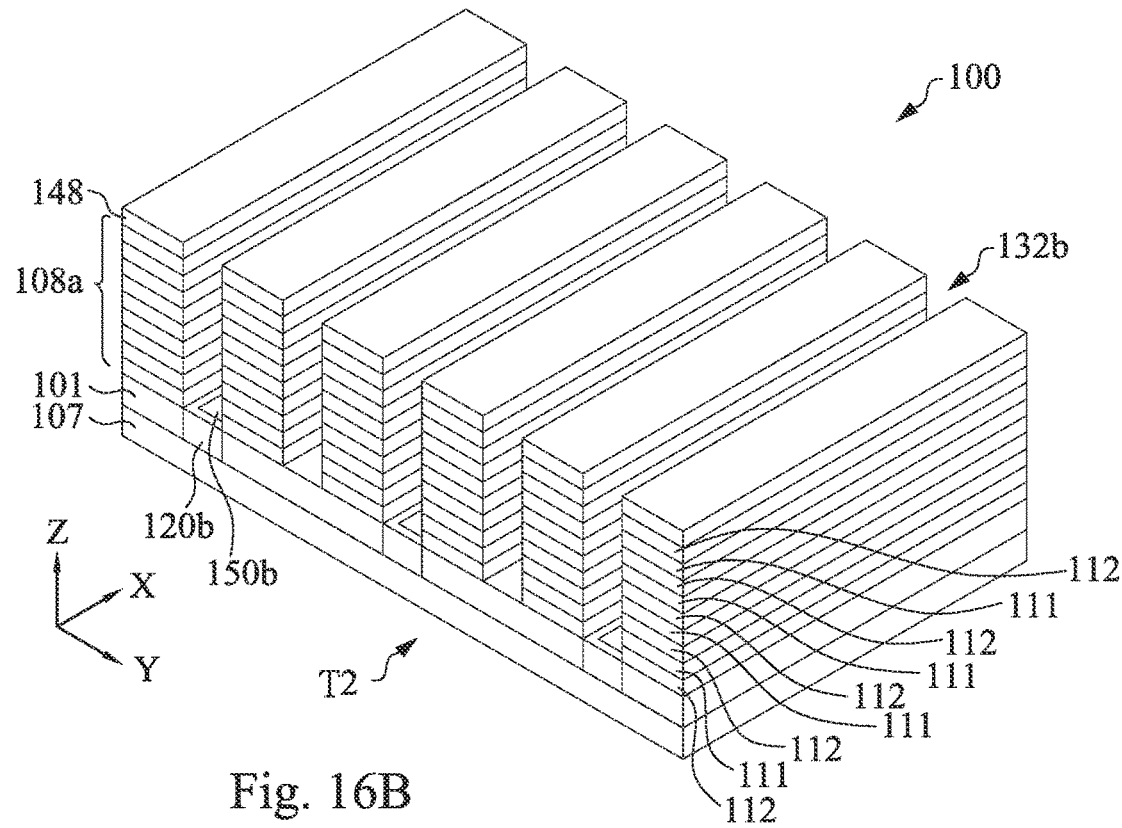

Referring back to FIG. 4B, the method M then proceeds to block S112 where a plurality of second trenches are formed through the stack within the storage memory region to form a plurality of second stacked structures while remains the first stacked structure, the first memory layers, the first channel layers, and the first inner spacers within the computing memory region not to be etched. With reference to FIGS. 16A and 16B, in some embodiments of block S112, a plurality of second trenches 132b extending in the first direction (e.g., the X-direction) are formed through the multi-layered stack 108 within the storage three-dimensional memory region T2 from the topmost insulating layer 112 to the etch stop layer 101 to form second stacked structures 108b while remains the stacked structure 108a within the computing three-dimensional memory region T1 not to be etched.

A patterned hard mask layer 148 may be formed on the computing three-dimensional memory region T1 and the storage three-dimensional memory region T2. In some embodiments, the patterned hard mask layer 148 may be formed by patterning a hard mask material using a combination of photolithography and etching. For example, a hard mask material may be deposited over the storage three-dimensional memory region T1 as shown in FIG. 16A and the storage three-dimensional memory region T2 as shown in FIG. 16B. The hard mask material can be formed by using, such as a spin-on technique. Subsequently, the hard mask material may be patterned to form the patterned mask layer 148 to define the second trenches 132b (see FIG. 16B) on the multi-layered stack 108 in the storage three-dimensional memory region T2. As shown in FIGS. 16A and 16B, the patterned hard mask layer 148 in the storage three-dimensional memory region T2 has a strip pattern, but the patterned hard mask layer 148 in the computing three-dimensional memory region T1 is free of the strip pattern. In other words, the stacked structure 108a in the computing three-dimensional memory region T1 is entirely covered by a first side of the patterned hard mask layer 148 without having any strip pattern thereon, and the multi-layered stack 108 in the storage three-dimensional memory region T2 is partially exposed through a second side of the patterned hard mask layer 148 with the strip pattern thereon.

Subsequently, the multi-layered stack 108 in the storage three-dimensional memory region T2 is etched through the second side of the patterned hard mask layer 148 with the strip pattern thereon to form the second trenches 132b to form second stacked structures 108b (see FIG. 16A), but remains the stacked structure 108a in the computing three-dimensional memory region T1 not to be etched (see FIG. 10B) and covered by the first side of the patterned hard mask layer 148 without the strip pattern thereon. A pattern of the second trenches 132b may correspond to the strip pattern on the patterned hard mask layer 148. In some embodiments, the multi-layered stack 108 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 132b. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In some embodiments, after the second trenches 132b are formed, the patterned hard mask layer 148 is subsequently stripped, such as by wet stripping or plasma ashing.

Figure 17A:
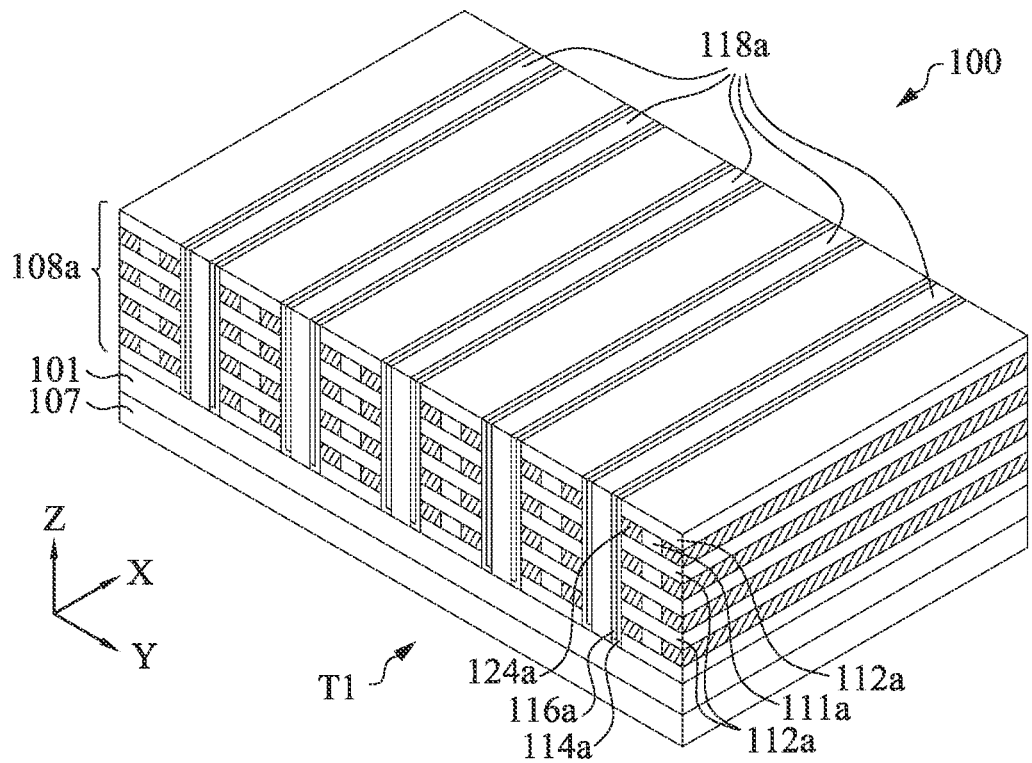
Figure 17B:
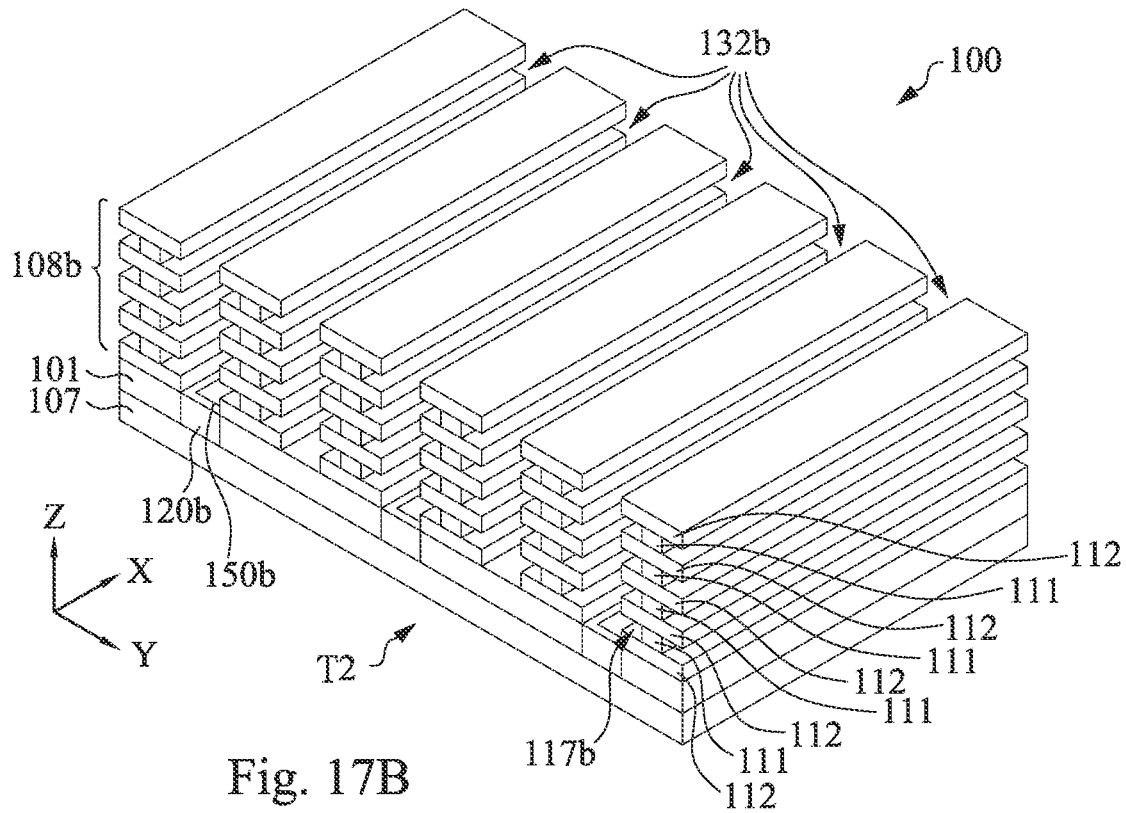

Referring back to FIG. 4B, the method M then proceeds to block S113 where exposed surfaces of the spacer layers within the second trenches are partially etched so as to reduce widths of the spacer layers relative to the insulating layers to form second cavities in the second stacked structures. With reference to FIGS. 17A and 17B, in some embodiments of block S113, exposed surfaces of the spacer layers 111 extending along the X-direction within the first trenches 132b are partially etched so as to reduce widths of the spacer layers relative to the insulating layers 112 in the Y-direction on either side of the spacer layers 111, such that cavities 117b in the second stacked structures 108b are formed whose boundaries are formed by top and bottom surfaces of adjacent insulating layers 112 and a surface of the partially etched spacer layers 111 that face the first trenches 132b and extend along the X-direction.

In some embodiments, the spacer layers 111 may be etched using a wet etch process (e.g., hydrofluoric etch, buffered hydrofluoric acid, phosphoric acid, etc.). In some embodiments, the exposed surfaces of the spacer layers 111 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 18A:
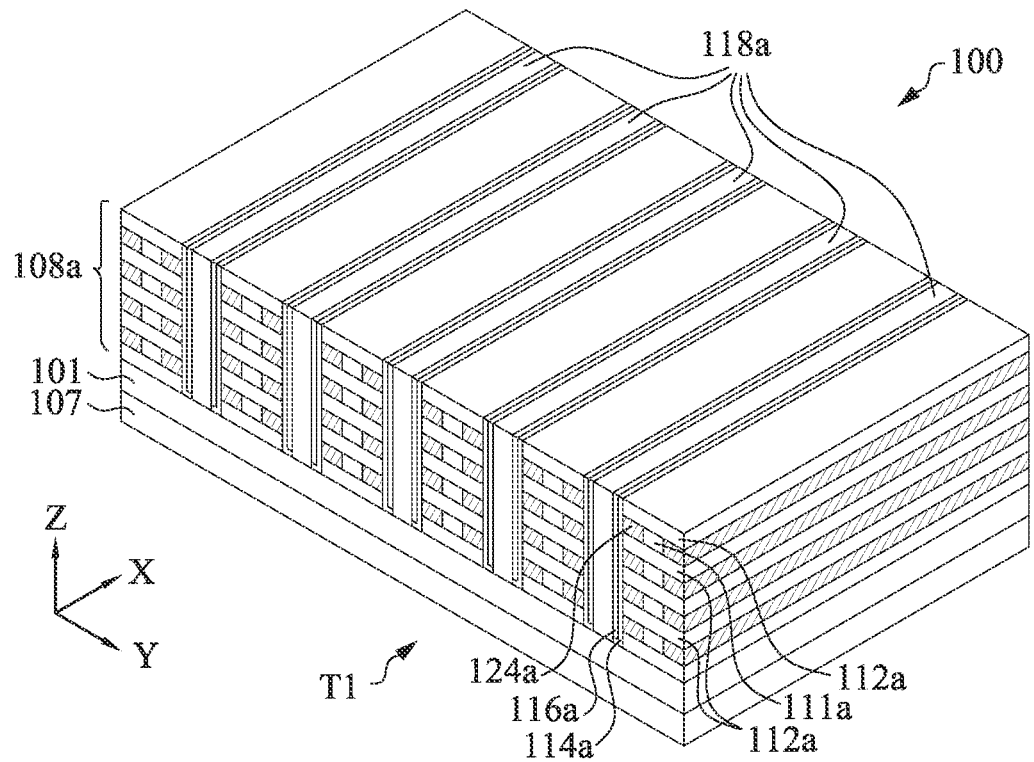
Figure 18B:
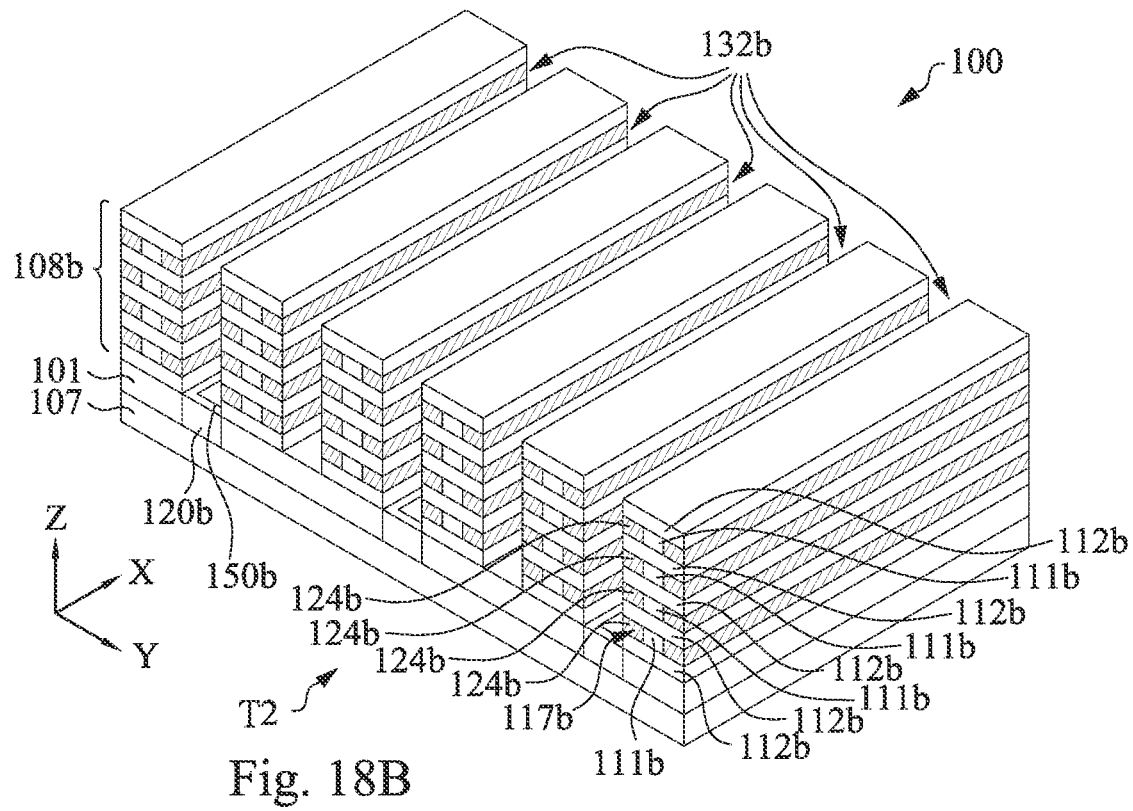

Referring back to FIG. 4B, the method M then proceeds to block S114 where a plurality of second gate layers are formed in the second cavities of the second stacked structures. With reference to FIGS. 18A and 18B, in some embodiments of block S114, a second gate metal layer may be deposited over the computing three-dimensional memory region T1 and the storage three-dimensional memory region T2. Subsequently, an etching back process may be performed on the second gate metal layer to form second gate layers 124b in the cavities 117b of the second stacked structures 108b. This is described in greater detail with reference to FIGS. 18A and 18B, the second gate metal layer may be etched back to expose sidewalls of the second insulating layers 112b within the second trenches 132b (see FIG. 18A) and a topmost surface of the stacked structure 108a and 108b within the computing three-dimensional memory region T1 and the storage three-dimensional memory region T2 (see FIGS. 18A and 18B). Therefore, the remaining second gate metal layer fills the cavities 117b in the second stacked structures 108b and serves as the second gate layer 124b as shown in FIG. 16A. In other words, the second gate layers 124b may be covered by sidewalls of the spacer layers 111b and top and/or bottom surfaces of the insulating layers 112b. Although, each of the second gate layers 124b shown in FIG. 16A is shown as a single layer, In some embodiments, each of the second gate layers 124b can be formed as a multi-layer stack (e.g., including a second gate dielectric layer and a second gate metal layer), while remaining within the scope of the present disclosure.

The etch back of the second gate metal layer to form the first gate layers 124b may be performed with an acceptable process such as a wet etch or a dry etch. In some embodiments, the second gate metal layer may be etched back with a wet etch using KOH, $NH_4OH$, $H_2O_2$, the like, or a combination thereof. In some embodiments, the second gate metal layer may be recessed with a dry etch using $NH_3$, $NF_3$, HF, the like, or a combination thereof. In some embodiments, a planarization such as a CMP is performed to remove excess portions of the second gate metal layer remaining over top surfaces of the stacked structures 108a and 108b.

In some embodiments, the second gate layer 124b may include a stack of multiple metal materials. In some embodiments, the second gate layer 124b may include a p-type workfunction layer, an n-type workfunction layer, multi-layers thereof, or combinations thereof. The workfunction layer may also be referred to as a workfunction metal. Example p-type workfunction metals that may include TiN, TaN, Ru, Mo, Al, WN, $ZrSi_2$, $MoSi_2$, $TaSi_2$, $NiSi_2$, WN, other suitable p-type workfunction materials, or combinations thereof. Example n-type workfunction metals that may include Ti, Ag, TaAl, TaAlC, TiAlN, TaC, TaCN, TaSiN, Mn, Zr, other suitable n-type workfunction materials, or combinations thereof. A workfunction value is associated with the material composition of the workfunction layer, and thus, the material of the workfunction layer is chosen to tune its workfunction value so that a target threshold voltage $V_t$ is achieved in the device that is to be formed. The second gate metal layer may be deposited by CVD, PVD, ALD, and/or other suitable process.

Figure 19A:
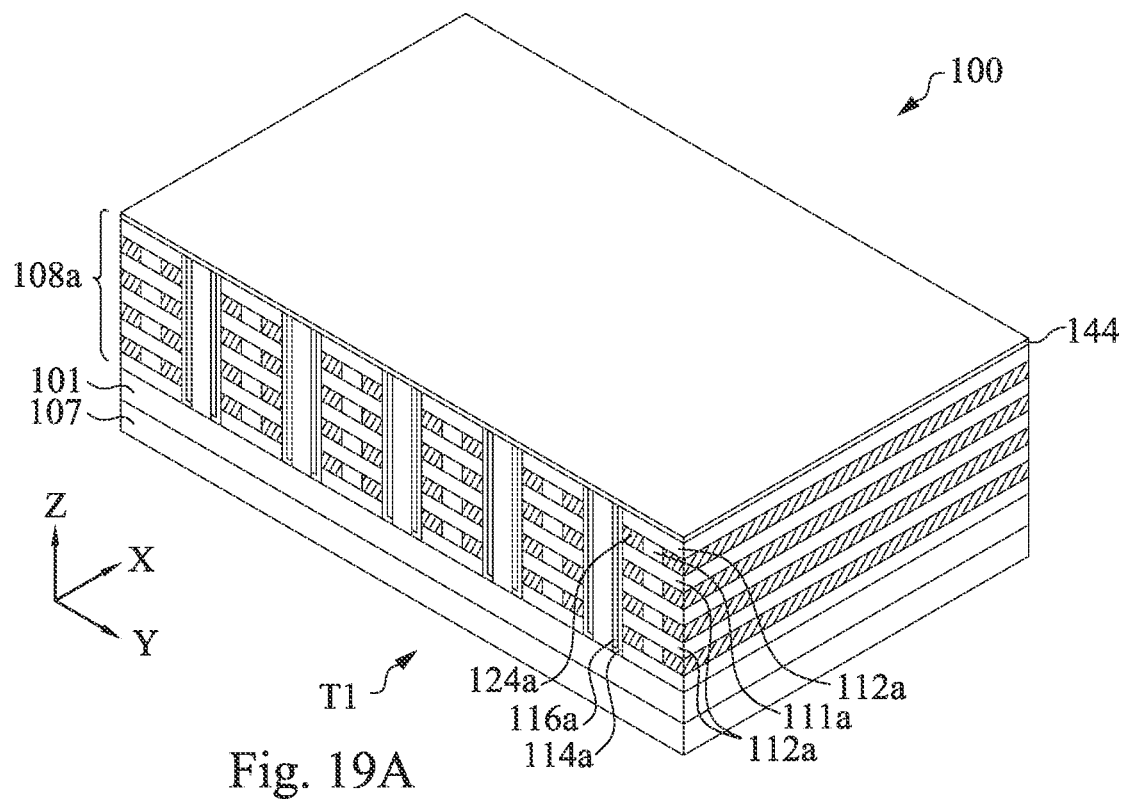
Figure 19B:
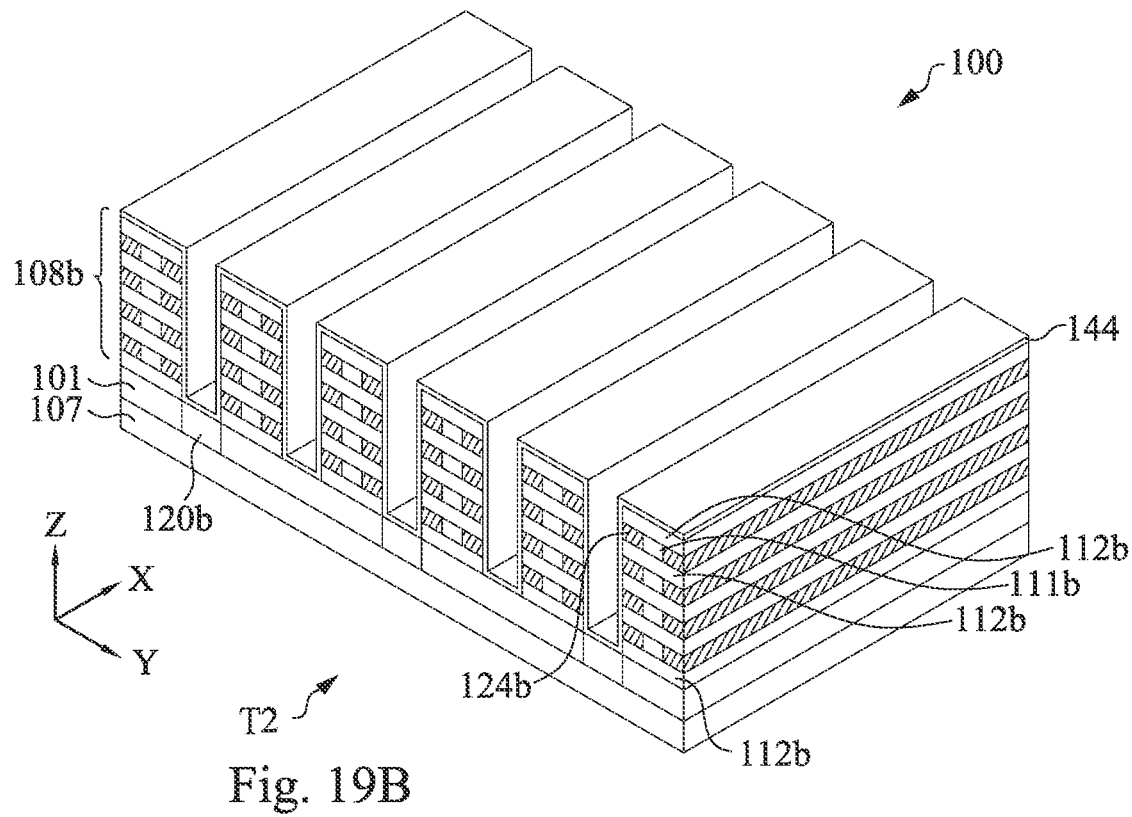

Referring back to FIG. 4B, the method M then proceeds to block S115 where a second memory material is conformally formed over the computing memory region and the storage memory region. With reference to FIGS. 19A and 19B, in some embodiments of block S115, a second memory material 144 may be conformally formed over the computing three-dimensional memory region T1 and the storage three-dimensional memory region T2. In some embodiments, the second memory material 144 may include a ferroelectric material, for example, lead zirconate titanate (PZT), $PbZr/TiO_3$, $BaTiO_3$, $PbTiO_2$, $HfO_2$, $Hr_1\text{-}xZr_xO_2$, $ZrO_2$, $TiO_2$, NiO, $TaO_x$, $Cu_2O$, $Nb_2O_5$, $AlO_x$, etc. The second memory material 144 may be formed using PVD, CVD, LPCVD, PECVD, ALD, MBE, any other suitable process or a combination thereof. A conformal coating may be deposited such that the second memory material 144 is continuous on the walls of the second trenches 132b. In some embodiments, the second memory material 144 within the storage three-dimensional memory region T2 may have a same material as the first memory material 134 within the storage three-dimensional memory region T1. In some embodiments, the second memory material 144 within the storage three-dimensional memory region T2 may have a different material than the memory layer 114a within the storage three-dimensional memory region T1.

Referring back to FIG. 4B, the method M then proceeds to block S116 where the second memory material is patterned to form a plurality of second memory layers on sidewalls of the second trenches within the storage memory region. With reference to FIGS. 20A and 20B, in some embodiments of block S116, the second channel material 146 are patterned to form a plurality of second channel layers 116b on sidewalls of the second trenches 132b within the storage three-dimensional memory region T2. This is described in greater detail with reference to FIGS. 20A and 20B, an etching process is performed to remove lateral portions of the second memory material 144 as shown in FIGS. 20A and 20B such that the topmost surfaces of the stacked structures 108a and 108b within the computing three-dimensional memory region T1 and the storage three-dimensional memory region T2 are exposed, and remain vertical portions of the second memory material 144 on the sidewalls of the first trenches 132b within the storage three-dimensional memory region T2 to form the second memory layers 114b.

The etching process may be, for example, an anisotropic etching process. The etching process may include a single step or multiple steps. In some embodiments, the etching process is a dry etching process. By way of example and not limitation, a dry etching process may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring back to FIG. 4B, the method M then proceeds to block S117 where a plurality of second channel layers and a plurality of second inner spacers are formed in the second trenches and over the second memory layers within the storage memory region. With reference to FIGS. 21A-21D, in some embodiments of block S117, second channel layers 116b and second inner spacers 118b are formed in the second trenches 132b within the storage three-dimensional memory region T2. An exemplary method of forming the second channel layers 116b and second inner spacers 118b may include conformally depositing a second channel material over the computing three-dimensional memory region T1 and the storage three-dimensional memory region T2, and depositing a second insulating material over the second channel material and fills in the second trenches 132b. Subsequently, a CMP process is performed to remove excessive second channel material and insulating material outside the second trenches 132b until the topmost surface of the stacked structures 108a and 108b within the computing three-dimensional memory region T1 and the storage three-dimensional memory region T2 are exposed, and remainders of the second channel material and insulating material in the second trenches 132b serve as the second channel layers 116b and the second inner spacers 118b. As shown in FIG. 21D, the second channel layer 116b has a U-shaped cross section and in contact with the conductive line 120b.

In some embodiments, the second channel layer 116b may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. The second channel layer 116b may be formed using PVD, CVD, LPCVD, PECVD, ALD, MBE, any other suitable process or a combination thereof. A conformal coating may be deposited such that the second channel layer 116b is continuous on the second trenches 132b. In some embodiments, the second channel layer 116b within the storage three-dimensional memory region T2 may have a same material as the first channel layer 116a within the storage three-dimensional memory region T1. In some embodiments, the second channel layer 116b within the storage three-dimensional memory region T2 may have a different material than the first channel layer 116a within the storage three-dimensional memory region T1. The second insulating material may be deposited in the second trenches 132b to form the second inner spacers 118b using any suitable method, for example, MBD, ALD, CVD, PECVD, MOCVD, epitaxial growth, and the second like. The inner spacers 118b may include $SiO_2$, SiON, SiN, SiCN, $HfO_2$, $TaO_x$, $TiO_x$, $AlO_x$, etc. In some embodiments, the second inner spacers 118b may be formed from the same material of the second insulating layers 112b.

Referring back to FIG. 4B, the method M then proceeds to block S118 where the first and second channel layers and the first and second inner spacers within the computing memory region and the storage memory region are etched and cut into multiple discrete sections while remains the first and second memory layers not to be etched. With reference to FIGS. 22A-22D, in some embodiments of block S118, the first channel layers 116a and the first inner spacers 118a within the computing three-dimensional memory region T1 are etched from the top surface of the stacked structure 108a down to the etch stop layer 101 to form cavities 128a and cut into multiple sections. The second channel layers 116b and the second inner spacers 118b within the storage three-dimensional memory region T2 are etched from the stacked structure 108b down to the etch stop layer 101 to form cavities 128b and cut into multiple sections. The remaining first channel layers 116a within the computing three-dimensional memory region T1 are co-extensive with the remaining first inner spacers 118a, and the remaining second channel layers 116b within the storage three-dimensional memory region T2 are co-extensive with the remaining second inner spacers 118b.

In some embodiments, the first and second channel layers 116a and 116b and the first and second inner spacers 118a and 118b may be etched simultaneously or sequentially, using a dry etch, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Referring back to FIG. 4C, the method M then proceeds to block S119 where a plurality of first device spacers are formed to interpose between the discrete first channel layers and between the discrete first inner spacers and a plurality of second device spacers are formed to interpose between the discrete second channel layers and between the discrete second inner spacers. With reference to FIGS. 22A-22D, in some embodiments of block S119, first device spacers 113a are formed to interpose between the discrete first channel layers 116a and between the discrete first inner spacers 118a and second device spacers 113b are formed to interpose between the discrete second channel layers 116b and between the discrete second inner spacers 118b. The first device spacers 113a disposed at regular intervals separating adjacent semiconductor devices 110a that will be formed in subsequent steps in the semiconductor die 100 within the computing three-dimensional memory region T1. The second device spacers 113b disposed at regular intervals separating adjacent semiconductor devices 110b that will be formed in subsequent steps in the semiconductor die 100 within the storage three-dimensional memory region T2.

An exemplary method of forming the first and second device spacers 113a and 113b may include depositing an insulating material over the stacked structures 108a and 108b within the computing three-dimensional memory region T1 and the storage three-dimensional memory region T2 to fill the cavities 128a and 128b. In some embodiments, the insulating material may be formed by using, for example, MBD, ALD, CVD, PECVD, MOCVD, epitaxial growth, and the like. Subsequently, a planarized process (e.g., a CMP, etch back, or the like) is performed to remove excess portions of the insulating material over the stacked structures 108a and 108b until the stacked structures 108a and 108b are exposed. The remaining insulating material filling the cavities 128a and 128b can be served as the first and second device spacers 113a and 113b. In some embodiments, the first and/or second device spacers 113a and/or 113b may be made of an electrically insulating material, for example, silicon nitride (SiN), silicon oxide (SiO), $SiO_2$, silicon carbide nitride (SiCN), silicon oxycarbonitride (SiOCN), silicon oxynitride (SiON), $HfO_2$, $TaO_x$, $TiO_x$, $AlO_x$, etc.

Figure 23A:
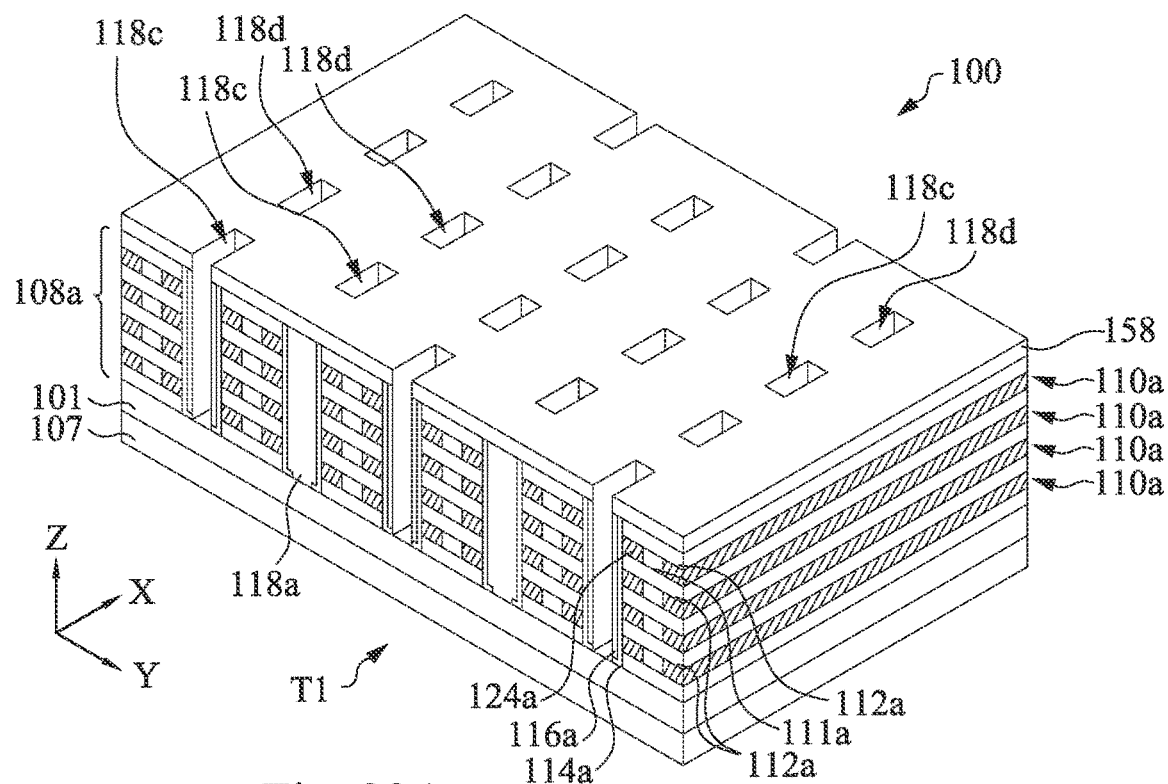
Figure 23B:
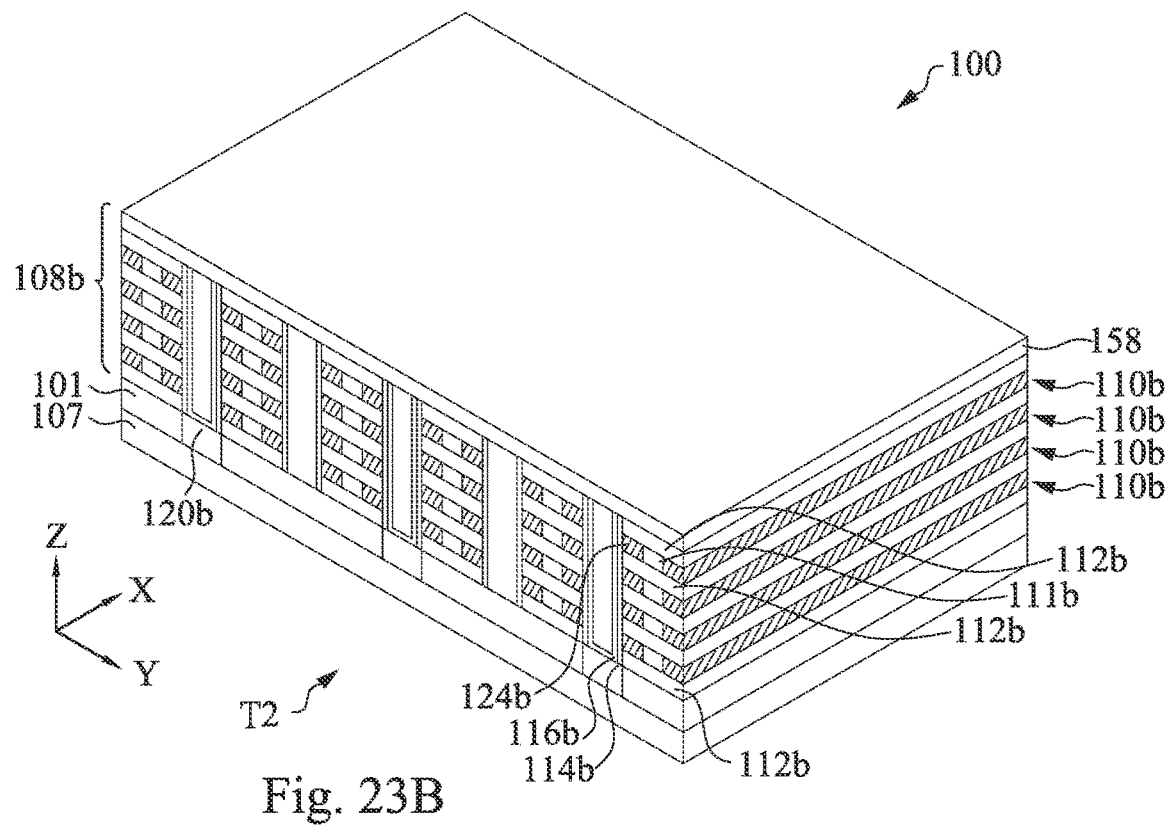

Referring back to FIG. 4C, the method M then proceeds to block S120 where a plurality of second and third conductive line trenches are formed through the first inner spacers within the computing memory region. With reference to FIGS. 23A and 23B, in some embodiments of block S120, a plurality of conductive line trenches 118c and 118d are formed through the first inner spacers 118a within the computing three-dimensional memory region T1 from the top surface of the stacked structure 108a to the etch stop layer 101 for forming a conductive line 120a and a conductive line 122a (see FIGS. 24A and 24C) that will be formed in subsequent steps in the semiconductor die 100 while remains the storage three-dimensional memory region T2 not to be etched.

A patterned hard mask layer 158 may be formed over the computing three-dimensional memory region T1 as shown in FIG. 23A and over the storage three-dimensional memory region T2 as shown in FIG. 23B. In some embodiments, the patterned hard mask layer 158 may be formed by patterning a hard mask material using a combination of photolithography and etching. For example, a hard mask material may be deposited over the computing three-dimensional memory region T1 and the storage three-dimensional memory region T2. The hard mask material can be formed by using, such as a spin-on technique. Subsequently, the hard mask material may be patterned to form the patterned mask layer 158 to define the conductive line trenches 118c and 118d (see FIG. 23A) on the first inner spacers 118a in the computing three-dimensional memory region T1. As shown in FIGS. 23A and 23B, the patterned hard mask layer 158 in the computing three-dimensional memory region T1 has a strip pattern, but the patterned hard mask layer 158 in the storage three-dimensional memory region T2 is free of the strip pattern. In other words, the first inner spacers 118a in the computing three-dimensional memory region T1 is partially exposed through a first side of the patterned hard mask layer 158 with the strip pattern thereon, and the first inner spacers 118a in the storage three-dimensional memory region T2 is entirely covered by a second side of the patterned hard mask layer 158 without having any strip pattern thereon.

Subsequently, the first inner spacers 118a in the computing three-dimensional memory region T1 is etched through the first side of the patterned hard mask layer 158 with the strip pattern thereon to form the conductive line trenches 118c and 118d (see FIG. 23A), but remains the second inner spacers 118b in the storage three-dimensional memory region T2 covered by the second side of the patterned hard mask layer 158 without the strip pattern thereon and not to be etched (see FIG. 23B). A pattern of the conductive line trenches 118c and 118d may correspond to the strip pattern on the patterned hard mask layer 158. In some embodiments, the first inner spacers 118a may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the conductive line trenches 118c and 118d. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In some embodiments, after the conductive line trenches 118c and 118d are formed, the patterned hard mask layer 158 is subsequently stripped, such as by wet stripping or plasma ashing.

Figure 24A:
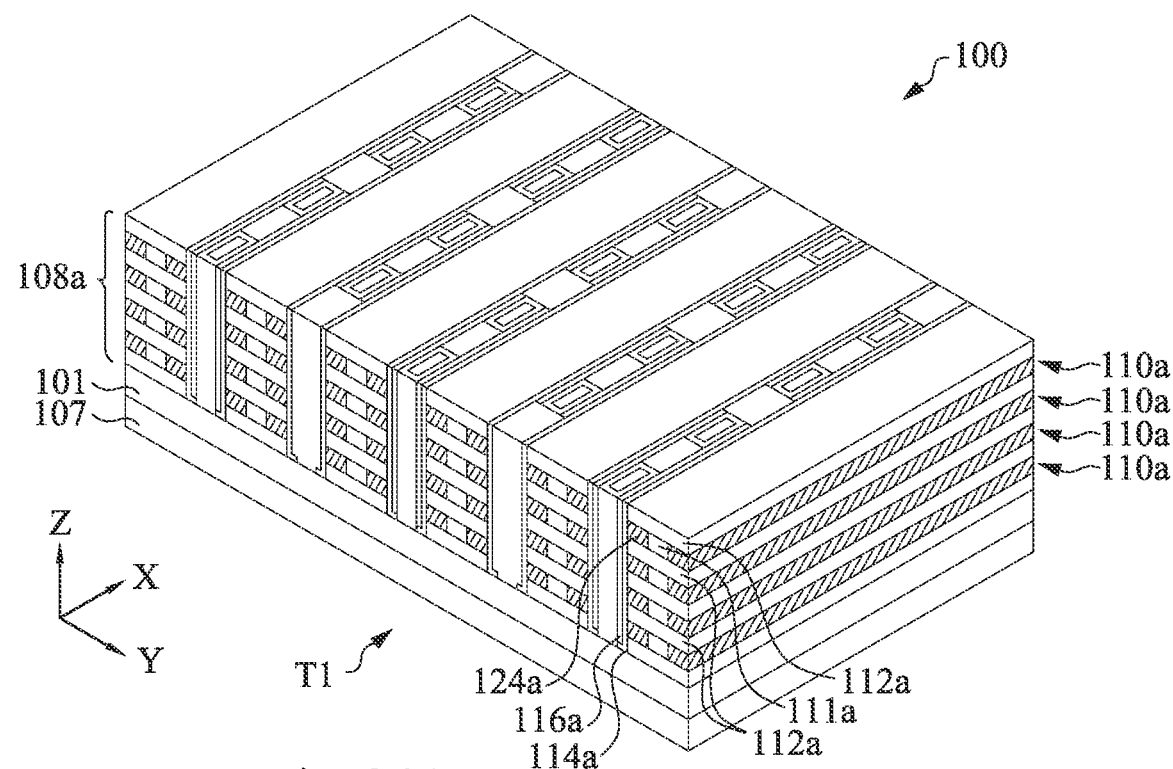
Figure 24B:
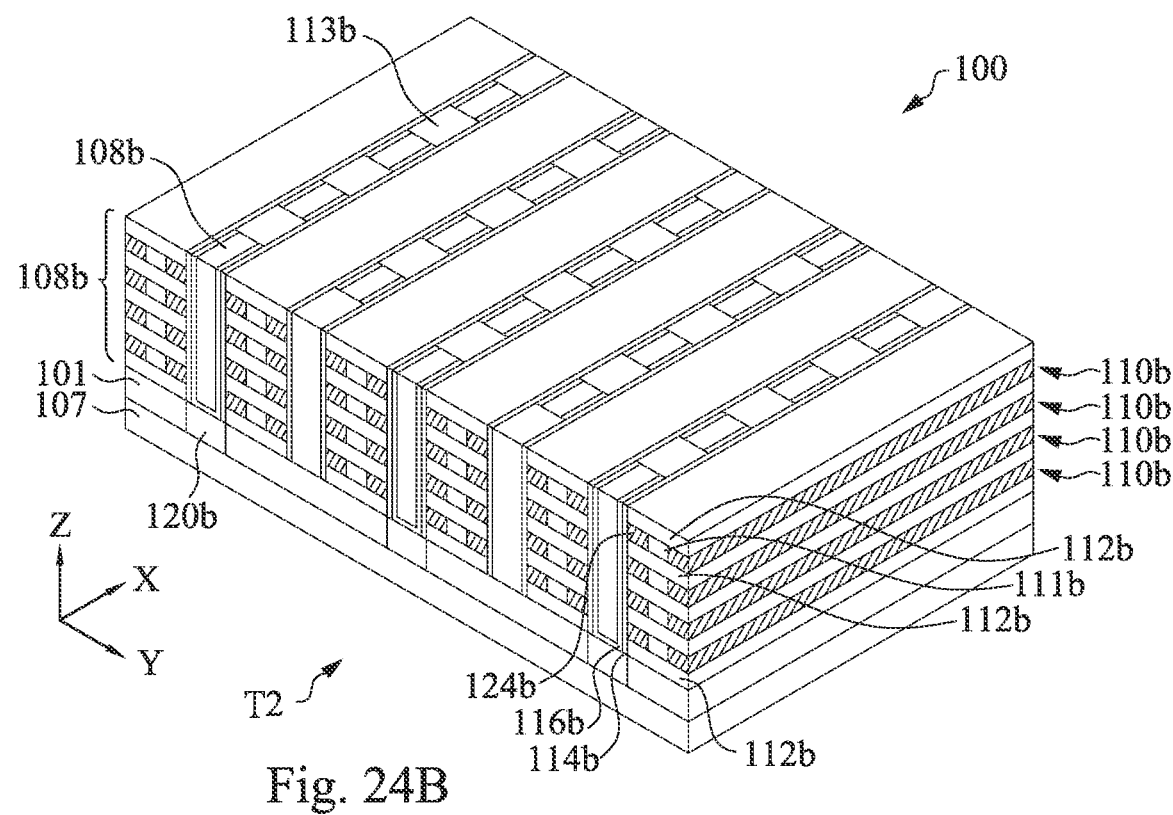
Figure 24C:
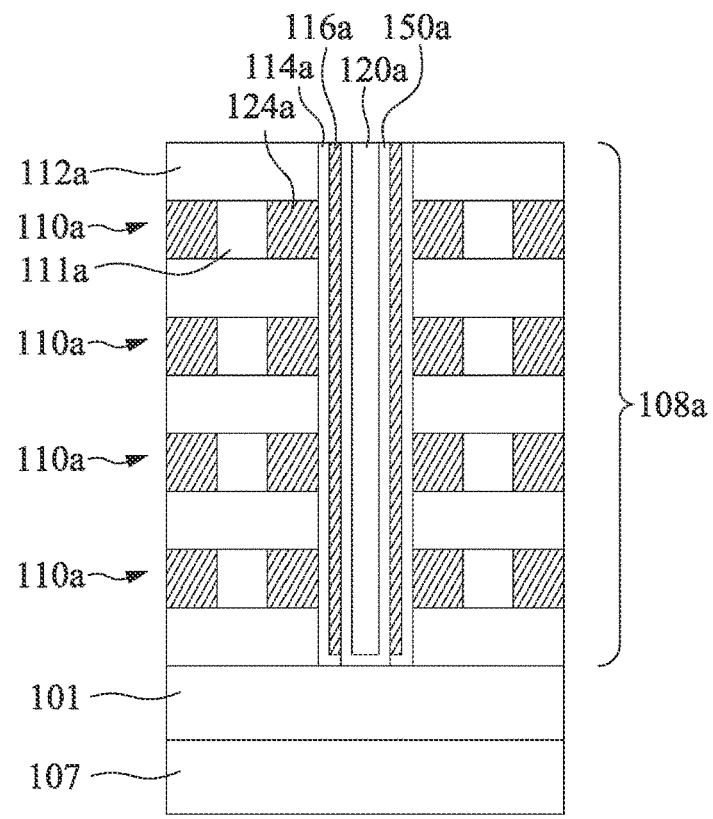
Figure 24D:
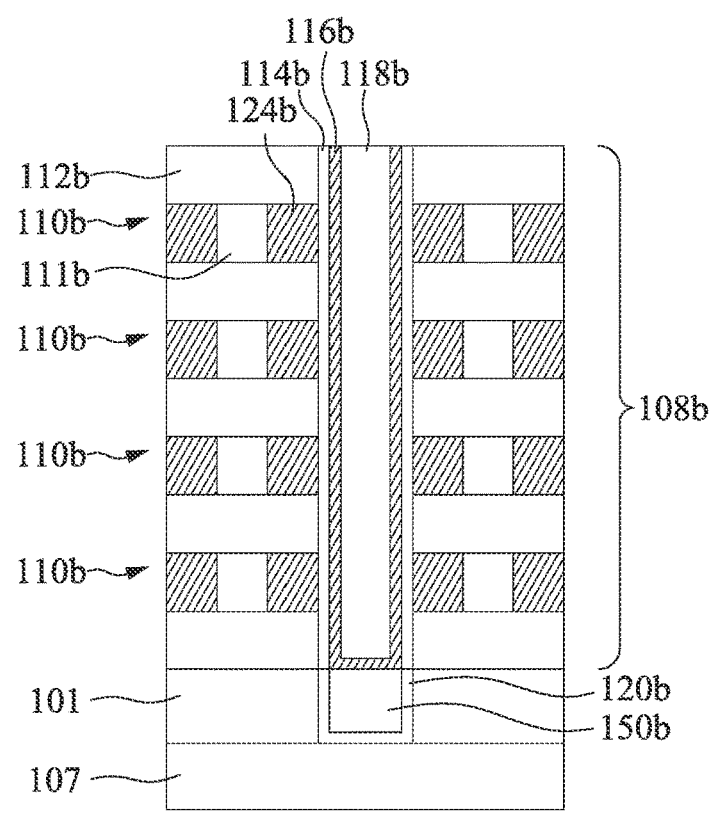

Referring back to FIG. 4C, the method M then proceeds to block S121 where the second and third conductive line trenches are filled with a first reduced parasitic RC material and a second conductive material to form a plurality of second and third conductive lines of computing memory devices that will be electrically coupled to respective source and bit lines subsequently formed. With reference to FIGS. 24A and 24B, in some embodiments of block S121, a first reduced parasitic RC material is comformally formed over the computing three-dimensional memory region T1 and the storage three-dimensional memory region T2 and in the conductive line trenches 118c and 118d. In some embodiments, the first reduced parasitic RC material may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the first reduced parasitic RC material may include a semiconductor material, for example, an n or p-doped semiconductor such as Si, SiGe, or any other semiconductor material (e.g., IGZO, ITO, IZO, ZnO, IWO, poly silicon, amorphous Si, etc.). In some embodiments, the first reduced parasitic RC material may be formed by using, for example, CVD, ALD, PVD, PECVD, or the like.

Subsequently, a first conductive material is deposited over the first reduced parasitic RC material within the computing three-dimensional memory region T1 and the storage three-dimensional memory region T2. In some embodiments, the first conductive material may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the first conductive material may include a semiconductor material, for example, an n or p-doped semiconductor such as Si, SiGe, or any other semiconductor material (e.g., IGZO, ITO, IZO, ZnO, IWO, poly silicon, amorphous Si, etc.), and may be formed using a deposition process, an epitaxial growth process, or any other suitable process. In some embodiments, the first conductive material may be formed by using, for example, CVD, ALD, PVD, PECVD, or the like.

Subsequently, a planarized process (e.g., a CMP, etch back, or the like) is performed to remove excess portions of the first reduced parasitic RC material and the first conductive material over the stacked structures 108a and 108b until the stacked structures 108a and 108b are exposed. The remaining first reduced parasitic RC material and the first conductive material fill the conductive line trenches 118c and 118d in the first inner spacers 118a and from the conductive lines 120a, the reduced parasitic RC layers 150a cupping undersides of the conductive lines 120a, the conductive lines 122a, and the reduced parasitic RC layers 152a cupping undersides of the conductive lines 122a as shown in FIG. 24A and can be electrically coupled to respective global source lines and bit lines. In some embodiments, the conductive lines 120a can be interchangeably referred to as conductive source lines, and the conductive lines 122b can be interchangeably referred to as conductive bit lines. In some embodiments, the conductive lines 120a can be electrically coupled to respective global bit lines and can be interchangeably referred to as conductive bit lines, and the conductive lines 122b can be electrically coupled to respective global source lines can be interchangeably referred to as conductive source lines.

Figure 25A:
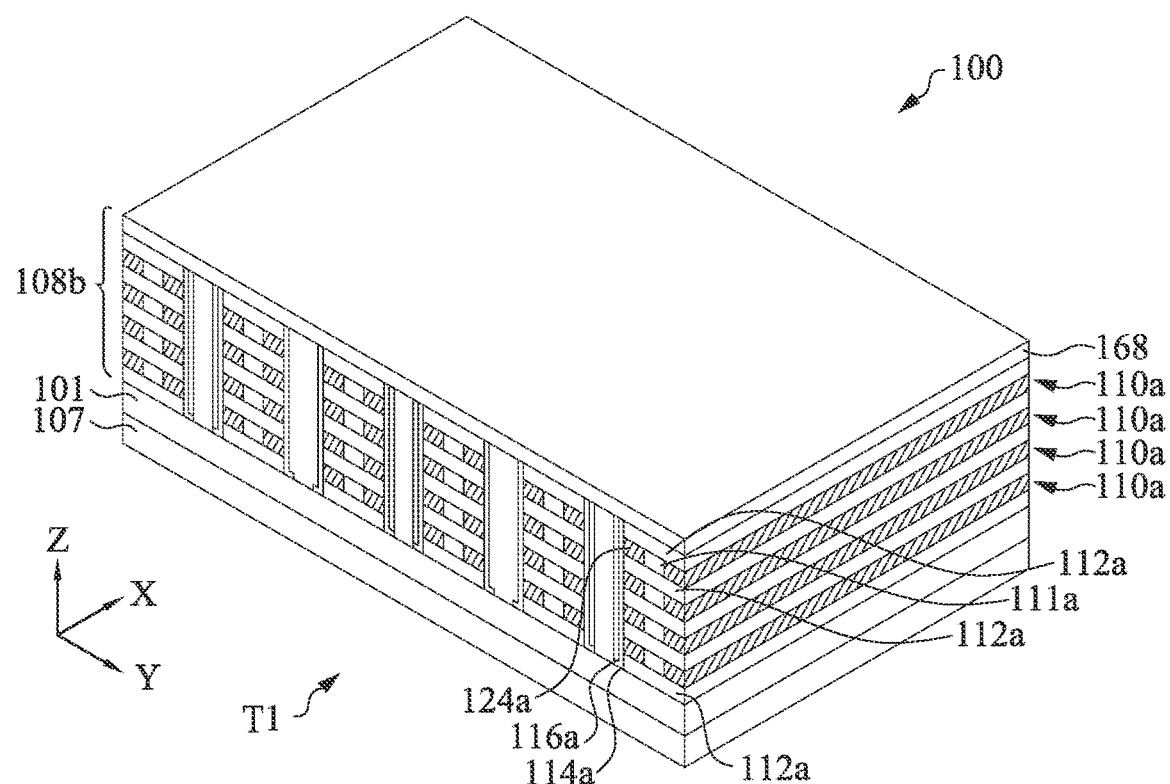
Figure 25B:
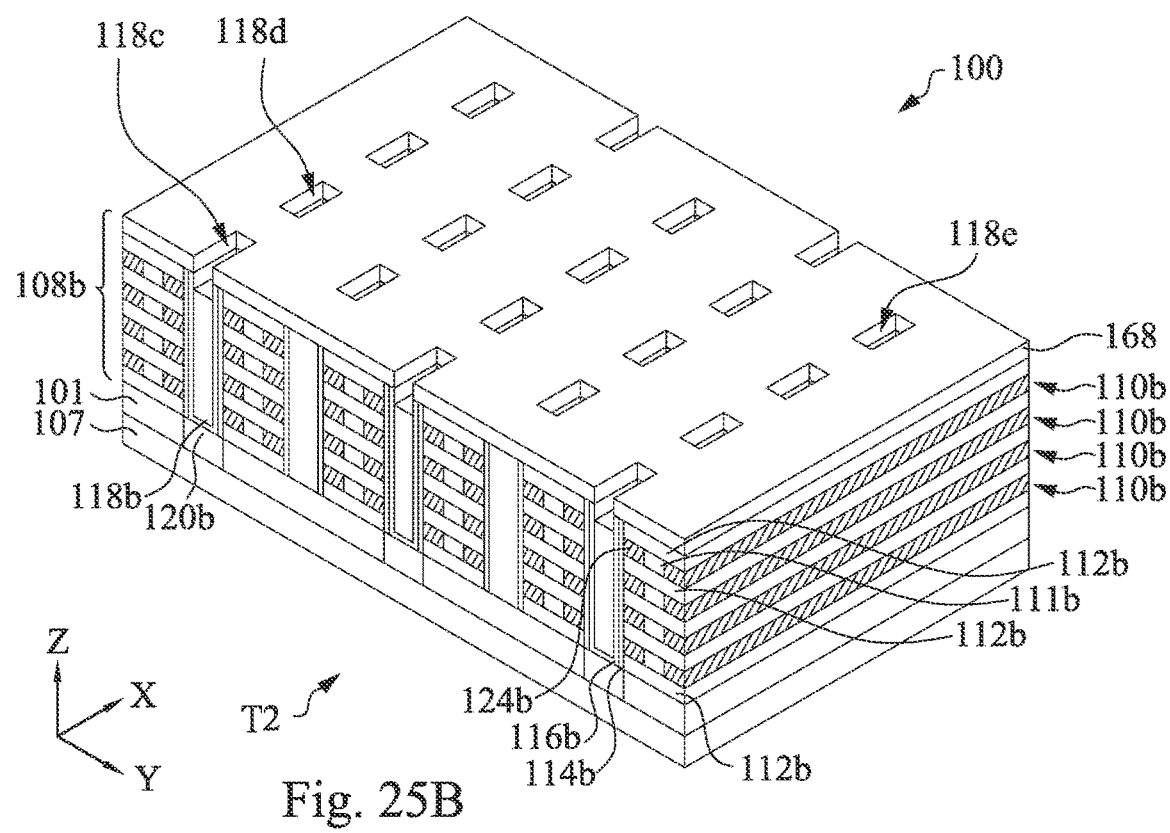

Referring back to FIG. 4C, the method M then proceeds to block S122 where a plurality of fourth conductive line trenches are formed through the second inner spacers within the storage memory region. With reference to FIGS. 25A and 25B, in some embodiments of block S122, a plurality of conductive line trenches 118e are formed through the second inner spacers 118b within the storage three-dimensional memory region T2 from the top surface of the stacked structure 108b to the etch stop layer 101 for forming a conductive line 122b (see FIGS. 26B and 26D) that will be formed in subsequent steps in the semiconductor die 100 while remains the computing three-dimensional memory region T1 not to be etched.

A patterned hard mask layer 168 may be formed over the computing three-dimensional memory region T1 as shown in FIG. 25A and over the storage three-dimensional memory region T2 as shown in FIG. 25B. In some embodiments, the patterned hard mask layer 168 may be formed by patterning a hard mask material using a combination of photolithography and etching. For example, a hard mask material may be deposited over the computing three-dimensional memory region T1 and the storage three-dimensional memory region T2. The hard mask material can be formed by using, such as a spin-on technique. Subsequently, the hard mask material may be patterned to form the patterned mask layer 168 to define the conductive line trenches 118e (see FIG. 25A) on the second inner spacers 118b in the storage three-dimensional memory region T2. As shown in FIGS. 25A and 25B, the patterned hard mask layer 168 in the storage three-dimensional memory region T2 has a strip pattern, but the patterned hard mask layer 168 in the computing three-dimensional memory region T1 is free of the strip pattern. In other words, the first inner spacers 118a in the computing three-dimensional memory region T1 is entirely covered by a first side of the patterned hard mask layer 168 without having any strip pattern thereon, and the second inner spacers 118b in the storage three-dimensional memory region T2 is partially exposed through a second side of the patterned hard mask layer 168 with the strip pattern thereon.

Subsequently, the second inner spacers 118b in the storage three-dimensional memory region T2 is etched through the second side of the patterned hard mask layer 168 with the strip pattern thereon to form the conductive line trenches 118e (see FIG. 25B), but remains the first inner spacers 118a in the computing three-dimensional memory region T1 covered by the first side of the patterned hard mask layer 168 without the strip pattern thereon and not to be etched (see FIG. 25A). A pattern of the conductive line trenches 118e may correspond to the strip pattern on the patterned hard mask layer 168. The conductive line trenches 118e extend from the top surface of the stacked structure 108b and terminate prior to reaching the etch stop layer 101 in the vertical direction. In some embodiments, the conductive line trenches 118e terminate at a position higher than a bottom surface of a topmost one of the insulating layers 112b in the stacked structure 108b. In some embodiments, the second inner spacers 118e may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the conductive line trenches 118e. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In some embodiments, after the conductive line trenches 118e are formed, the patterned hard mask layer 168 is subsequently stripped, such as by wet stripping or plasma ashing.

Referring back to FIG. 4C, the method M then proceeds to block S123 where the fourth conductive line trenches are filled with a second reduced parasitic RC material and a second conductive material to form a plurality of fourth conductive lines of storage memory devices that will be electrically coupled to respective bit lines subsequently formed. With reference to FIGS. 26A-26D, in some embodiments of block S123, a second reduced parasitic RC material is comfortably formed over the computing three-dimensional memory region T1 and the storage three-dimensional memory region T2 and in the conductive line trenches 118e. In some embodiments, the second reduced parasitic RC material may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the second reduced parasitic RC material may include a semiconductor material, for example, an n or p-doped semiconductor such as Si, SiGe, or any other semiconductor material (e.g., IGZO, ITO, IZO, ZnO, IWO, poly silicon, amorphous Si, etc.). In some embodiments, the second reduced parasitic RC material may be formed by using, for example, CVD, ALD, PVD, PECVD, or the like.

Subsequently, a second conductive material is deposited over the second reduced parasitic RC material within the computing three-dimensional memory region T1 and the storage three-dimensional memory region T2. In some embodiments, the second conductive material may include a conductive material, for example, metals such as Al, Ti, TiN, TaN, Co, Ag, Au, Cu, Ni, Cr, Hf, Ru, W, Pt, WN, any other suitable material or a combination or alloy thereof. In some embodiments, the second conductive material may include a semiconductor material, for example, an n or p-doped semiconductor such as Si, SiGe, or any other semiconductor material (e.g., IGZO, ITO, IZO, ZnO, IWO, poly silicon, amorphous Si, etc.), and may be formed using a deposition process, an epitaxial growth process, or any other suitable process. In some embodiments, the second conductive material may be formed by using, for example, CVD, ALD, PVD, PECVD, or the like.

Figure 26A:
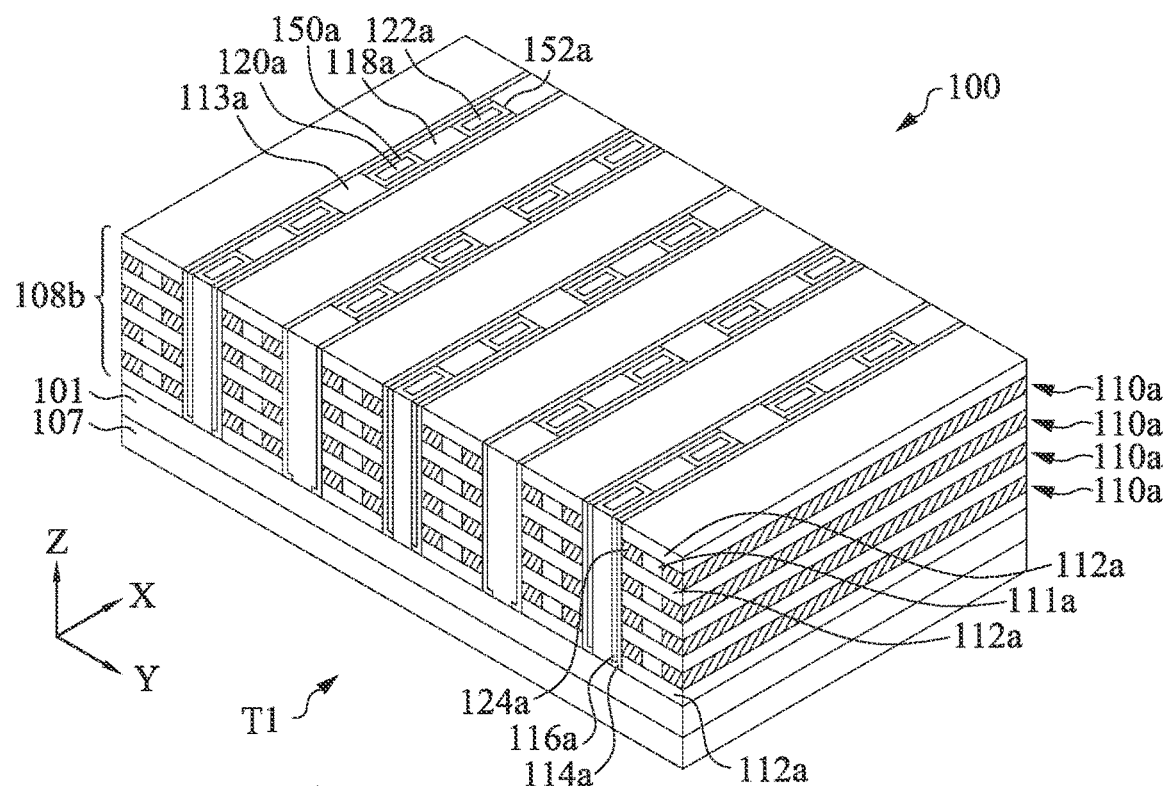
Figure 26B:
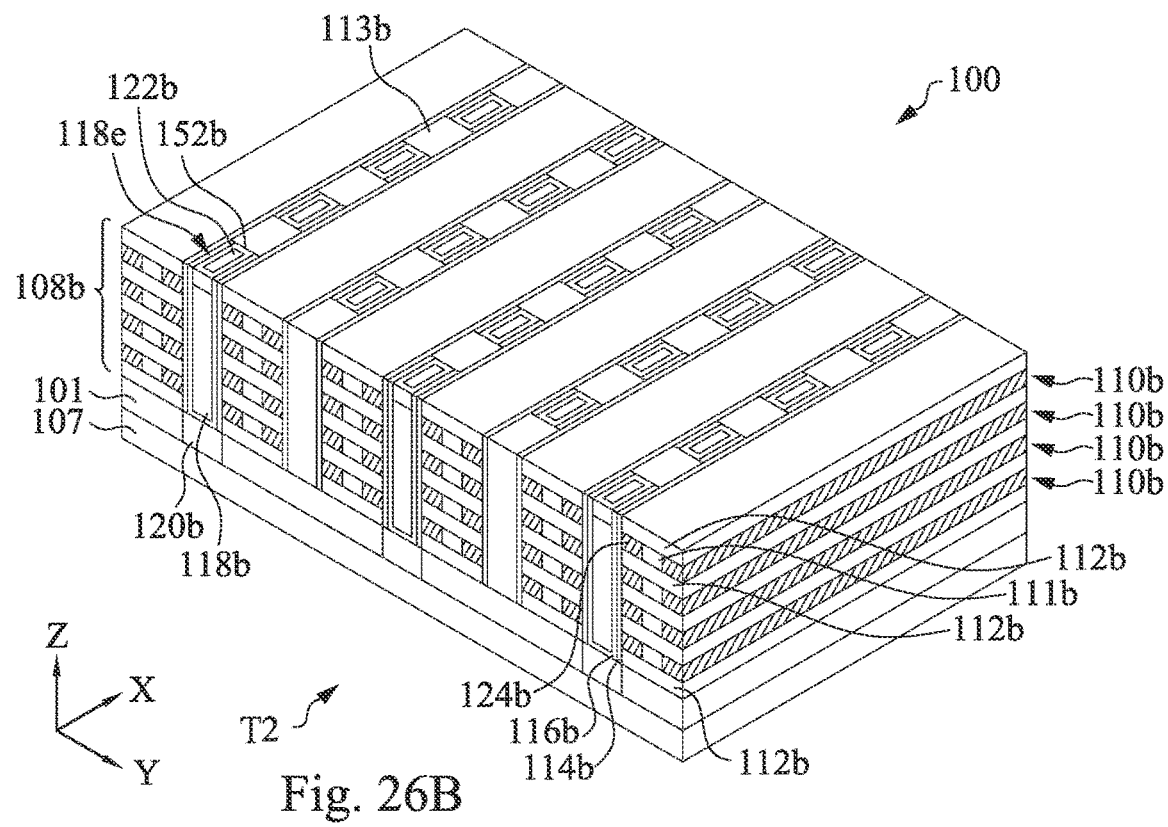
Figure 26C:
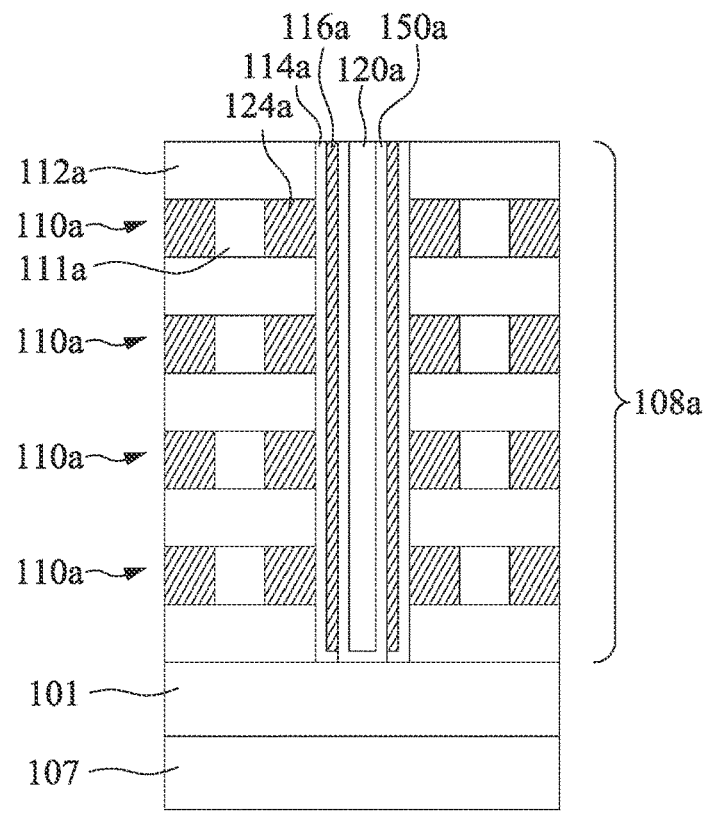
Figure 26D:
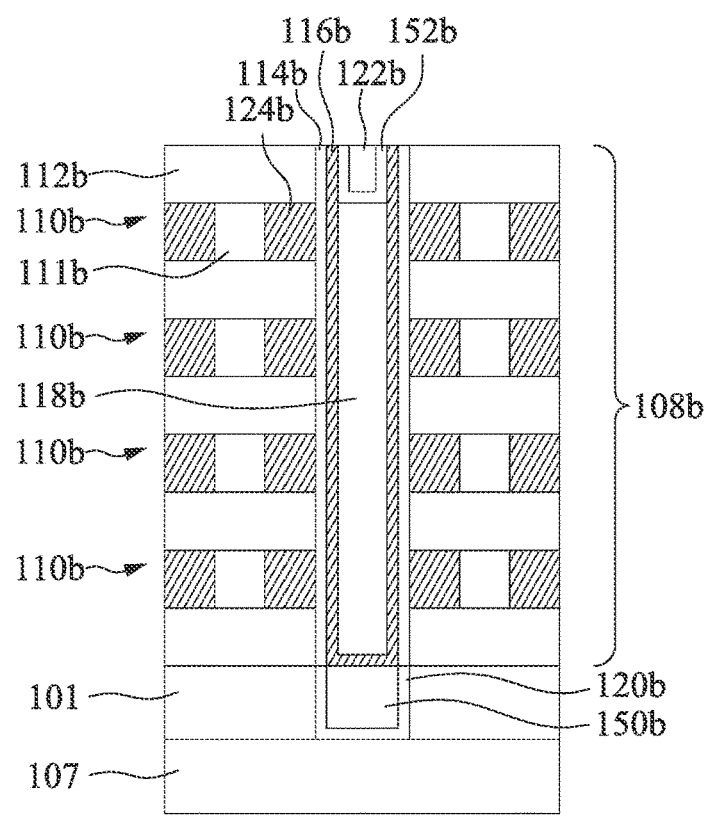

Subsequently, a planarized process (e.g., a CMP, etch back, or the like) is performed to remove excess portions of the second reduced parasitic RC material and the second conductive material over the stacked structures 108a and 108b until the stacked structures 108a and 108b are exposed. The remaining second reduced parasitic RC material and the second conductive material fill the conductive line trenches 118e in the second inner spacers 118b and form the conductive lines 122b and the reduced parasitic RC layers 152b cupping undersides of the conductive lines 122b as shown in FIG. 26B that that can be electrically coupled to respective global bit lines subsequently formed. In some embodiments, the conductive lines 122b can be interchangeably referred to as conductive bit lines.

Figure 27A:
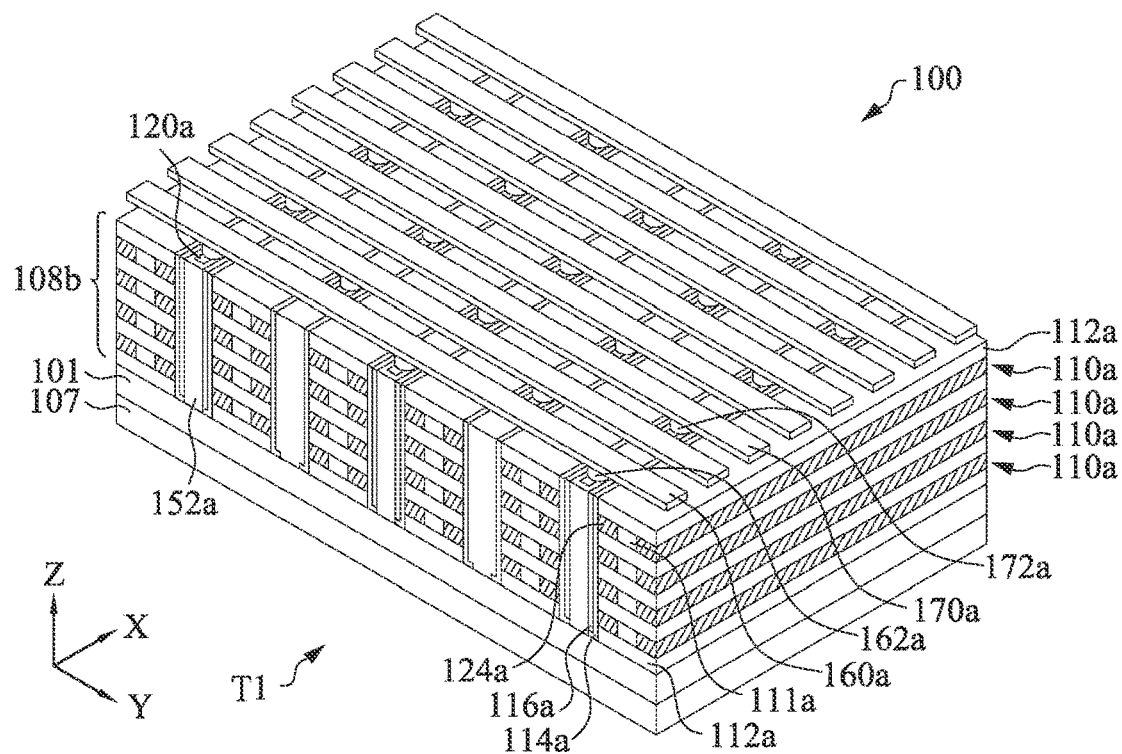
Figure 27B:
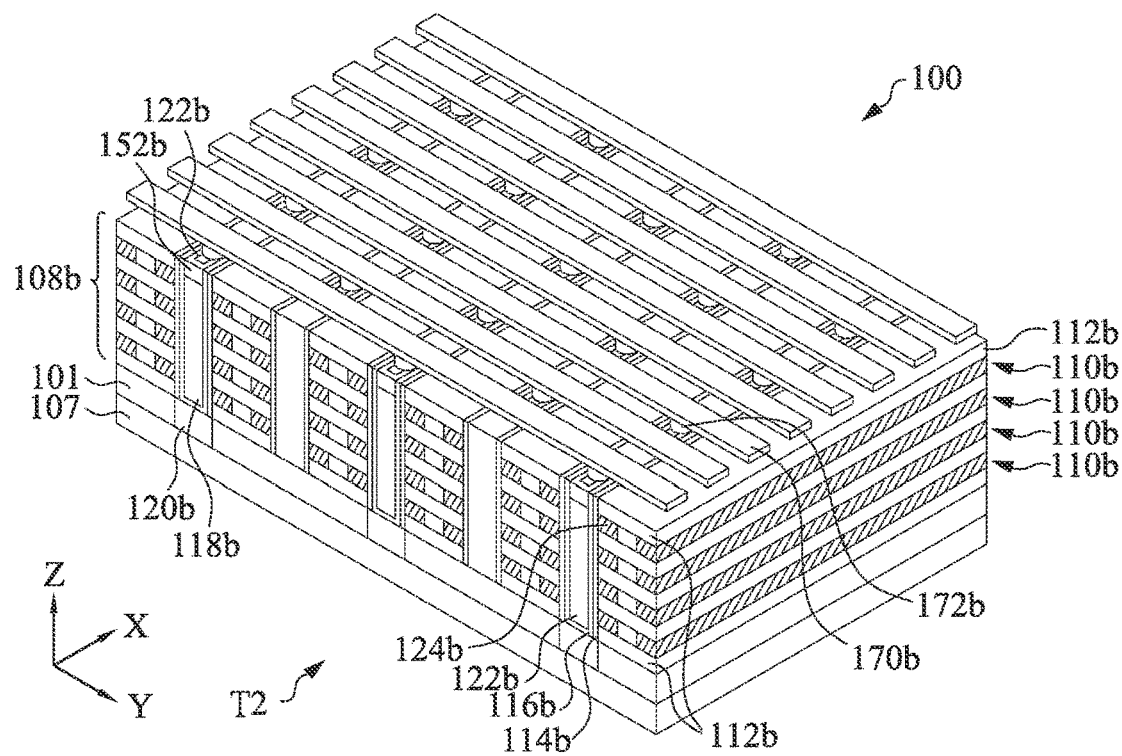

Referring back to FIG. 4C, the method M then proceeds to block S124 where a plurality of first global source lines and first global bit lines are formed on the first stacked structure within the computing memory region and electrically coupled to the corresponding second and third conductive lines and a plurality of second global bit lines are formed on the second stacked structure within the storage memory region and electrically coupled to the corresponding fourth conductive lines. With reference to FIGS. 27A and 27B, in some embodiments of block S124, first global source lines 160a and first global drain lines 170a are formed on the stacked structure 108a within the computing three-dimensional memory region T1 (see FIG. 27A) and electrically coupled to the corresponding conductive lines 120a and 122a (see FIG. 26A) through first source vias 162a and first drain vias 172a, and second global drain lines 170b are formed on the stacked structure 108b within the storage three-dimensional memory region T2 (see FIG. 27B) and electrically coupled to the corresponding conductive line 122b (see FIG. 26B) through second drain vias 172b. The global drain lines 170a may be formed simultaneously with the global source lines 160a. Each of the global source lines 160a and the global drain lines 170a extend in the Y-direction.

The global source lines 160a and the global drain lines 170a/b may be formed from a conductive material, for example, tungsten (W), copper (Cu), cobalt (Co), etc. In some embodiments, the source vias 162a/b and the drain vias 172b may be formed from a conductive material for example, tungsten (W), copper (Cu), cobalt (Co), etc. In some embodiments, the source vias 162a/b and the drain vias 172b may be formed using a dual damascene process. The global source lines 160a and the global drain lines 170a/b may be used to communicate an electrical signal (e.g., a current or voltage) to corresponding conductive lines 120a/b, and the global drain lines 170a/b may be used to receive an electrical signal (e.g., a current or voltage) from a corresponding conductive lines 122a/b, when the gate layer 124a/b is activated.

Figure 28A:
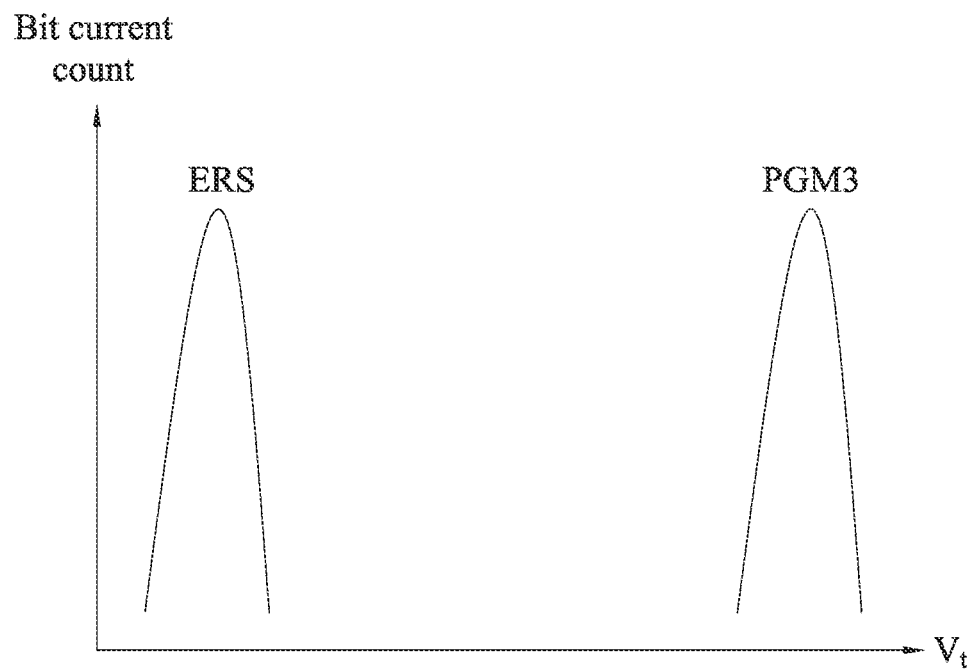
FIG. 28A a schematic diagram illustrating a relationship between voltage and bit current count of computing three-dimensional memory devices in accordance with some embodiments of the present disclosure.
Figure 28B:
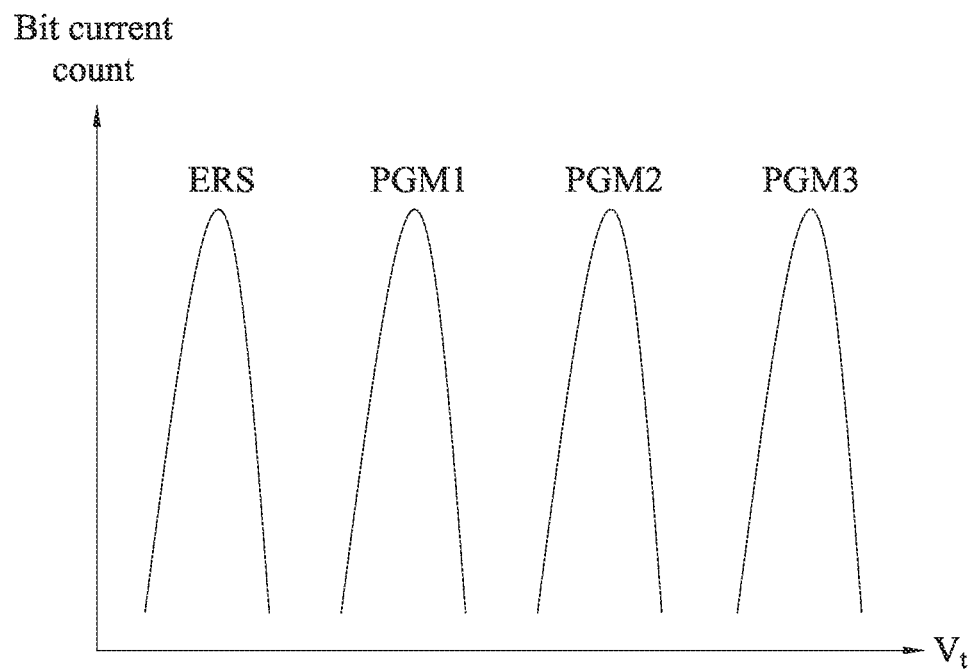
FIG. 28B a schematic diagram illustrating a relationship between voltage and bit current count of storage three-dimensional memory devices in accordance with some embodiments of the present disclosure.

Reference is made to FIGS. 28A and 28B. FIG. 28A a schematic diagram illustrating a relationship between voltage and bit current count of computing three-dimensional memory devices (e.g., AND memory devices) in accordance with some embodiments of the present disclosure. FIG. 28B a schematic diagram illustrating a relationship between voltage and bit current count of storage three-dimensional memory devices (e.g., NAND memory devices) in accordance with some embodiments of the present disclosure.

As shown in FIG. 28A, the computing three-dimensional memory device has two memory statuses to form 1 bit based on a program voltage PGM3 relative to an erased voltage. As shown in FIG. 28B, the storage three-dimensional memory device has four memory statuses to form 2 bit based on three different program voltages $V_{PGM1}$, $V_{PGM2}$, and $V_{PGM3}$ relative to the erased voltage $V_{ERS}$. Because the computing and storage three-dimensional memory devices are formed monolithically in the same wafer, which in turn allows for simultaneously operating the computing and storage three-dimensional memory devices in the same program voltage $V_{PGM3}$ and the same erased voltage $V_{ERS}$. This beneficially reduces computing power needed to perform the same operation. By way of example and not limitation, the first and second semiconductor devices 110a and 110b as shown in FIGS. 2A-3B can be simultaneously operated in the same program voltage $V_{PGM3}$ and the same erased voltage $V_{ERS}$. It should be appreciated that while the first and second semiconductor devices 110a and 110b illustrate particular embodiments of operations in the same program voltage $V_{PGM3}$ and the same erased voltage $V_{ERS}$, in other embodiments the first and second semiconductor devices 110a and 110b arranged in the same semiconductor die in any suitable configuration or arrangement can also be simultaneously operated in the same program voltage $V_{PGM3}$ and the same erased voltage $V_{ERS}$. All such arrangements are contemplated and should be considered to be within the scope of the present disclosure.

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a semiconductor die including a plurality of computing 3D memory devices (e.g., AND memory devices) that provide high speed computing and a plurality of storage 3D memory devices (e.g., NAND memory devices) that provide high density storage for a multi-level cell. The computing and storage 3D memory devices are used to a computing in memory (CIM) application and formed monolithically in the same wafer, which in turn allows for improving a propagation delay issue while date is transferred between the computing and storage 3D memory devices and achieving a within-wafer multiple memory integration. This beneficially reduces computing power needed to perform the same operation, reduces propagation losses, and reduces manufacturing cost, time, and complexity.

In some embodiments, the method includes forming a multi-layered stack having a plurality of insulating layers and a plurality of spacer layers alternately stacked on top of each other in a vertical direction over a substrate in a chip area having a first memory region and a second memory region; forming a first mask layer covering the second memory region, while leaving the first memory region partially exposed; with the first mask layer in place, etching the multi-layered stack to form a plurality of first trenches defining a plurality of first memory stacked structures in the first memory region; forming a plurality of first gate layers, a first memory layer, and a first channel layer in the plurality of first trenches; removing the first mask layer; forming a second mask layer covering the first memory region, while leaving the second memory region partially exposed; with the second mask layer in place, etching the multi-layered stack to form a plurality of second trenches defining a plurality of second memory stacked structures in the second memory region; forming a plurality of second gate layers, a second memory layer, and a second channel layer in the plurality of second trenches. In some embodiments, the first memory stacked structures are of an AND memory, and the second memory stacked structures are of a NAND memory. In some embodiments, the method further includes laterally recessing the plurality of spacer layers within the first trenches to form a plurality of first cavities in the first memory stacked structures. In some embodiments, the first gate layers are formed in the plurality of first cavities of the first memory stacked structures. In some embodiments, the first memory layer is deposited over the plurality of first gate layers, and the first channel layer is deposited over the first memory layer. In some embodiments, the method further includes forming a plurality of conductive source lines and a plurality of conductive bit lines extending through the plurality of first memory stacked structures in the first memory region. In some embodiments, the method further includes forming a plurality of conductive bit lines extending downwardly from top surfaces of the plurality of second memory stacked structures and terminating prior to reaching bottom surfaces of the plurality of second memory stacked structures in the second memory region. In some embodiments, the method further includes forming a plurality of reduced parasitic resistance capacitance layers cupping undersides of the plurality of conductive bit lines. In some embodiments, the method further includes after forming the plurality of second gate layers, the second memory layer, and the second channel layer, removing the second mask layer; and after removing the second mask layer, laterally recessing the plurality of spacer layers within the second trenches to form a plurality of second cavities in the second memory stacked structures. In some embodiments, the plurality of second gate layers are formed in the plurality of second cavities of the second memory stacked structures. In some embodiments, the second memory layer is deposited over the plurality of second gate layers, and the second channel layer is deposited over the second memory layer.

In some embodiments, the method includes forming a first set of a plurality of first semiconductor devices over a substrate at a first location of a semiconductor die, the first set of the plurality of first semiconductor devices being of an AND memory; forming a second set of a plurality of second semiconductor devices over the substrate at a second location of the semiconductor die different from the first location, the second set of the plurality of second semiconductor devices being of a NAND memory. In some embodiments, the method includes forming a third set of a plurality of third semiconductor devices over the substrate and being of the AND memory, the third set of the plurality of third semiconductor devices located between the first set of the plurality of the first semiconductor devices and the second set of the plurality of the second semiconductor devices. In some embodiments, the method includes forming a third set of a plurality of third semiconductor devices over the substrate and being of the AND memory, the second set of the plurality of second semiconductor devices located between the first set of the plurality of the first semiconductor devices and the third set of the plurality of the third semiconductor devices. In some embodiments, the method includes forming a third set of a plurality of third semiconductor devices over the substrate and being of the NAND memory, the third set of the plurality of third semiconductor devices located between the first set of the plurality of the first semiconductor devices and the second set of the plurality of the second semiconductor devices. In some embodiments, the method includes forming a third set of a plurality of third semiconductor devices over the substrate and being of the NAND memory, the first set of the plurality of first semiconductor devices located between the second set of the plurality of the second semiconductor devices and the third set of the plurality of the third semiconductor devices.

In some embodiments, the semiconductor die includes a substrate, a first memory array, and a second memory array. The first memory array is over the substrate and includes a plurality of first semiconductor devices, a first source line, and a first bit line. The first semiconductor devices are stacked in a vertical direction. The first source line electrically connects to the first semiconductor devices and extends downwardly from a topmost one of the first semiconductor devices to a lowermost one of the first semiconductor devices. The first bit line electrically connects to the first semiconductor devices and extending downwardly from the topmost one of the first semiconductor devices to the lowermost one of the first semiconductor devices. The second memory array is over the substrate and includes a plurality of second semiconductor devices, a second source line, and a second bit line. The second semiconductor devices are stacked in the vertical direction. The second source line electrically connects to the second semiconductor devices and is disposed below the second semiconductor devices. The second bit line electrically connects to the second semiconductor devices and is disposed above the second source line. In some embodiments, the semiconductor die further includes a first channel layer shared by the plurality of first semiconductor devices, the first channel layer extending downwardly from a top end of the first source line to a bottom end of the first source line. In some embodiments, the semiconductor die further includes a second channel layer shared by the plurality of second semiconductor devices, the second channel layer having a different cross-sectional profile than the first channel layer. In some embodiments, the second channel layer is contact with a top surface of the second source line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a multi-layered stack having a plurality of insulating layers and a plurality of spacer layers alternately stacked on top of each other in a vertical direction over a substrate in a chip area having a first memory region and a second memory region;
    forming a first mask layer covering the second memory region, while leaving the first memory region partially exposed;
    with the first mask layer in place, etching the multi-layered stack to form a plurality of first trenches defining a plurality of first memory stacked structures in the first memory region;
    forming a plurality of first gate layers, a first memory layer, and a first channel layer in the plurality of first trenches;
    removing the first mask layer;
    forming a second mask layer covering the first memory region, while leaving the second memory region partially exposed;
    with the second mask layer in place, etching the multi-layered stack to form a plurality of second trenches defining a plurality of second memory stacked structures in the second memory region, wherein the first memory stacked structures are of an AND memory, and the second memory stacked structures are of a NAND memory; and
    forming a plurality of second gate layers, a second memory layer, and a second channel layer in the plurality of second trenches.

2. The method of claim 1, further comprising:
    laterally recessing the plurality of spacer layers within the first trenches to form a plurality of first cavities in the first memory stacked structures.

3. The method of claim 2, wherein the plurality of first gate layers are formed in the plurality of first cavities of the first memory stacked structures.

4. The method of claim 3, wherein the first memory layer is deposited over the plurality of first gate layers, and the first channel layer is deposited over the first memory layer.

5. The method of claim 4, further comprising:
forming a plurality of conductive source lines and a plurality of conductive bit lines extending through the plurality of first memory stacked structures in the first memory region.

6. The method of claim 4, further comprising:
forming a plurality of conductive bit lines extending downwardly from top surfaces of the plurality of second memory stacked structures and terminating prior to reaching bottom surfaces of the plurality of second memory stacked structures in the second memory region.

7. The method of claim 6, further comprising:
forming a plurality of reduced parasitic resistance capacitance layers cupping undersides of the plurality of conductive bit lines.

8. The method of claim 1, further comprising:
after forming the plurality of second gate layers, the second memory layer, and the second channel layer, removing the second mask layer; and
after removing the second mask layer, laterally recessing the plurality of spacer layers within the second trenches to form a plurality of second cavities in the plurality of second memory stacked structures.

9. The method of claim 8, wherein the plurality of second gate layers are formed in the plurality of second cavities of the plurality of second memory stacked structures.

10. The method of claim 9, wherein the second memory layer is deposited over the plurality of second gate layers, and the second channel layer is deposited over the second memory layer.

11. A method, comprising:
forming a conductive source line embedded in an etch stop layer over a substrate;
forming a first set of a plurality of first semiconductor devices over the etch stop layer at a first location of a semiconductor die, the first set of the plurality of first semiconductor devices being of an AND memory; and
forming a second set of a plurality of second semiconductor devices over the etch stop layer at a second location of the semiconductor die different from the first location, the second set of the plurality of second semiconductor devices being of a NAND memory, wherein the conductive source line is electrically connected to a channel layer of the second set of the second semiconductor devices.

12. The method of claim 11, further comprising:
forming a third set of a plurality of third semiconductor devices over the substrate and being of the AND memory, the third set of the plurality of third semiconductor devices located between the first set of the plurality of the first semiconductor devices and the second set of the plurality of the second semiconductor devices.

13. The method of claim 11, further comprising:
forming a third set of a plurality of third semiconductor devices over the substrate and being of the AND memory, the second set of the plurality of second semiconductor devices located between the first set of the plurality of the first semiconductor devices and the third set of the plurality of the third semiconductor devices.

14. The method of claim 11, further comprising:
forming a third set of a plurality of third semiconductor devices over the substrate and being of the NAND memory, the third set of the plurality of third semiconductor devices located between the first set of the plurality of the first semiconductor devices and the second set of the plurality of the second semiconductor devices.

15. The method of claim 11, further comprising:
forming a third set of a plurality of third semiconductor devices over the substrate and being of the NAND memory, the first set of the plurality of first semiconductor devices located between the second set of the plurality of the second semiconductor devices and the third set of the plurality of the third semiconductor devices.

16. The method of claim 11, wherein forming the first set of the first semiconductor devices comprises forming a plurality of first gate layers, a first memory layer over the first gate layers, and a first channel layer over the first memory layer,
forming the second set of the second semiconductor devices comprises forming a plurality of second gate layers, a second memory layer over the second gate layers, and the second channel layer over the second memory layer, and
forming the first gate layers, the first memory layer, and the first channel layer of the first semiconductor devices is performed over a different time duration than forming of the second gate layers, the second memory layer, and the second channel layer of the second semiconductor devices.

17. A method, comprising:
forming a first memory array over a substrate, the first memory array being of an AND memory and comprising:
a plurality of first semiconductor devices stacked in a vertical direction, the first semiconductor devices comprising:
a plurality of first gate layers,
a first memory layer shared by the first gate layers, and
a first channel layer over the first memory layer;
a first source line electrically connecting to the plurality of first semiconductor devices and extending downwardly from a topmost one of the first semiconductor devices to a lowermost one of the first semiconductor devices; and
a first bit line electrically connecting to the plurality of first semiconductor devices and extending downwardly from the topmost one of the first semiconductor devices to the lowermost one of the first semiconductor devices; and
forming a second memory array over the substrate, the second memory array being of a NAND memory and comprising:
a plurality of second semiconductor devices stacked in the vertical direction, the second semiconductor devices comprising a plurality of second gate layers, a second memory layer shared by the second gate layers, and a second channel layer over the second memory layer, wherein forming the first gate layers, the first memory layer, and the first channel layer of the first semiconductor devices is performed over a different time duration than forming of the second gate layers, the second memory layer, and the second channel layer of the second semiconductor devices;
a second source line electrically connecting to the plurality of second semiconductor devices and disposed below the plurality of second semiconductor devices; and a second bit line electrically connecting to the plurality of second semiconductor devices and disposed above the second source line.

18. The method of claim 17, wherein
the first channel layer extends downwardly from a top end of the first source line to a bottom end of the first source line.

19. The method of claim 17, wherein
the second channel layer has a different cross-sectional profile than the first channel layer.

20. The method of claim 17, wherein the second channel layer is in contact with a top surface of the second source line.

* * * * *